US008891636B2

(12) United States Patent
Yano et al.

(10) Patent No.: US 8,891,636 B2
(45) Date of Patent: Nov. 18, 2014

(54) APPARATUS AND METHOD FOR WIRELESS COMMUNICATION

(75) Inventors: Tetsuya Yano, Kasawaki (JP); Yoshihiro Kawasaki, Kasawaki (JP); Yoshinori Tanaka, Kasawaki (JP); Shunji Miyazaki, Kasawaki (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 13/427,423

(22) Filed: Mar. 22, 2012

(65) Prior Publication Data
US 2012/0177096 A1    Jul. 12, 2012

Related U.S. Application Data

(63) Continuation of application No. PCT/JP2009/067058, filed on Sep. 30, 2009.

(51) Int. Cl.
| H04L 27/00 | (2006.01) |
| H04L 1/00 | (2006.01) |
| H03M 13/00 | (2006.01) |
| H04L 5/00 | (2006.01) |
| H03M 13/09 | (2006.01) |
| H03M 13/03 | (2006.01) |
| H03M 13/29 | (2006.01) |

(52) U.S. Cl.
CPC ......... *H03M 13/6525* (2013.01); *H04L 5/0094* (2013.01); *H03M 13/09* (2013.01); *H04L 1/0071* (2013.01); *H04L 1/0057* (2013.01); H03M 13/03 (2013.01); H04L 5/001 (2013.01); H04L 5/0053 (2013.01); H03M 13/29 (2013.01)
USPC ........................................ 375/259

(58) Field of Classification Search
USPC ......... 375/316, 259, 130, 140, 141, 146, 147, 375/295; 714/699, 746, 758
See application file for complete search history.

(56) References Cited

U.S. PATENT DOCUMENTS

2003/0099357 A1*  5/2003  Ryu et al. ...................... 380/252
2011/0110315 A1*  5/2011  Chen et al. .................... 370/329

FOREIGN PATENT DOCUMENTS

| EP | 2 015 594 | 1/2009 |
| JP | 2007-300505 | 11/2007 |

OTHER PUBLICATIONS

International Search Report issued for corresponding International Patent Application No. PCT/JP2009/067058, mailed Dec. 8, 2009.

(Continued)

*Primary Examiner* — Vineeta Panwalkar
(74) *Attorney, Agent, or Firm* — Myers Wolin, LLC

(57) ABSTRACT

In a wireless communication method, a first wireless communication apparatus transmits through a first wireless resource to a second wireless communication apparatus a first signal generated from a second signal for use in processing performed by the second wireless communication apparatus and a third signal for use in error checking of the second signal. The second wireless communication apparatus detects a second wireless resource to be used in the processing on the basis of the first signal, and performs the processing by using the second signal and the detected second wireless resource. For the detection, a section of the first signal corresponding to the second wireless resource is scrambled, or the first signal is scrambled with a scrambling sequence corresponding to the second wireless resource, or the bit order in at least part of the first signal is changed in a manner corresponding to the second wireless resource.

17 Claims, 37 Drawing Sheets

(56) References Cited

OTHER PUBLICATIONS

Panasonic; "Component carrier indication scheme for carrier aggregation"; 3GPP TSG-RAN WG1, Meeting #58, Shenzhen, China; R1-093465; Agenda Item 15.4; Aug. 24-28, 2009; [Ref.: ISR dated Dec. 8, 2009].

Ericsson; "Control signaling for carrier aggregation"; TSG-RAN WG1 #55bis, Ljubljana, Slovenia; Agenda Item 12.2; R1-090375; dated Jan. 12-18, 2009.

MCC Support; "Final Report of 3GPP TSG RAN WG1 #57 v1.0.0"; San Francisco, USA; May 4-8, 2009; Document for Approval; Agenda Item 3; 3GPP TSG RAN WG1 Meeting #57bis, Los Angeles, USA, Jun. 29-Jul. 3, 2009.

* cited by examiner

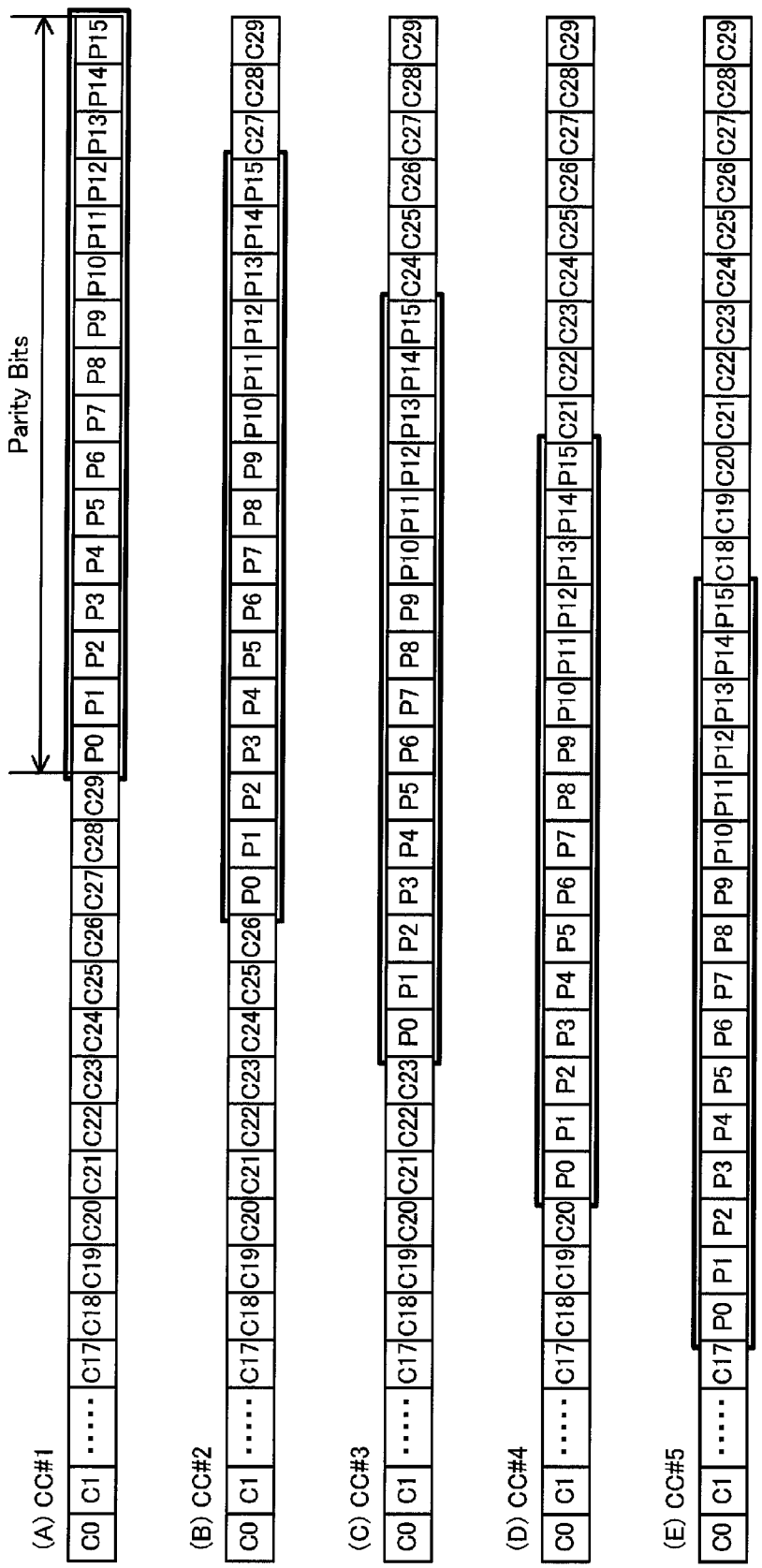

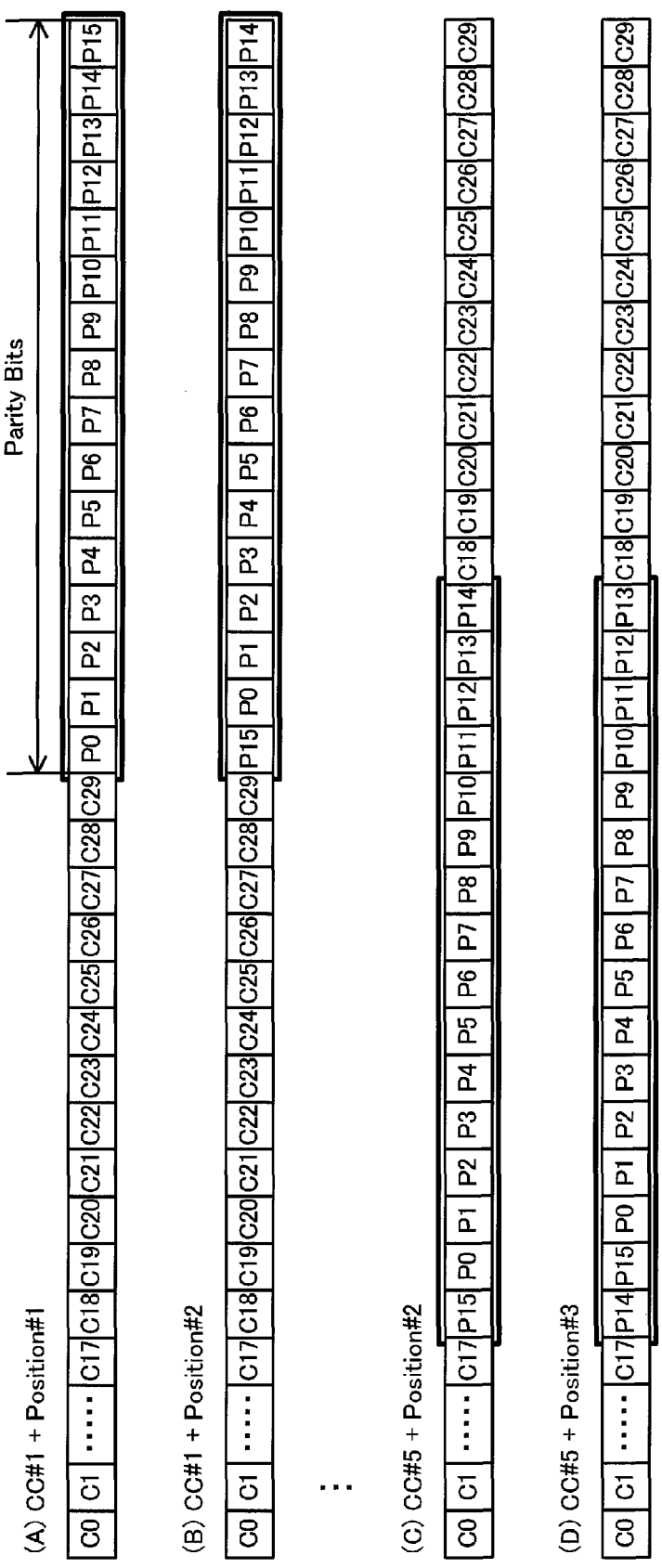

APPARATUS AND METHOD FOR WIRELESS COMMUNICATION

CROSS-REFERENCE TO RELATED APPLICATION

This is a continuation of International Application PCT/JP2009/067058, filed on Sep. 30, 2009, now pending, the contents of which are herein wholly incorporated by reference.

FIELD

The embodiments discussed herein relate to wireless communication apparatuses and wireless communication methods.

BACKGROUND

Currently, the wireless communication systems such as the mobile telephone systems or the wireless LANs (Local Area Networks) are widely used. In order to further improve the transmission rate and the transmission quality in the wireless communication technologies, next-generation technologies are being actively discussed. Some wireless communication technologies enable communication between two wireless communication devices (e.g., between a wireless base station and a mobile station) by use of multiple carriers. In some cases, the use of multiple carriers is called carrier aggregation, and each carrier in the carrier aggregation is called a component carrier.

In wireless communication, control signals are transmitted from a first wireless communication device to a second wireless communication device. The information transmitted by the control signals may include information which is to be referred to by the second wireless communication device for receiving data transmitted from the first wireless communication device (e.g., information indicating the format used in the data transmission), or information designating a transmission procedure to be used by the second wireless communication device in transmission of data (e.g., information designating a format to be used in the data transmission). For example, information transmitted from a wireless base station to a mobile station may include information to be referred to by the mobile station when the mobile station receives data through a downlink data channel, or information to be referred to by the mobile station when the mobile station transmits data through an uplink data channel.

In the case where wireless communication is performed between two wireless communication devices by use of multiple carriers, a wireless resource used in transmission of a control signal may belong to a carrier different from the carrier to which a wireless resource used in data transmission controlled by the control signal belongs. In this case, the problem is the method for recognition of the carrier to which the control signal is applied.

According to a technique which has been proposed as a recognition method, the carrier to which the control signal is applied is clearly indicated by attaching a bit for carrier recognition (carrier indicator) to the control signal. (See, for example, "Final Report of 3GPP TSG-RAN WG1 #57 v1.0.0", 3GPP (3rd Generation Partnership Project) TSG RAN WG1 #57bis, R1-092292, July 2009, Section 15.4.)

Another recognition method which has been proposed is applied to a wireless base station scrambling a CRC (Cyclic Redundancy Check) bits attached to a control signal, with a scrambling sequence corresponding to an ID (Identifier) assigned to a mobile station as an opposite party. (See, for example, "Control signaling for carrier aggregation", 3GPP TSG RAN WG1 #55bis, R1-090375, January 2009.) According to the above recognition method, IDs in the number of carriers are assigned to each mobile station, and the CRC bits are scrambled with a scrambling sequence corresponding to one of the IDs. Therefore, it is possible to concurrently recognize both of the mobile station and the carrier to which the control signal is applied.

However, according to the technique disclosed in 3GPP TSG RAN WG1 #57bis, R1-092292, the wireless resources are excessively spent for attaching the carrier indicator to the control signal, so that the transmission efficiency of the control signal is lowered. In addition, according to the technique disclosed in 3GPP TSG RAN WG1 #55bis, R1-090375, the IDs in the number of carriers are assigned to the opposite party. Therefore, the ID exhaustion becomes a problem. In the case where the length of the bit sequence of the ID is fixed, the number of opposite parties with which communication can be performed in parallel is limited. For example, in the case where five carriers are available in total, the upper limit of the number of opposite parties with which communication can be performed in parallel can become one fifth of the number of opposite parties with which communication can be performed in parallel when only one carrier is used in communication with each opposite party.

Further, in some cases, information indicating a border between the control signal and a data channel is transmitted as a separate control signal. In such cases, when the separate control signal is not correctly received, the border between the control signal and the data channel cannot be correctly detected, so that data cannot be correctly received through the data channel.

SUMMARY

In view of the above, there is provided a wireless communication apparatus which transmits through a first wireless resource a signal for use in processing to be performed by another wireless communication apparatus by use of one of a plurality of second wireless resources. The wireless communication apparatus includes: a signal generation unit which generates a first signal for use in the processing to be performed by the other wireless communication apparatus, a second signal for use in error checking of the first signal, and a third signal formed from a bit sequence containing the first signal and the second signal by scrambling a section in the bit sequence; and a transmission unit which transmits the third signal through the first wireless resource. The signal generation unit selects one of a plurality of different sections in the bit sequence corresponding to the one of the plurality of second wireless resources used in the processing to be performed by the other wireless communication apparatus, and scrambles the selected one of the plurality of different sections in the bit sequence for generating the third signal, where the plurality of different sections in the bit sequence respectively correspond to the plurality of second wireless resources.

The objects and advantages of the invention will be realized and attained by means of the elements and combinations particularly pointed out in the claims.

It is to be understood that both the forgoing general description and the following detailed description are exemplary and explanatory and are not restrictive of the invention, as claimed.

BRIEF DESCRIPTION OF DRAWINGS

FIG. 36 illustrates an example of a set of insertion positions of parity bits in control signals in the eighth embodiment; and FIG. 37 illustrates a set of insertion positions of cyclically shifted parity bits in control signals in a variation of the eighth embodiment.

DESCRIPTION OF EMBODIMENTS

The embodiments will be explained below with reference to the accompanying drawings, wherein like reference numbers refer to like elements throughout.

1. First Embodiment

Figure 1:
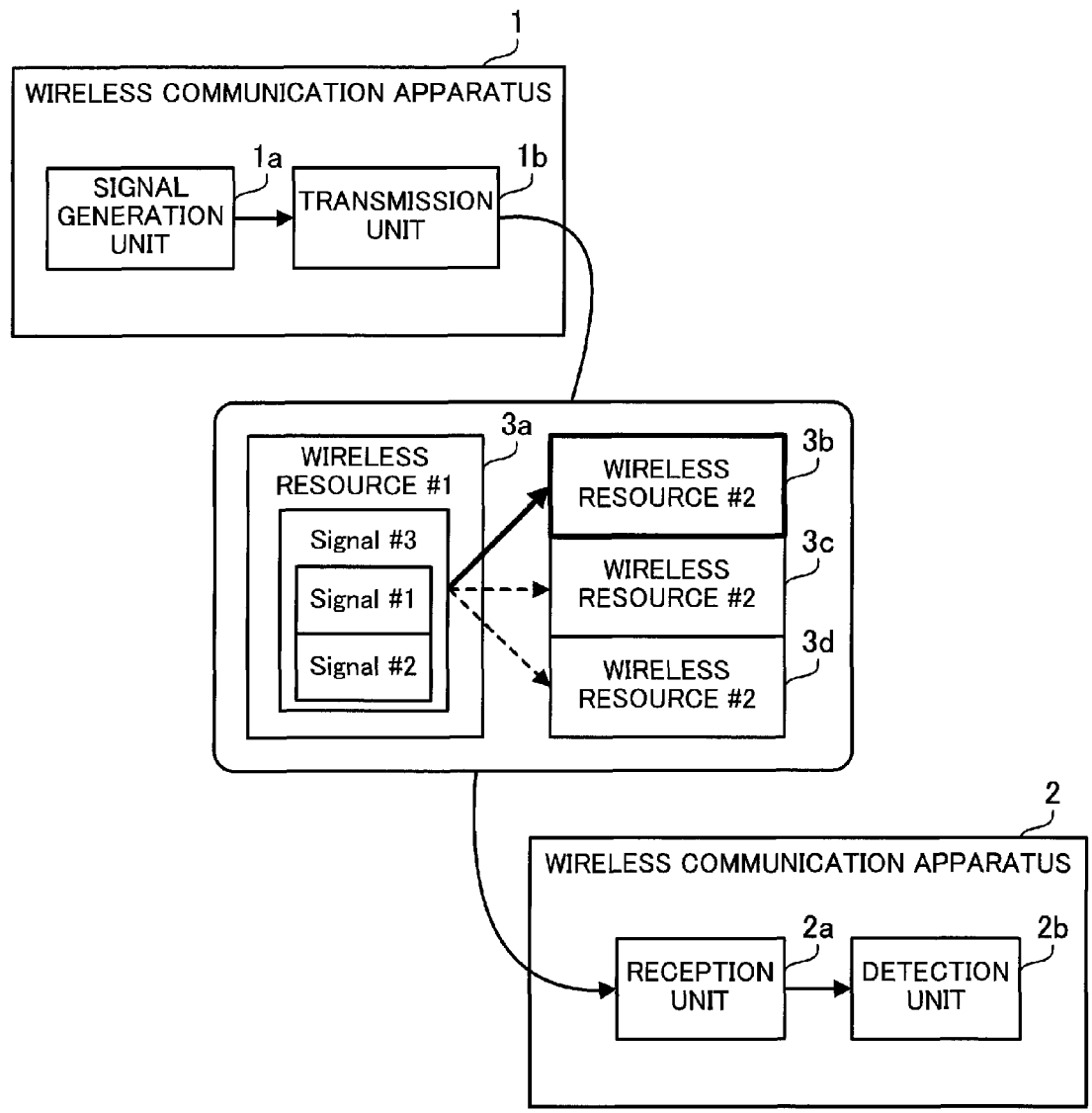
FIG. 1 illustrates a wireless communication system according to a first embodiment.

FIG. 1 illustrates a wireless communication system according to the first embodiment. The wireless communication system of FIG. 1 includes wireless communication apparatuses 1 and 2. The wireless communication apparatuses 1 and 2 perform wireless communication by using a wireless resource $3a$ (corresponding to the first wireless resource mentioned before) and wireless resources $3b$, $3c$, and $3d$ (corresponding to the plurality of second wireless resources mentioned before). In the case where the wireless communication system of FIG. 1 is realized as a mobile communication system, for example, the wireless communication apparatus 1 may be a wireless base station, and the wireless communication apparatus 2 may be mobile stations. The wireless resources $3b$, $3c$, and $3d$ may be wireless resources in different carriers, or wireless resources in the same carrier at different timings.

The wireless communication apparatus 1 includes a signal generation unit $1a$ and a transmission unit $1b$. The signal generation unit $1a$ generates a signal #1 (corresponding to the aforementioned first signal) for use in processing to be performed by the wireless communication apparatus 2, and a signal #2 (corresponding to the aforementioned second signal) for use in error checking of in the signal #1. For example, the signal #2 is a CRC signal. Then, the signal generation unit $1a$ generates a signal #3 (corresponding to the aforementioned third signal) on the basis of the signals #1 and #2. The transmission unit $1b$ transmits through the wireless resource $3a$ the signal #3 generated by the signal generation unit $1a$.

The signal #3 is generated by performing an operation for conversion on a bit sequence containing the signals #1 and #2. The signal generation unit $1a$ selects a manner of conversion corresponding to a wireless resource to which the signal #1 is applied, from among a plurality of different manners of conversion respectively corresponding to the wireless resources $3b$, $3c$, and $3d$. (Hereinafter, the plurality of different manners of conversion which can be performed by the signal generation unit $1a$ may be referred to as the plurality of first manners of conversion.) For example, the manners of conversion may belong to one of the following types (1) to (3).

(1) A type of conversion in which a section of a bit sequence containing the signals #1 and #2 is scrambled, and the section to be scrambled can be varied.

(2) A type of conversion in which the scrambling sequence can be changed, and at least a part of the signal #1 is scrambled (3) A type of conversion in which the order of bits in at least a section of a bit sequence containing the signals #1 and #2 is changed In the case where the conversion of the type (1) is used, the signal generation unit 1a determines, in advance, the correspondences between the wireless resources 3b, 3c, and 3d and a plurality of different sections to be scrambled in the bit sequence containing the signals #1 and signal #2. The different sections to be scrambled in the bit sequence containing the signals #1 and signal #2 may partially overlap as long as the sections do not include two or more completely identical sections. Then, the signal generation unit 1a selects a section corresponding to the wireless resource to which the signal #1 is applied, from among the plurality of different sections to be scrambled, and scrambles the bits in the selected section. For example, a bitwise exclusive OR of the bit sequence in the selected section and a scrambling sequence is calculated. The scrambling sequence used in the scrambling may be a predetermined fixed bit sequence or a variable bit sequence which is determined according to a communication condition or the like.

In the case where the conversion of the type (2) is used, the signal generation unit 1a determines, in advance, the correspondences between the wireless resources 3b, 3c, and 3d and a plurality of different scrambling sequences. Then, the signal generation unit 1a selects a scrambling sequence corresponding to the wireless resource to which the signal #1 is applied, from among the plurality of different scrambling sequences, and performs scrambling by using the selected scrambling sequence. The scrambled section may be a section corresponding to the entire or part of the signal #1. In the case where the scrambled section is a part of the signal #1, the section may be a predetermined fixed section or a variable section which is determined according to the communication condition or the like. The plurality of scrambling sequences may be bit sequences which are obtained by cyclic shifts of a predetermined scrambling sequence by respectively different numbers of bits.

In the case where the conversion of the type (3) is used, the signal generation unit 1a determines, in advance, the correspondences between the wireless resources 3b, 3c, and 3d and a plurality of first manners of bit-order change. The first manners of bit-order change are different from each other. Then, the signal generation unit 1a changes the order of bits in the bit sequence containing the signals #1 and #2 in a manner of bit-order change corresponding to the wireless resource to which the signal #1 is applied, from among the plurality of first manners of bit-order change. For example, in each of the manner of bit-order change corresponding to the wireless resource to which the signal #1 is applied, the bits in a section corresponding to the entire or part of the signal #1 or the signal #2 are cyclically shifted by the number of bits corresponding to the wireless resource to which the signal #1 is applied. Alternatively, in the manner of bit-order change corresponding to the wireless resource to which the signal #1 is applied, the signal #2 may be inserted into a position, corresponding to the wireless resource to which the signal #1 is applied, in the bit sequence containing signal #1.

The wireless communication apparatus 2 includes a reception unit 2a and a detection unit 2b. The reception unit 2a receives the signal #3 from the wireless communication apparatus 1 through the wireless resource 3a. The detection unit 2b makes an attempt to convert the received signal #3 by using each of a plurality of second manners of conversion, which are different from each other and are respectively correspond to the wireless resources 3b, 3c, and 3d. The operations in the plurality of second manners of conversion performed by the wireless communication apparatus 2 are respectively the inversions of the operations in the aforementioned plurality of first manners of conversion performed in the wireless communication apparatus 1. Then, the detection unit 2b performs processing for error checking of the signal #3 after the above attempt is made in each of the plurality of second manners of conversion, and determines one of the plurality of second manners of conversion which gives a result of the error checking satisfying a predetermined criterion. The wireless resource corresponding to the determined manner of conversion is detected as the wireless resource to which the signal #1 is applied.

As mentioned above, the plurality of second manners of conversion adopted by the detection unit 2b in the above operations respectively correspond to the plurality of first manners of conversion adopted by the wireless communication apparatus 1. Specifically, in the case where the conversion of the type (1) is used, the detection unit 2b makes one or more attempts to descramble the signal #3 in one or more of the plurality of different sections in the signal #3, and performs error checking of the result of each of the one or more attempts. In each of the one or more attempts, a descrambling operation is performed on a different one of the plurality of different sections in the signal #3. The plurality of different sections of the signal #3 respectively correspond to the aforementioned plurality of sections to be scrambled in the bit sequence containing the signal #1 and signal #2, and therefore also respectively correspond to the wireless resources 3b, 3c, and 3d. For example, a bitwise exclusive OR of the bit sequence in each section and the scrambling sequence used in the scrambling by the wireless communication apparatus 1 is calculated. In the case where the conversion of the type (2) is used, the detection unit 2b makes one or more attempts to descramble the signal #3 by using one or more one of the plurality of different scrambling sequences, and performs error checking of the result of each of the one or more attempts. In each of the one or more attempts, a descrambling operation is performed on the signal #3 by using a different one of the plurality of different scrambling sequences. In the case where the conversion of the type (3) is used, the detection unit 2b makes one or more attempts to change the bit order in the signal #3 by using one or more of the plurality of second manners of bit-order change, and performs error checking of the result of each of the one or more attempts. In each of the one or more attempts, an operation for changing the bit order in the signal #3 is performed on the signal #3 in a different one of the plurality of second manners of bit-order change. The plurality of second manners of bit-order change respectively correspond to the plurality of first manners of bit-order change. Thus, the wireless communication apparatus 2 can recognize the manner of conversion selected by the wireless communication apparatus 1.

The error check can be realized by extracting signals corresponding to the signal #1 and the signal #2 from the signal #3 after the above conversion such as the descrambling or bit-order change, and comparing the parity calculated from the signal corresponding to the signal #1 and the signal corresponding to the signal #2. The criterion for judging whether or not the error check is passed is, for example, whether no error is detected, or whether the error bit rate is equal to or lower than a threshold.

The detection unit 2b may execute more than one attempt in more than one manner of conversion in parallel or in succession. Specifically, the detection unit 2b may produce copies of the received signal #3 in the number of candidates for the manner of conversion, perform more than one operation for conversion in more than one candidate for the manner of conversion in parallel, and perform the error checking of the results of the more than one operation for conversion in parallel. Alternatively, the detection unit 2b may perform more than one operation for conversion in more than one candidate for the manner of conversion in succession and perform the error checking of the result of each operation for conversion, until the result of the error checking of the signal #3 on which one of the more than one operation for conversion is performed satisfies the predetermined criterion.

The control information transmitted by the signal #1 can include information to be referred to by the wireless communication apparatus 2 when the wireless communication apparatus 2 receives data from the wireless communication apparatus 1, or information to be referred to by the wireless communication apparatus 2 when the wireless communication apparatus 2 transmits data to the wireless communication apparatus 1. In the case where the control information transmitted by the signal #1 includes information to be referred to by the wireless communication apparatus 2 when the wireless communication apparatus 2 receives data from the wireless communication apparatus 1, the wireless communication apparatus 2 receives data signals through one of the wireless resources 3b, 3c, and 3d which is detected as described above, and extracts data by reference to the signal #1. In the case where the control information transmitted by the signal #1 includes information to be referred to by the wireless communication apparatus 2 when the wireless communication apparatus 2 transmits data to the wireless communication apparatus 1, the wireless communication apparatus 2 generates data by reference to the signal #1, and transmits data signals by using the one of the wireless resources 3b, 3c, and 3d which is detected as described above.

In the wireless communication system according to the first embodiment as explained above, the wireless communication apparatus 1 generates the signal #1 and the signal #2, where the signal #1 is for use in processing using one of the plurality of wireless resources 3b, 3c, and 3d (which correspond to the aforementioned second wireless resources), and the signal #2 is for use in error checking of the signal #1. Then, the wireless communication apparatus 1 selects one, corresponding to the wireless resource to which the signal #1 is applied, of the wireless resources 3b, 3c, and 3d, and generates the signal #3 in the selected manner of conversion. The signal #3 contains information corresponding to the signal #1 and the signal #2, and is transmitted through the wireless resource 3a (which corresponds to the aforementioned first wireless resource).

The wireless communication apparatus 2 makes one or more attempts to convert the received signal #3 (one or more attempts to make the inversion of the conversion made by the wireless communication apparatus 1). In each of the one or more attempts, an operation of conversion is performed on the signal #3 in a different one of a plurality of manners of conversion, which respectively correspond to the plurality of manners of conversion one of which is used by the wireless communication apparatus 1 when generating the signal #3. After each of the one or more attempts, the wireless communication apparatus 2 extracts signals respectively corresponding to the signal #1 and the signal #2, makes an error check, estimates the manner of conversion used in the wireless communication apparatus 1, on the basis of the result of the error check, and detects one, corresponding to the estimated manner of conversion, of the wireless resources 3b, 3c, and 3d as the wireless resource to which the signal #1 is applied. Thereafter, the wireless communication apparatus 2 performs processing (e.g., data reception or data transmission) by use of the detected wireless resource.

Thus, the wireless communication apparatus 1 can efficiently inform the wireless communication apparatus 2 of the wireless resource to which the signal #1 is applied. Since it is unnecessary to attach to the signal #1 the bit for indicating one of the wireless resources 3b, 3c, and 3d according to the first embodiment, it is possible to suppress the consumption of the wireless resource 3a compared with the aforementioned technique disclosed in 3GPP TSG RAN WG1 #57bis, R1-092292. In addition, since it is unnecessary to indicate both of the opposite party and the wireless resource by the scrambling of the signal #2 only, according to the first embodiment, it is possible to suppress increase in the number of scrambling sequences required to be prepared, compared with the technique disclosed in 3GPP TSG RAN WG1 #55bis, R1-090375. Therefore, it is possible to suppress the possibility of exhaustion of the IDs for identification of the scrambling sequences.

The wireless communication system according to the first embodiment can be realized as a mobile communication system such as an LTE-A (Long term Evolution-Advanced) system. In this case, as mentioned before, the wireless communication apparatus 1 may be a wireless base station, and the wireless communication apparatus 2 may be a mobile station. In the embodiments hereinafter explained, the wireless communication method executed by the wireless communication apparatuses 1 and 2 in the first embodiment is applied to wireless communication between a wireless base station and one or more mobile stations. However, the communication method according to the first embodiment can also be applied to wireless communication other than the mobile communication, for example, to fixed wireless communication.

2. Second Embodiment

Figure 2:
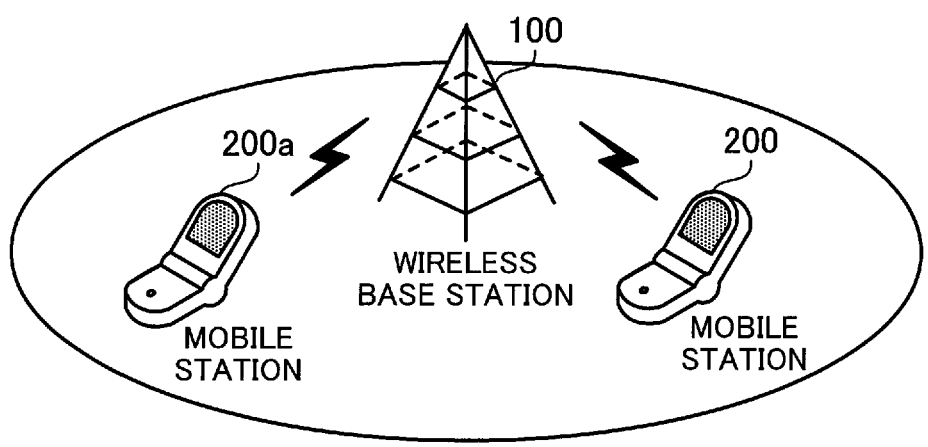
FIG. 2 illustrates a configuration of a mobile communication system according to a second embodiment.

FIG. 2 illustrates a configuration of a mobile communication system according to the second embodiment. The mobile communication system according to the second embodiment includes a wireless base station 100 and mobile stations 200 and 200a.

The wireless base station 100 is a wireless communication apparatus which performs wireless communication with the mobile stations in the cell covered by the wireless communication apparatus. The wireless base station 100 can perform communication with multiple mobile stations in parallel. The mobile stations 200 and 200a are, for example, mobile phones, personal digital assistants, and the like.

It is possible to perform bidirectional communication between the wireless base station 100 and each of the mobile stations 200 and 200a. Specifically, data transmission from the wireless base station 100 to each of the mobile stations 200 and 200a (i.e., downlink communication) and data transmission from each of the mobile stations 200 and 200a to the wireless base station 100 (i.e., uplink communication) can be performed. Communication using a plurality of component carriers (i.e., carrier aggregation) is performed in each of the downlink communication and the uplink communication between the wireless base station 100 and each of the mobile stations 200 and 200a.

The wireless base station 100 performs operations for controlling the downlink communication and the uplink communication such as scheduling. The wireless base station 100 transmits control information to each of the mobile stations 200 and 200a when necessary. It is possible to consider that the wireless base station 100 is an example of the aforementioned wireless communication apparatus 1, and each of the mobile stations 200 and 200a is an example of the aforementioned wireless communication apparatus 2.

Figure 3:
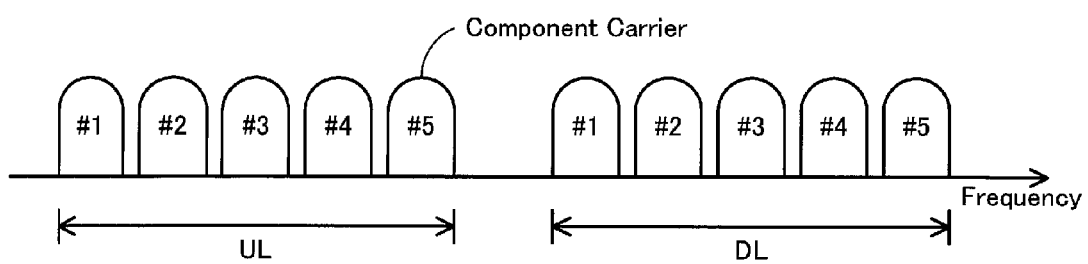
FIG. 3 illustrates an example of allocation of component carriers in the second embodiment.

FIG. 3 illustrates an example of allocation of component carriers in the second embodiment. In the mobile communication system according to the second embodiment, data transmission can be performed in each of the uplink (UL) and the downlink (DL) by using at most five component carriers (CC). A frequency band having a predetermined bandwidth (e.g., 20 MHz) is allocated for each component carrier.

The wireless base station 100 can transmit data by using one or more wireless resources in one or more of the five component carriers (CC#1 to CC#5) in the downlink. Each of the mobile stations 200 and 200*a* can transmit data by using one or more wireless resources in one or more of the five component carriers (CC#1 to CC#5) in the uplink.

Although consecutive frequency bands are allocated for the five component carriers in each of the uplink and the downlink in the example of FIG. 3, the frequency bands which are allocated for the component carriers in each of the uplink and the downlink need not be consecutive. In addition, the number of component carriers in each of the uplink and the downlink can be set to an arbitrary number. The number of the component carriers in the uplink may be different from the number of the component carriers in the downlink. For example, it is possible to set five component carriers in the downlink, and three component carriers in the uplink. Further, the bandwidths of the component carriers in each of the uplink and the downlink need not be identical.

Figure 4:
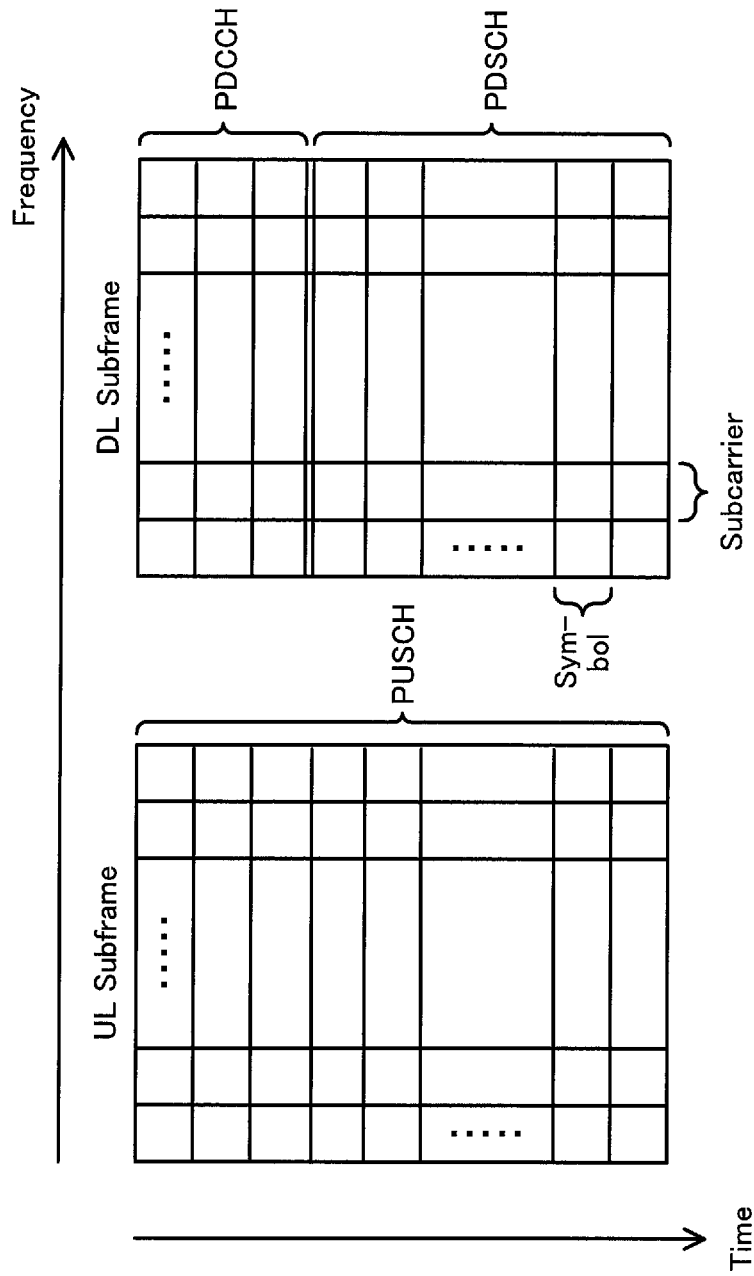
FIG. 4 illustrates an example of a structure of a wireless frame in the second embodiment.

FIG. 4 illustrates an example of a structure of a wireless frame in the second embodiment. In order to perform wireless communication between the wireless base station 100 and each of the mobile stations 200 and 200*a*, a wireless frame is formed for each component carrier. Each wireless frame contains a plurality of subframes (for example, ten subframes).

The wireless resources in the subframes are managed by the wireless base station 100. The minimum unit of resource management in the frequency direction is the subcarrier, and the minimum unit of resource management in the time direction is the symbol. The manner of use of the uplink is different from the manner of use of the downlink. The UL subframe contains a region for the physical uplink shared channel (PUSCH). The DL subframe contains a region for the physical downlink shared channel (PDSCH) and a region for the physical downlink control channel (PDCCH).

The PUSCH is a physical channel for transmitting user data and control information from each of the mobile stations 200 and 200*a* to the wireless base station 100. The control information transmitted through the PUSCH includes a request for allocation of one or more wireless resources for transmission of the user data. The PUSCH is set for each of the mobile stations 200 and 200*a*. PUSCHs for multiple mobile stations can be set in each UL subframe by frequency division. The wireless resources for the PUSCHs are dynamically allocated by the wireless base station 100.

The PDSCH is a physical channel for transmission of user data and control data in the upper layer from the wireless base station 100 to each of the mobile stations 200 and 200*a*. The PDSCH is set for each of the mobile stations 200 and 200*a*. PDSCHs for multiple mobile stations can be set in each DL subframe by orthogonal frequency division. Specifically, wireless resources corresponding to multiple symbols are arranged as regions which can be allocated for PDSCHs. Therefore, multiple PDSCHs can be set by frequency division of the regions. The wireless resources for the PDSCHs are dynamically allocated by the wireless base station 100.

The PDCCH is a physical channel for transmission of control information from the wireless base station 100 to each of the mobile stations 200 and 200*a*. The control information transmitted through the PDCCH includes information on the PUSCH and the PDSCH. The information on the PUSCH includes information on wireless resources allocated for the PUSCH and information designating the data format (e.g., the MCS (modulation and coding scheme)), information indicating uplink retransmission control by HARQ (hybrid automatic repeat request). The information on the PDSCH includes information on one or more wireless resources allocated for the PDSCH, information indicating the data format, and information indicating downlink retransmission control.

The PDCCH is set for each of the PUSCH and the PDSCH. That is, the control information for the PUSCH and the control information for the PDSCH are respectively transmitted through different PDCCHs. In addition, the control information for a mobile station and the control information for another mobile station are respectively transmitted through different PDCCHs. Multiple PDCCHs can be set in each DL subframe by orthogonal frequency division. Specifically, wireless resources corresponding to multiple symbols from the leading position of the DL subframe are arranged as regions which can be allocated for the PDCCH. Therefore, multiple PDCCHs can be set in the regions.

The allocation of the component carriers illustrated in FIG. 3 and the structures of the UL subframe and the DL subframe illustrated in FIG. 4 are examples for realizing the mobile communication system according to the second embodiment. Although the frequency division duplex is used for realizing bidirectional communication in the examples of FIGS. 3 and 4, it is possible to use time division duplex instead of the frequency division duplex. That is, it is possible to perform bidirectional communication by using a wireless frame in which UL subframes and DL subframes alternate in a time-division manner.

Although the control information for the PUSCH and the control information for the PDSCH are respectively transmitted through different PDCCHs in the above example, alternatively, it is possible to configure the mobile communication system in such a manner that both of the control information for the PUSCH and the control information for the PDSCH can be transmitted through a single PDCCH. In addition, although the control information for a mobile station and the control information for another mobile station are respectively transmitted through different PDCCHs in the above example, alternatively, it is possible to configure the mobile communication system in such a manner that both of the control information for a mobile station and the control information for another mobile station can be transmitted through a single PDCCH.

Figure 5:
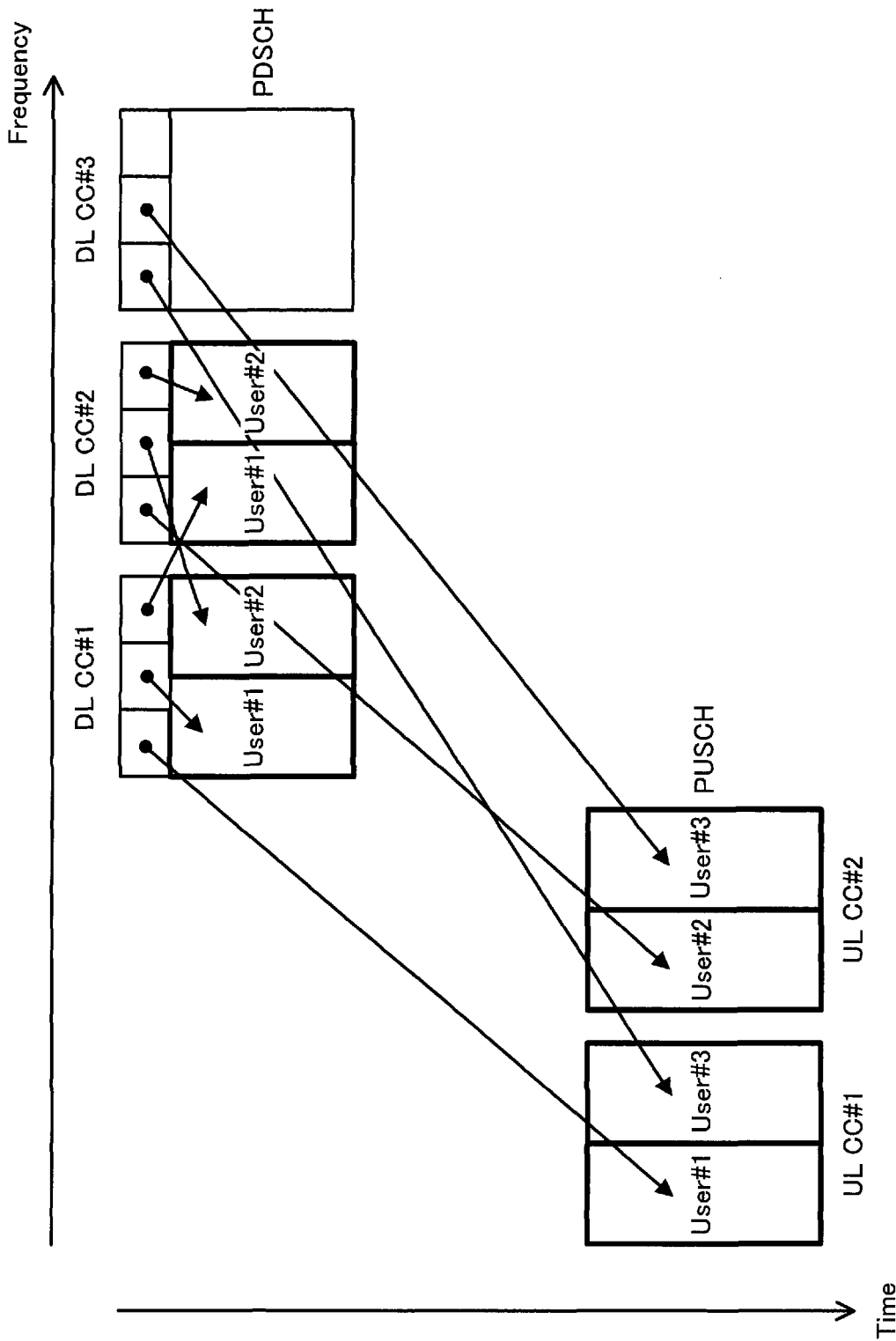
FIG. 5 illustrates an example of allocation for a PDSCH and a PUSCH in the second embodiment.

FIG. 5 illustrates an example of allocation of the PDSCH and the PUSCH in the second embodiment. In the example of FIG. 5, the PDCCHs for the user #1 (the mobile station 200) are set in the component carrier CC#1 in the downlink, the PDCCHs for the user #2 (the mobile station 200*a*) are set in the component carrier CC#2 in the downlink, and the PDCCHs for the user #3 are set in the component carrier CC#3 in the downlink. Since the PDCCHs for each mobile station are arranged in a single component carrier, each of the mobile stations 200 and 200*a* can narrow the component carrier which is to be monitored. This is advantageous in power consumption. However, the PDCCHs for a single mobile station may be distributed over more than one component carrier.

In addition, in the example of FIG. 5, at a timing, the PDSCHs for the users #1 and #2 are set in the component carriers CC#1 in the downlink, and the PDSCHs for the users #1 and #2 are also set in the component carriers CC#2 in the downlink. As mentioned above, the control information for the PDSCHs for the user #1 is transmitted through the component carrier CC#1, and the control information for the PDSCHs for the user #2 is transmitted through the component carrier CC#2. Further, at another timing, the PUSCHs for the users #1 and #3 are set in the component carriers CC#1 in the uplink, and the PUSCHs for the users #2 and #3 are also set in the component carriers CC#2 in the uplink. As mentioned above, the control information for the PUSCHs for the user #1 is transmitted through the component carrier CC#1, the control information for the PUSCHs for the user #2 is transmitted through the component carrier CC#2, and the control information for the PUSCHs for the user #3 is transmitted through the component carrier CC#3. That is, the control information transmitted through each PDCCH includes control information for a channel in a component carrier which is different from the component carrier accommodating the PDCCH. Therefore, it is preferable that the mobile stations 200 and 200a can easily recognize which component carrier the control information received through the PDCCH is to be applied to.

The control information for each PUSCH is transmitted by a DL subframe preceding a UL subframe containing the PUSCH by a predetermined time. In addition, the control information for each PDSCH is transmitted, for example, by the DL subframe containing the PDSCH.

Figure 6:
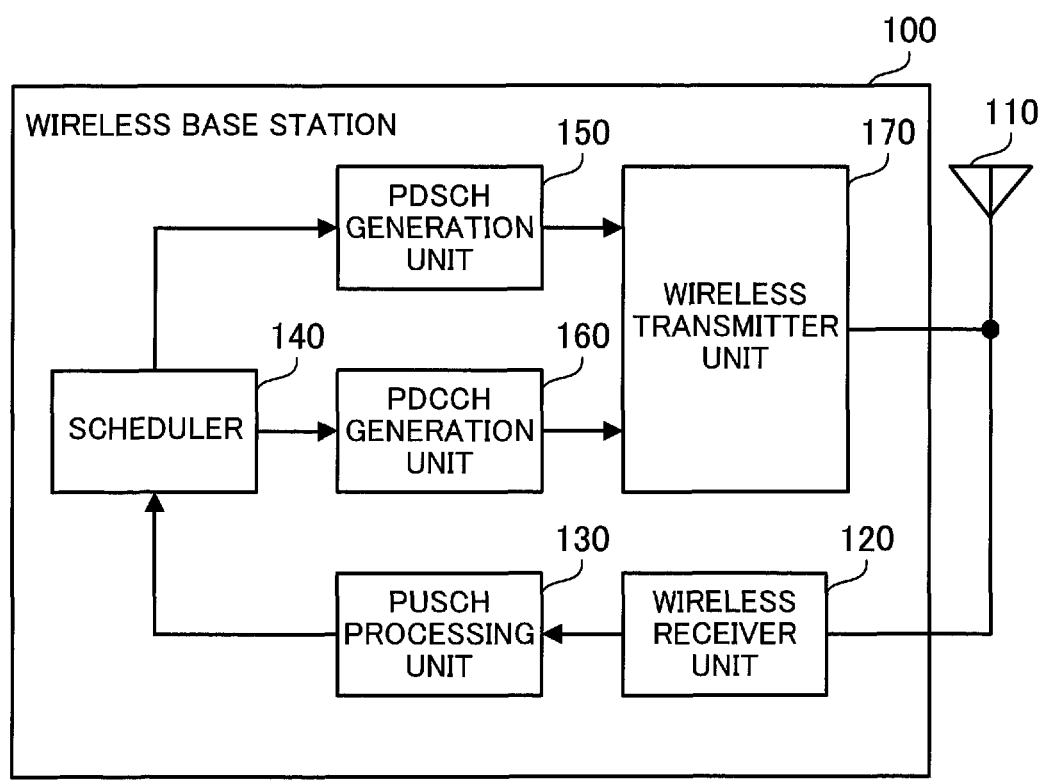
FIG. 6 is a block diagram illustrating a wireless base station in the second embodiment.

FIG. 6 illustrates the wireless base station in the second embodiment. The wireless base station 100 includes an antenna 110, a wireless receiver unit 120, a PUSCH processing unit 130, a scheduler 140, a PDSCH generation unit 150, a PDCCH generation unit 160, and a wireless transmitter unit 170.

The antenna 110 is antenna for use of both of transmission and reception. The antenna 110 outputs to the wireless receiver unit 120 wireless signals received from the mobile stations 200 and 200a, and wirelessly outputs transmission signals acquired from the wireless transmitter unit 170. Alternatively, the wireless base station 100 may have an antenna for transmission and an antenna for reception which are separately arranged. Further, in order to realize diversity communication, it is possible to arrange multiple antennas each for use of both of transmission and reception.

The wireless receiver unit 120 converts reception signals acquired from the antenna 110, into baseband signals, and outputs the converted reception signals to the PUSCH processing unit 130. For conversion from wireless signals into baseband signals, the wireless receiver unit 120 includes, for example, a low-noise amplifier (LNA), a frequency converter, a band-pass filter (BPF), an analog-to-digital (A/D) converter, and the like.

The PUSCH processing unit 130 extracts PUSCH signals from the baseband signals acquired from the wireless receiver unit 120, and performs error-correction decoding of the PUSCH signals. In the error-correction decoding, the PUSCH processing unit 130 refers to information on the MCS (modulation and coding scheme), which is transmitted from the wireless base station 100 to the mobile stations 200 and 200a through the PDCCH. Thus, the PUSCH processing unit 130 can extract the user data and the control information which are transmitted from the mobile stations 200 and 200a. In the case where the extracted control information includes information indicating a request for a UL wireless resource, the PUSCH processing unit 130 outputs the control information to the scheduler 140.

The scheduler 140 manages allocation of the DL wireless resources and the UL wireless resources. Specifically, when user data addressed to the mobile station 200 or 200a arrive at a buffer (not shown) arranged in the wireless base station 100, the scheduler 140 allocates a DL wireless resource to the mobile station 200 or 200a. In addition, the scheduler 140 detects the amount of user data which the mobile station 200 or 200a is to transmit, on the basis of the control information acquired from the PUSCH processing unit 130, and allocates a UL wireless resource to the mobile station 200 or 200a.

Then, the scheduler 140 informs the PDSCH generation unit 150 and the PDCCH generation unit 160 of the result of the scheduling.

The PDSCH generation unit 150 takes out the user data addressed to the mobile station 200 or 200a from the buffer (not shown) arranged in the wireless base station 100, according to the result of the scheduling of which the PDSCH generation unit 150 is informed by the scheduler 140. Then, the PDSCH generation unit 150 generates PDSCH signals by performing error-correction encoding of the user data, and outputs the generated PDSCH signal to the wireless transmitter unit 170.

The PDCCH generation unit 160 generates control information for the PDSCH according to the result of the scheduling for the DL wireless resources of which the PDCCH generation unit 160 is informed by the scheduler 140. In addition, the PDCCH generation unit 160 generates control information for the PUSCH according to the result of the scheduling for the UL wireless resources of which the PDCCH generation unit 160 is informed by the scheduler 140. Further, the PDCCH generation unit 160 generates PDCCH signals by performing error-correction encoding of the control information, and outputs the generated PDCCH signals to the wireless transmitter unit 170. Details of the PDCCH generation unit 160 will be explained later.

The wireless transmitter unit 170 converts data signals and control signals into wireless signals, where the data signals are the PDSCH signals acquired from the PDSCH generation unit 150, and the control signals are PDCCH signals acquired from the PDCCH generation unit 160. For conversion from baseband signals into wireless signals, the wireless transmitter unit 170 includes, for example, a digital-to-analog (D/A) converter, a frequency converter, a band-pass filter (BPF), and the like.

Figure 7:
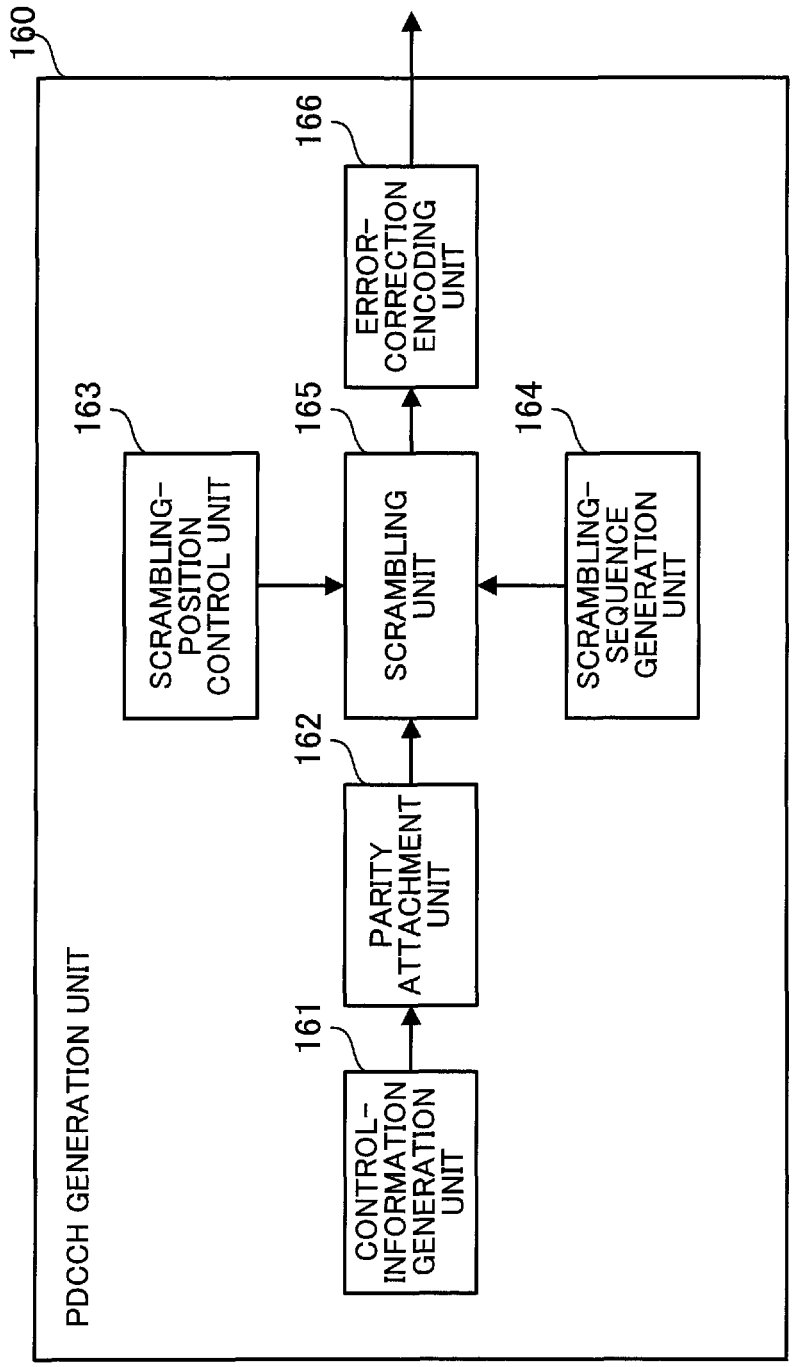
FIG. 7 is a block diagram illustrating details of a PDCCH generation unit in the second embodiment.

FIG. 7 is a block diagram illustrating details of the PDCCH generation unit in the second embodiment. The PDCCH generation unit 160 includes a control-information generation unit 161, a parity attachment unit 162, a scrambling-position control unit 163, a scrambling-sequence generation unit 164, a scrambling unit 165, and an error-correction encoding unit 166.

The control-information generation unit 161 generates control information for the PDSCH and the PUSCH. As explained before, the control information for the PDSCH includes the MCS (modulation and coding scheme) which the wireless base station 100 applies to the PDSCH, and information indicating the position of the PDSCH in the DL subframe. The control information for the PUSCH includes the MCS (modulation and coding scheme) which the mobile station 200 or 200a should apply to the PUSCH, and information indicating the position of the PUSCH in the UL subframe. Further, the control-information generation unit 161 outputs a bit sequence indicating the above control information to the parity attachment unit 162. The length of the bit sequence may be either fixed or variable.

The parity attachment unit 162 generates a bit sequence for error checking (sequence of parity bits) on the basis of the bit sequence (sequence of information bits) acquired from the control-information generation unit 161. The error checking technique may be, for example, a type using a CRC. The parity attachment unit 162 generates a control signal by attaching the parity bits to the information bits, and outputs the generated control signal to the scrambling unit 165.

At this time, the parity attachment unit 162 scrambles the parity bits by using a scrambling sequence corresponding to a mobile station as the destination of the control signal. The used scrambling sequence is a sequence corresponding to an RNTI (radio network temporary identifier), which is an ID assigned to each mobile station in advance. Therefore, each of the mobile stations 200 and 200a can determine whether or not each control signal is addressed to the mobile station, on the basis of whether or not the mobile station can descramble the parity bits. The scrambling of the parity bits may be performed either before or after the information bits and the parity bits are combined.

The scrambling-position control unit 163 controls the section to be scrambled, in each control signal generated by the parity attachment unit 162. In the scrambling-position control unit 163, correspondences between five component carriers (CC#1 to CC#5) and five sections to be scrambled are recorded in advance. The scrambling-position control unit 163 determines the component carrier to which each control signal is to be applied, and informs the scrambling unit 165 of the determined section to be scrambled.

For example, in the case where the control signal is to be applied to the PUSCH in the component carrier CC#1, the scrambling-position control unit 163 informs the scrambling unit 165 of a section to be scrambled corresponding to the component carrier CC#1. In the case where the control signal is to be applied to the PDSCH in the component carrier CC#2, the scrambling-position control unit 163 informs the scrambling unit 165 of a section to be scrambled corresponding to the component carrier CC#2.

The scrambling-sequence generation unit 164 generates a scrambling sequence, and outputs the generated scrambling sequence to the scrambling unit 165. The bit length of the outputted scrambling sequence may be identical to the bit length of a part of the control signal in the section to be scrambled.

For example, the scrambling sequences may be the following examples (a) to (f). It is possible to use respectively different types of bit sequences for the control signals for the PDSCH and for the control signals for the PUSCH.

(a) A bit sequence representing an RNTI assigned to a mobile station as a destination of a control signal
(b) A bit sequence representing a cell ID
(c) An arbitrary random bit sequence determined by a consensus of the mobile stations 200 and 200a
(d) A pseudorandom bit sequence generated from either or both of the RNTI and the cell ID as one or more initial values
(e) A bit sequence of all ones
(f) A bit sequence of alternating zeros and ones The scrambling unit 165 scrambles the section in the control signal acquired from the parity attachment unit 162, by using a scrambling sequence acquired from the scrambling-sequence generation unit 164. Specifically, in the operation performed by the scrambling unit 165, a bitwise exclusive OR of the bit sequence in the section and the scrambling sequence is calculated, and the bit sequence in the section is replaced with the calculated bitwise exclusive OR. The scrambling unit 165 is informed by the scrambling-position control unit 163 of the section to be scrambled. Then, the scrambling unit 165 outputs the scrambled control signal to the error-correction encoding unit 166. Thus, the mobile stations 200 and 200a can determine which component carrier the control signal is to be applied, by estimating the section which is scrambled.

The scrambling performed by the scrambling unit 165 is different from the scrambling performed by the parity attachment unit 162. In the above explanation, the section in the control signal corresponding to the component carrier is scrambled after the parity bits are scrambled in correspondence with the RNTI. However, in the case where the scrambling unit 165 scrambles only the information bits, the scrambling by the scrambling unit 165 may be performed either before or after the scrambling by the parity attachment unit 162.

The error-correction encoding unit 166 performs error-correction encoding of the scrambled control signal, and generates a PDCCH signal, where the scrambled control signal is acquired from the scrambling unit 165. In the case of encoding for a PDCCH signal, a predetermined encoding technique is used. Then, the error-correction encoding unit 166 outputs the generated PDCCH signal to the wireless transmitter unit 170. In the above explanation, the error-correction encoding is performed after the scrambling of the section corresponding to the component carrier. However, the error-correction encoding may be performed before the scrambling of the section corresponding to the component carrier.

Figure 8:
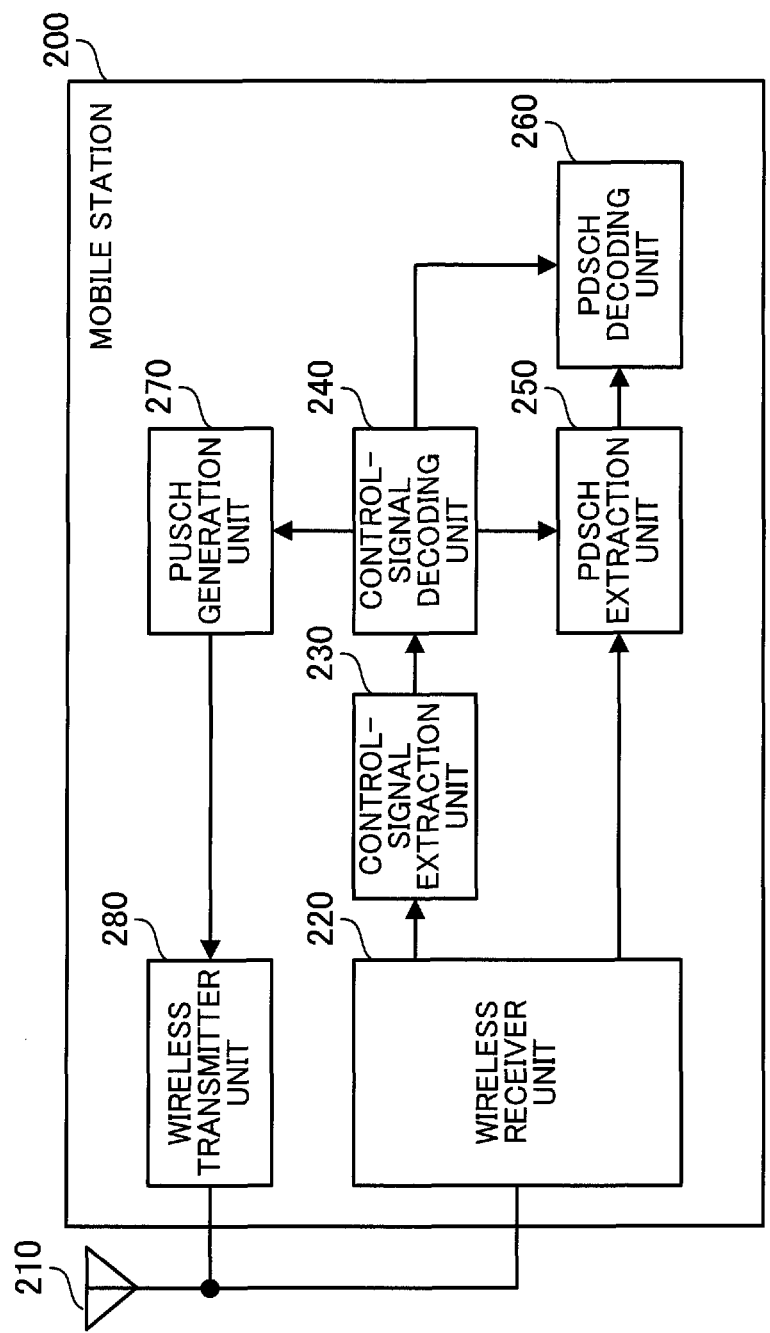
FIG. 8 is a block diagram illustrating a mobile terminal in the second embodiment.

FIG. 8 illustrates the mobile terminal 200 in the second embodiment. The mobile station 200 includes an antenna 210, a wireless receiver unit 220, a control-signal extraction unit 230, a control-signal decoding unit 240, a PDSCH extraction unit 250, a PDSCH decoding unit 260, a PUSCH generation unit 270, and a wireless transmitter unit 280. The mobile station 200a can be realized by a similar construction to the mobile station 200.

The antenna 210 is an antenna for use of both of transmission and reception. The antenna 210 outputs to the wireless receiver unit 220 wireless signals received from the wireless base station 100. In addition, the wireless receiver unit 220 wirelessly outputs transmission signals acquired from the wireless transmitter unit 280. Alternatively, the mobile station 200 may have an antenna for transmission and an antenna for reception which are separately arranged. Further, in order to realize diversity communication, it is possible to arrange multiple antennas each for use of both of transmission and reception.

The wireless receiver unit 220 converts reception signals acquired from the antenna 210, into baseband signals, and outputs the converted reception signals to the control-signal extraction unit 230 and the PDSCH extraction unit 250. For conversion from wireless signals into baseband signals, the wireless receiver unit 220 includes, for example, a low-noise amplifier (LNA), a frequency converter, a band-pass filter (BPF), an analog-to-digital (A/D) converter, and the like.

The control-signal extraction unit 230 extracts one or more PDCCH-signal candidates from the reception signals (in the form of the baseband signals) acquired from the wireless receiver unit 220, where the PDCCH-signal candidates are each a signal which may be possibly a PDCCH signal addressed to the mobile station 200. Then, the control-signal extraction unit 230 outputs the one or more extracted PDCCH-signal candidates to the control-signal decoding unit 240.

The control-signal decoding unit 240 performs error-correction decoding of each PDCCH-signal candidate acquired from the control-signal extraction unit 230, and extracts control information addressed to the mobile station 200. At this time, the control-signal decoding unit 240 determines the component carrier to which the extracted control information is to be applied. In addition, the control-signal decoding unit 240 determines to which of the PDSCH and the PUSCH the control information is to be applied, on the basis of details of the control information.

In the case where the control information is to be applied to the PDSCH, the control-signal decoding unit 240 outputs the control information to the PDSCH extraction unit 250 and the PDSCH decoding unit 260, and informs the PDSCH extraction unit 250 and the PDSCH decoding unit 260 of the determined component carrier. In the case where the control information is to be applied to the PUSCH, the control-signal decoding unit 240 outputs the control information to the PUSCH generation unit 270, and informs the PUSCH generation unit 270 of the determined component carrier. Details of the control-signal decoding unit 240 will be explained later.

The PDSCH extraction unit 250 extracts PDSCH signals from the reception signals (in the form of the baseband signals) acquired from the wireless receiver unit 220. The signals to be extracted are determined by the component carrier of which the PDSCH extraction unit 250 is informed by the control-signal decoding unit 240 and the position in the subframe indicated by the control signal acquired from the control-signal decoding unit 240. Then, the PDSCH extraction unit 250 outputs the extracted PDSCH signals to the PDSCH decoding unit 260.

The PDSCH decoding unit 260 performs error-correction decoding of each PDSCH signal acquired from the PDSCH extraction unit 250. In the error-correction decoding of the PDSCH signal, the PDSCH decoding unit 260 refers to the MCS (modulation and coding scheme) indicated in the control information acquired from the control-signal decoding unit 240. Thus, the user data addressed to the mobile station 200 and transmitted from the wireless base station 100 is extracted. Then, the PDSCH decoding unit 260 outputs the extracted user data to a processing unit in the upper layer (not illustrated).

The PUSCH generation unit 270 generates a PUSCH signal on the basis of the control information for the PUSCH acquired from the control-signal decoding unit 240. Specifically, the PUSCH generation unit 270 takes out user data from a buffer (not illustrated) arranged in the mobile station 200, and generates control information addressed to the wireless base station 100. The control information generated by the PUSCH generation unit 270 includes a request for allocation of a UL wireless resource. Then, the PUSCH generation unit 270 generates a PUSCH signal by performing error-correction encoding of the user data and the control information in a designated manner, and outputs the generated PUSCH signal to the wireless transmitter unit 280. The PUSCH signal is transmitted at the timing a predetermined number of subframes after reception of the control information.

The wireless transmitter unit 280 converts the PUSCH signal acquired from the PUSCH generation unit 270, into a wireless signal, and outputs the wireless signal to the antenna 210. For conversion from baseband signals into wireless signals, the wireless transmitter unit 280 includes, for example, a digital-to-analog (D/A) converter, a frequency converter, a band-pass filter (BPF), and the like.

Figure 9:
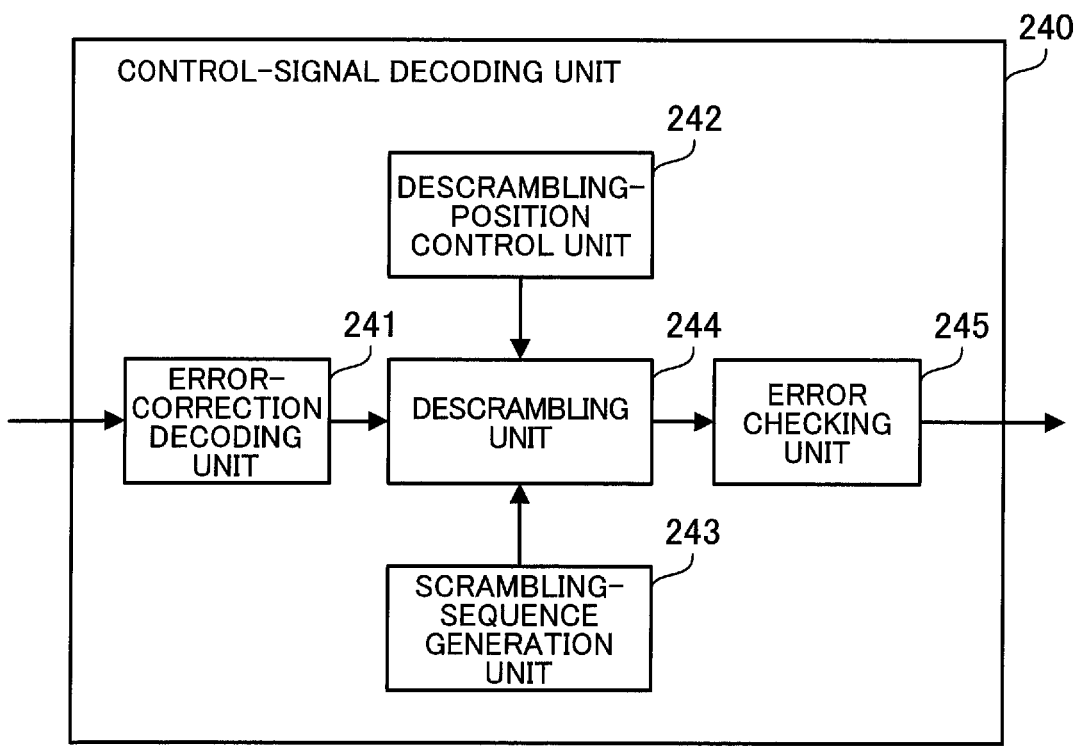
FIG. 9 illustrates details of a control-signal decoding unit in the second embodiment.

FIG. 9 illustrates details of a control-signal decoding unit in the second embodiment. The control-signal decoding unit 240 includes an error-correction decoding unit 241, a descrambling-position control unit 242, a scrambling-sequence generation unit 243, a descrambling unit 244, and an error checking unit 245.

The error-correction decoding unit 241 performs error-correction decoding of each PDCCH-signal candidate acquired from the control-signal extraction unit 230, so that a control signal is obtained. As mentioned before, a predetermined encoding technique is used in the encoding in the PDCCH. Then, the error-correction decoding unit 241 outputs the control signal to the descrambling unit 244.

The descrambling-position control unit 242 controls the section on which a descrambling operation is to be performed, in the control signal outputted from the error-correction decoding unit 241. In the descrambling-position control unit 242, correspondences between five component carriers (CC#1 to CC#5) and five sections to be descrambled are recorded in advance. The correspondences recorded in the descrambling-position control unit 242 respectively correspond to the correspondences recorded in the scrambling-position control unit 163 in the wireless base station 100. The descrambling-position control unit 242 informs the descrambling unit 244 of each of one or more sections being to be descrambled and corresponding to one or more component-carrier candidates, which are one or more component carriers in which the PDSCH or the PUSCH may be possibly set.

The one or more component-carrier candidates are changed according to the communication condition of the mobile station 200. For example, in the case where use of the component carriers CC#1 to CC#3 and nonuse of the component carriers CC#4 and CC#5 are determined in advance, only the component carriers CC#1 to CC#3 can become a candidate. In the case where the above limitation is not imposed, all the component carriers CC#1 to CC#5 can become a candidate.

The scrambling-sequence generation unit 243 generates the scrambling sequence, and outputs the generated scrambling sequence to the descrambling unit 244. The scrambling sequence generated by the scrambling-sequence generation unit 243 is identical to the scrambling sequence generated by the scrambling-sequence generation unit 164 in the wireless base station 100. (Therefore, the scrambling sequence may be the aforementioned examples.) The bit length of the scrambling sequence may be identical to the bit length of a part of the control signal in the section to be descrambled.

The descrambling unit 244 is informed by the descrambling-position control unit 242 of each of the one or more sections to be descrambled, and makes an attempt to descramble the (decoded) control signal acquired from the error-correction decoding unit 241 by performing a descrambling operation on the section to be descrambled in the control signal by use of the scrambling sequence acquired from the scrambling-sequence generation unit 243. The descrambling operation performed by the descrambling unit 244 is an operation which becomes the inversion of the operation performed by the scrambling unit 165 in the wireless base station 100 when the operation by the descrambling unit 244 is performed on the section actually scrambled by the scrambling unit 165. Specifically, in the operation performed by the descrambling unit 244, a bitwise exclusive OR of the bit sequence in the above section and the scrambling sequence is calculated, and the bit sequence in the section is replaced with the calculated bitwise exclusive OR. When the calculation of the bitwise exclusive OR with an identical scrambling sequence is repeated twice, the original bit sequence can be restored. The descrambling unit 244 outputs to the error checking unit 245 the control signal as the result of each attempt.

The error checking unit 245 performs error checking of each control signal acquired from the descrambling unit 244 as the result of each attempt. In order to perform the error checking, the error checking unit 245 descrambles the parity bits contained in the control signal. The scrambling sequence used in the descrambling is a bit sequence corresponding to the RNTI which is assigned to the mobile station 200 by the wireless base station 100. In addition, the error checking unit 245 generates a bit sequence on the basis of the information bits contained in the control signal, in the same manner as the parity attachment unit 162 in the wireless base station 100. Then, in order to check for an error in the information bits, the error checking unit 245 compares the generated bit sequence with the descrambled parity bits. The error checking technique may be, for example, a type using the CRC.

In the case where the error check is passed, i.e., the result of the error checking is satisfactory (e.g., it is determined that no error is detected), the error checking unit 245 determines that the control signal is a correct control signal addressed to the mobile station 200. Thereafter, the error checking unit 245 discards the parity bits, regards the information bits as control information, and determines whether the control information is to be applied to the PDSCH or the PUSCH. In the case where the error check fails, i.e., the result of the error checking is unsatisfactory (e.g., it is determined that an error is detected), the error checking unit 245 discards the control signal.

In addition to occurrence of an error in the wireless transmission line, the following two situations are considered to cause failure in error checking. The first situation is that the control signal is not addressed to the mobile station 200. In the first situation, the unscrambled parity bits cannot be restored by performing the descrambling operation on the scrambled parity bits by use of the scrambling sequence corresponding to the RNTI of the mobile station 200. The second situation is that the section on which the descrambling operation is performed by the descrambling unit 244 is different from the section scrambled by the scrambling unit 165 in the wireless base station 100. In the second situation, the unscrambled control signal cannot be restored.

In the case where the descrambling-position control unit 242 designates multiple sections to be descrambled, i.e., in the case where multiple candidates for the scrambled section (section to be descrambled) exist, the descrambling unit 244 makes one or more attempts to descramble the control signal. In each of the one or more attempts, the descrambling operation is performed on a different one of the multiple candidates for the scrambled section in the control signal. Then, the error checking unit 245 performs the error check of the control signal as the result of each attempt. Then, the error checking unit 245 determines a section on which the descrambling operation is performed and which makes the control signal pass the error check, and determines the component carrier corresponding to the determined section to be descrambled.

The descrambling unit 244 may make more than one attempt to descramble the control signal with more than one candidate for the section to be descrambled, in parallel. In each of the more than one attempt, the descrambling operation is performed on a different one of the more than one candidate for the scrambled section in the control signal. Then, the results of the more than one attempt are outputted to the error checking unit 245 for determination of one of the more than one candidate for the section to be descrambled which makes the control signal pass the error check. Alternatively, the descrambling unit 244 may make one or more attempts to descramble the control signal in succession until one of the candidates for the section to be descrambled makes the control signal pass the error check. In each of the one or more attempts, the descrambling operation is performed on a different one of the multiple candidates for the scrambled section in the control signal.

Further, as mentioned before, the wireless base station 100 may perform the scrambling corresponding to the component carrier after the error-correction encoding. In this case, the mobile station 200 can make the one or more attempts to descramble the control signal before the error-correction decoding. However, in the case where the one or more attempts to descramble the control signal is made before the error-correction decoding, the mobile station 200 is required to perform error-correction decoding for an identical reception signal multiple times. Therefore, performing the error-correction encoding after the scrambling is more advantageous than performing the error-correction encoding before the scrambling in suppression of the load imposed on the mobile station 200.

Figure 10:
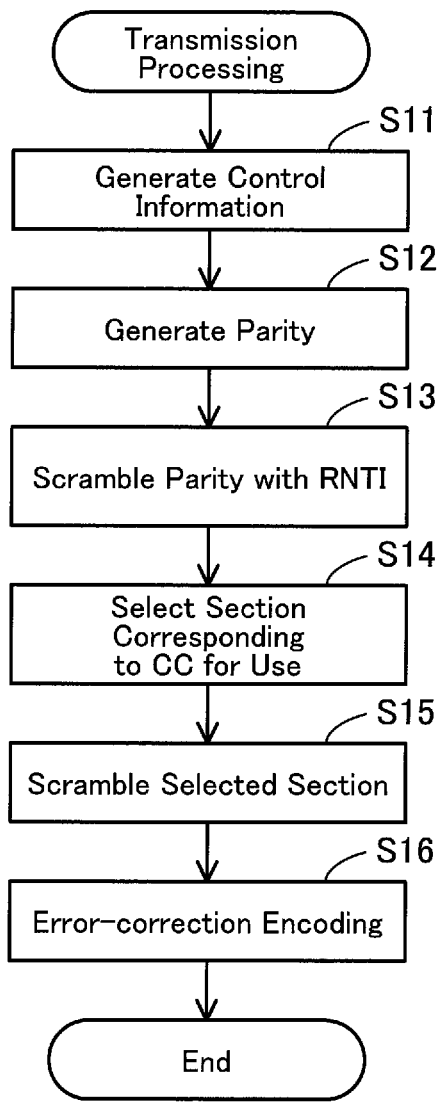
FIG. 10 is a flow diagram indicating transmission processing in the second embodiment.

FIG. 10 is a flow diagram indicating transmission processing in the second embodiment. The processing of FIG. 10 is continuously performed in the wireless base station 100 according to the second embodiment. The processing of FIG. 10 is explained below step by step.

<Step S11> The control-information generation unit 161 generates control information for the PDSCH or control information for the PUSCH.

<Step S12> The parity attachment unit 162 generates parity bits on the basis of information bits in accordance with a predetermined error checking technique (e.g., the CRC), where the bit sequence representing the control information generated in step S11 is regarded as the information bits.

<Step S13> The parity attachment unit 162 scrambles the parity bits generated in step S12, by using a scrambling sequence corresponding to the RNTI of the mobile station as a destination. Specifically, the parity attachment unit 162 calculates a bitwise exclusive OR of the parity bits and the scrambling sequence, and replaces the parity bits with the bit sequence of the calculated bitwise exclusive OR.

In the above operations in step S11 to S13, a control signal which contains the information bits representing the control information and the parity bits scrambled according to the RNTI is obtained.

<Step S14> The scrambling-position control unit 163 determines (the ordinal number identifying) the component carrier accommodating the PDSCH or the PUSCH to which the control signal is to be applied. Then, the scrambling-position control unit 163 selects, as a section to be scrambled, a section, associated with the determined component carrier, of the control signal generated in steps S11 to S13.

<Step S15> The scrambling unit 165 scrambles the section selected in step S14, in the control signal generated in steps S11 to S13, with a predetermined scrambling sequence. Specifically, the scrambling unit 165 calculates a bitwise exclusive OR of the bit sequence in the section and the scrambling sequence, and replaces the bit sequence in the section with the bit sequence of the calculated bitwise exclusive OR.

<Step S16> The error-correction encoding unit 166 performs error-correction encoding of the control signal which is scrambled in step S15, in accordance with a predetermined encoding technique, and outputs the encoded control signal as a PDCCH signal. The wireless transmitter unit 170 converts the PDCCH signal into a wireless signal, and transmits the wireless signal.

Correspondences between a plurality of component carriers and a plurality of different sections to be scrambled are recorded in advance in the wireless base station 100. The wireless base station 100 scrambles a section of the control signal corresponding to the component carrier to which the control signal is to be applied, as explained before, by reference to the above correspondences.

Figure 11:
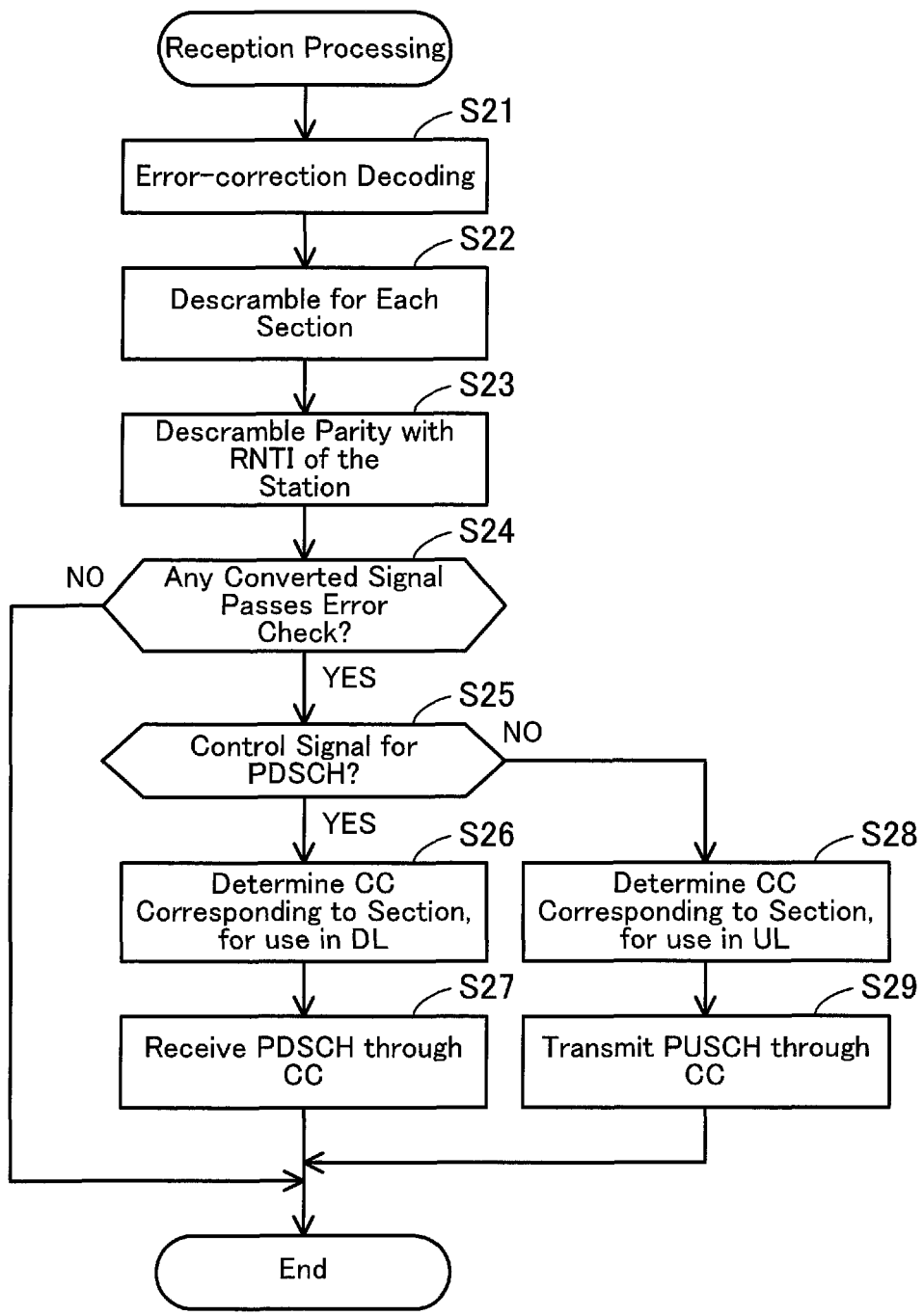
FIG. 11 is a flow diagram indicating reception processing in the second embodiment.

FIG. 11 is a flow diagram indicating reception processing in the second embodiment. The reception processing of FIG. 11 is continuously performed by the mobile station 200 according to the second embodiment. Similar processing is also performed by the mobile station 200a. The processing of FIG. 11 is explained below step by step.

<Step S21> The control-signal extraction unit 230 extracts one or more candidates for a PDCCH signal addressed to the mobile station 200. The error-correction decoding unit 241 performs error-correction decoding of the one or more candidates for the PDCCH signal, and outputs each of the one or more error-correction decoded candidates for the PDCCH signal as a control signal.

<Step S22> The descrambling-position control unit 242 determines one or more candidates for the component carrier corresponding to the control signal. Then, the descrambling-position control unit 242 selects one or more candidates for the section to be descrambled, which are associated with the one or more determined candidates for the component carrier corresponding to the control signal. The descrambling unit 244 makes one or more attempts to descramble the control signal with the one or more candidates for the section to be descrambled. In each attempt, the descrambling unit 244 performs a descrambling operation on a different one of the one or more candidates for the section to be descrambled, by use of a predetermined scrambling sequence. Specifically, the descrambling unit 244 calculates a bitwise exclusive OR of the scrambling sequence and the bit sequence in each of the one or more selected candidates for the section to be descrambled, and replaces the bit sequence in each of the one or more selected candidates for the section to be descrambled, with the calculated bitwise exclusive OR.

<Step S23> The error checking unit 245 descrambles the parity bits contained in the control signal, by using the scrambling sequence corresponding to the RNTI of the mobile station 200. Specifically, the error checking unit 245 calculates a bitwise exclusive OR of the parity bits and the scrambling sequence, and replaces the parity bits with the calculated bitwise exclusive OR.

<Step S24> The error checking unit 245 extracts the information bits and the parity bits from the control signal descrambled in steps S22 and S23, and performs error checking of the control signal as the result of each of the one or more attempts made in step S22. Then, the error checking unit 245 determines whether or not the result of one of the one or more attempts made in step S22 passes the error check (e.g., the result of one of the one or more attempts made in step S22 contains no error). When yes is determined in step S24, the operation goes to step S25. When no is determined in step S24, the processing of FIG. 11 is completed.

<Step S25> The error checking unit 245 determines whether or not the control information contained in the control signal which passes the error check is to be applied to the PDSCH (i.e., whether or not the control information contained in the control signal which passes the error check is control information for the PDSCH), where the bit sequence of the information bits in the control signal is regarded as the control information. In the case where the control information contained in the control signal which passes the error check is control information for the PDSCH, the operation goes to step S26. In the case where the control information contained in the control signal which passes the error check is control information for the PUSCH, the operation goes to step S28.

<Step S26> The error checking unit 245 determines the descrambled section in the control signal which passes the error check. Then, the error checking unit 245 determines the component carrier in the downlink which is associated with the descrambled section.

<Step S27> The PDSCH extraction unit 250 extracts a PDSCH signal from a reception signal received through the component carrier determined in step S26, on the basis of the control information for the PDSCH. The PDSCH decoding unit 260 decodes the extracted PDSCH signal, and extracts user data addressed to the mobile station 200.

<Step S28> The error checking unit 245 determines the descrambled section in the control signal which passes the error check. Then, the error checking unit 245 determines the component carrier in the uplink which is associated with the descrambled section.

<Step S29> The PUSCH generation unit 270 generates a PUSCH signal which is to be transmitted through the component carrier determined in step S28, on the basis of the control information for the PUSCH. The wireless transmitter unit 280 converts the PUSCH signal into a wireless signal, and transmits the wireless signal.

Correspondences between the plurality of component carriers and the plurality of different descrambled sections are recorded in advance in the mobile station 200. As explained before, the mobile station 200 makes one or more attempts to descramble the received control signal with the one or more candidates for the scrambled section in the control signal, and estimates the scrambled section on the basis of the result of error checking. Then, the component carrier to which the control signal is to be applied can be determined on the basis of the scrambled section which is estimated as above. In addition, as explained before, more than one attempt to descramble the received control signal and the error checking of the result of each attempt may be performed in parallel or in succession.

Figure 12:
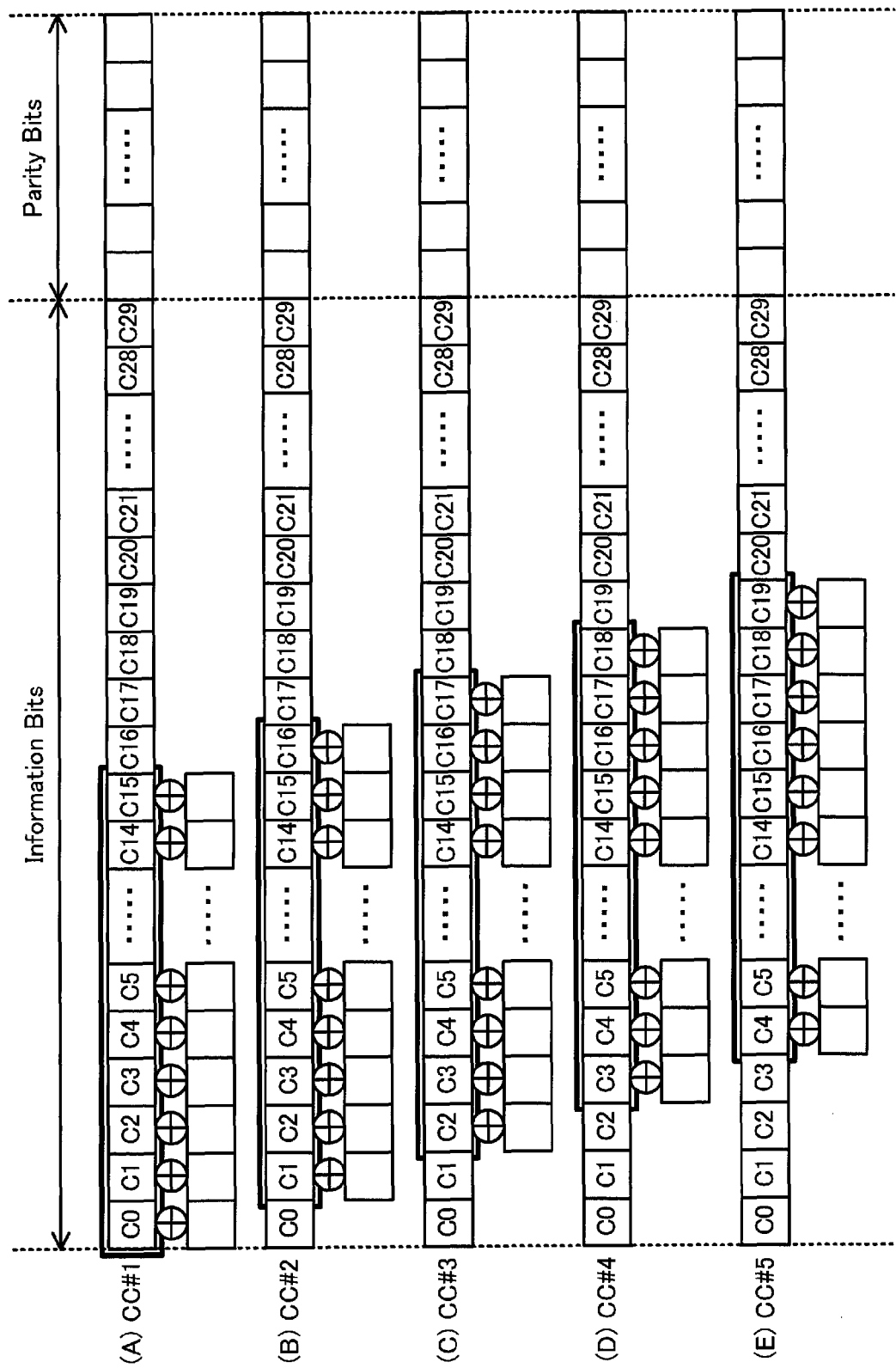
FIG. 12 illustrates a first example of a set of sections to be scrambled in control signals in the second embodiment.

FIG. 12 illustrates a first example of a set of sections to be scrambled in control signals in the second embodiment. In FIG. 12, it is assumed that the control signal after the parity-bit addition contains 30 information bits and 16 parity bits, and 16 bits in the 30 information bits are scrambled.

In the first example, a channel (PDSCH or PUSCH) to which the control signal is to be applied can be set in one of the component carriers, and the section to be scrambled corresponding to each component carrier to which an identification number is assigned is one bit shifted rearward from the section to be scrambled corresponding to the component carrier to which the preceding identification number is assigned. A bitwise exclusive OR of the 16 bits of the scrambling sequence and the 16 information bits in the section to be scrambled corresponding to each component carrier is calculated.

Specifically, the section of the leading 16 bits C0 to C15 is scrambled in the case where the control signal is to be applied to the component carrier CC#1, and the section of the 16 bits C1 to C16, which are one bit shifted rearward from the leading 16 bits C0 to C15, is scrambled in the case where the control signal is to be applied to the component carrier CC#2. Further, the section of the 16 bits C2 to C17, which are one bit shifted rearward from the leading 16 bits C1 to C16, is scrambled in the case where the control signal is to be applied to the component carrier CC#3, the section of the 16 bits C3 to C18, which are one bit shifted rearward from the 16 bits C2 to C17, is scrambled in the case where the control signal is to be applied to the component carrier CC#4, and the section of the 16 bits C4 to C19, which are one bit shifted rearward from the 16 bits C3 to C18, is scrambled in the case where the control signal is to be applied to the component carrier CC#5.

Figure 13:
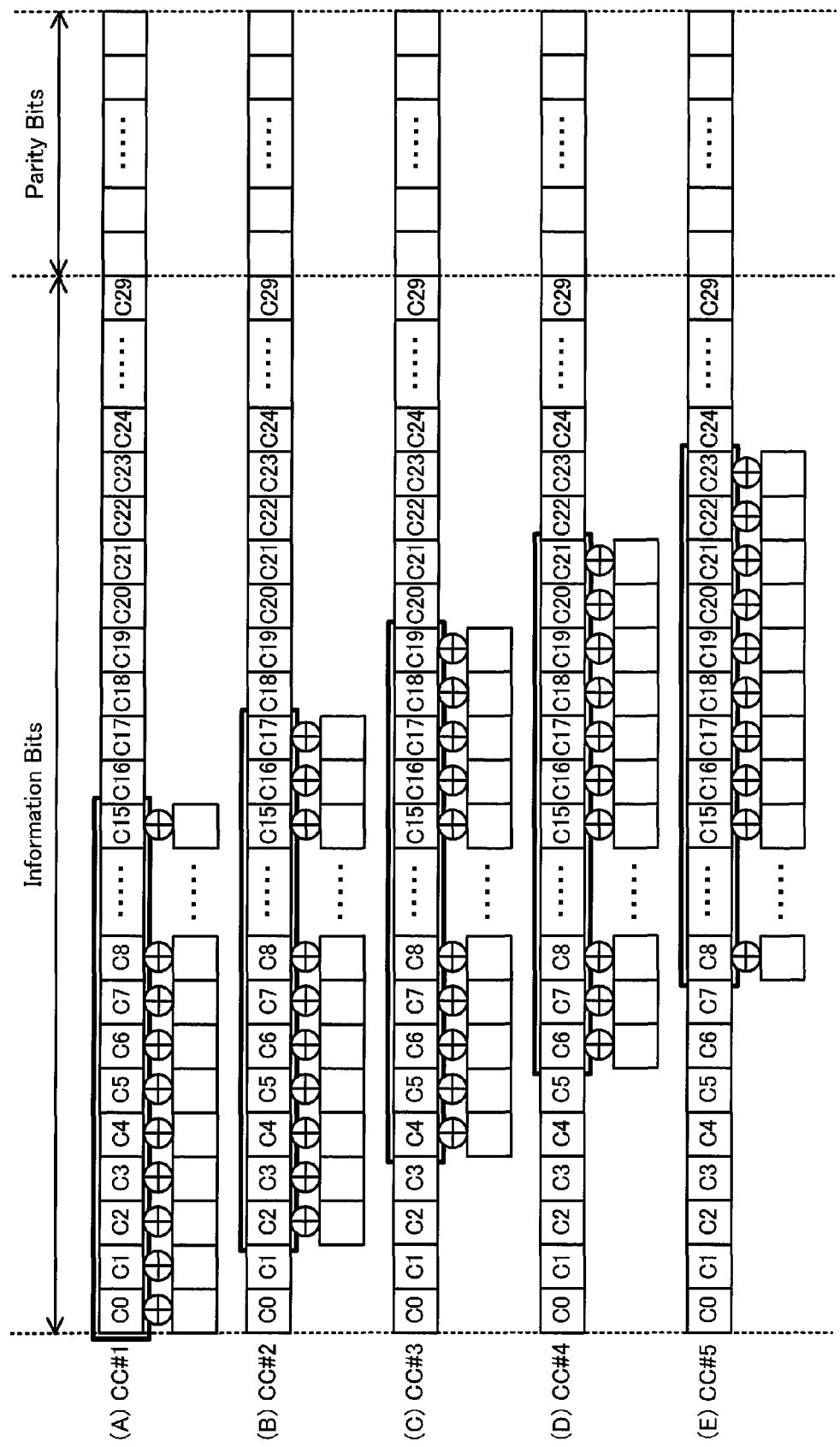
FIG. 13 illustrates a second example of a set of sections to be scrambled in control signals in the second embodiment.

FIG. 13 illustrates a second example of a set of sections to be scrambled in control signals in the second embodiment. In the second example, the section to be scrambled corresponding to each component carrier to which an identification number is assigned is two bits shifted rearward from the section to be scrambled corresponding to the component carrier to which the preceding identification number is assigned.

Specifically, the section of the leading 16 bits C0 to C15 is scrambled in the case where the control signal is to be applied to the component carrier CC#1, and the section of the 16 bits C2 to C17, which are two bits shifted rearward from the leading 16 bits C0 to C15, is scrambled in the case where the control signal is to be applied to the component carrier CC#2. Further, the section of the 16 bits C4 to C19, which are two bits shifted rearward from the leading 16 bits C2 to C17, is scrambled in the case where the control signal is to be applied to the component carrier CC#3, the section of the 16 bits C6 to C21, which are two bits shifted rearward from the 16 bits C4 to C19, is scrambled in the case where the control signal is to be applied to the component carrier CC#4, and the section of the 16 bits C8 to C23, which are two bits shifted rearward from the 16 bits C6 to C21, is scrambled in the case where the control signal is to be applied to the component carrier CC#5.

Figure 14:
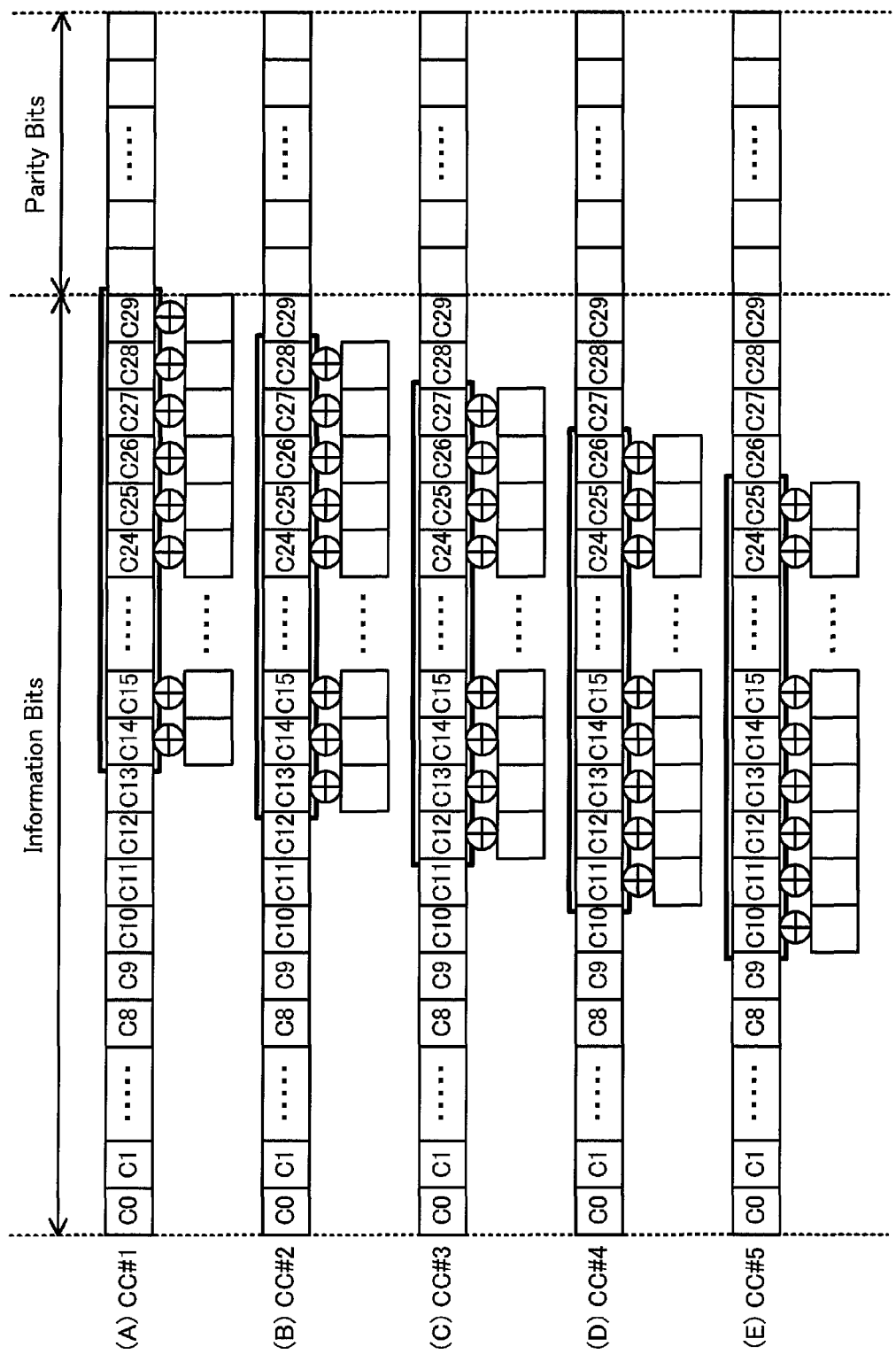
FIG. 14 illustrates a third example of a set of sections to be scrambled in control signals in the second embodiment.

FIG. 14 illustrates a third example of a set of sections to be scrambled in control signals in the second embodiment. In the third example, as in the first example, the section to be scrambled corresponding to each component carrier to which an identification number is assigned is one bit shifted forward from the section to be scrambled corresponding to the component carrier to which the preceding identification number is assigned. However, the third example is different from the first example in that the first section to be scrambled in the set in the third example is the section of the last 16 bits C14 to C29, and the other sections are shifted forward from the last 16 bits C14 to C29.

Specifically, the section of the last 16 bits C14 to C29 is scrambled in the case where the control signal is to be applied to the component carrier CC#1, and the section of the 16 bits C13 to C28, which are one bit shifted forward from the last 16 bits C14 to C29, is scrambled in the case where the control signal is to be applied to the component carrier CC#2. Further, the section of the 16 bits C12 to C27, which are one bit shifted forward from the leading 16 bits C13 to C28, is scrambled in the case where the control signal is to be applied to the component carrier CC#3, the section of the 16 bits C11 to C26, which are one bit shifted forward from the 16 bits C12 to C27, is scrambled in the case where the control signal is to be applied to the component carrier CC#4, and the section of the 16 bits C10 to C25, which are one bit shifted forward from the 16 bits C11 to C26, is scrambled in the case where the control signal is to be applied to the component carrier CC#5.

As indicated in the first to third examples, the sections to be scrambled can be associated with the (five) component carriers (CC#1 to CC#5) in various manners. However, the manners of correspondence between the sections to be scrambled and the component carriers are not limited to the first to third examples. For example, the sections to be scrambled include the following variations.

(1) The section to be scrambled which is associated with the component carrier CC#1 needs not be the leading bits or the last bits.

(2) The shift value (shift amount) of the section to be scrambled corresponding to each component carrier having an identification number from the section to be scrambled corresponding to the component carrier having the preceding identification number needs not be identical.

(3) Although the sections illustrated in FIGS. 12 to 14 are each continuous, each section to be scrambled needs not be continuous.

(4) One or more of the sections to be scrambled may extend across the border between the information bits and the parity bits.

(5) The bit lengths of the sections to be scrambled need not be 16 bits, and need not be identical. However, the possibility of misdetection of the component carrier by the mobile stations 200 and 200a decreases with increase in the bit length of the scrambled section. In the case where the positions of the sections to be scrambled are shifted stepwise by N bits as in the first to third examples illustrated in FIGS. 12 to 14, the bit lengths of the sections can be set in the range not exceeding the upper limit, (the bit length of the information bits)−(the number of the component carriers minus one)×N.

In the mobile communication system according to the second embodiment, each of the mobile stations 200 and 200a can be efficiently informed by the wireless base station 100 of a component carrier accommodating a PDSCH or PUSCH to which a control signal is to be applied. Therefore, it is possible to suppress consumption of wireless resources by the PDCCH, compared with the technique in which the number identifying the component carrier is attached to the control signal. In addition, it is possible to suppress the possibility of exhaustion of RNTIs for identification of the scrambling sequences, compared with the technique in which RNTIs in the number of the component carrier are allocated to the mobile stations 200 and 200a.

According to the second embodiment, although the number identifying the component carrier is identified on the basis of the scrambled section, the uplink and the downlink are not discriminated. This is because it is possible to determine, on the basis of the control information, whether the control information is to be applied to the PDSCH or the PUSCH. Alternatively, it is possible to configure the mobile communication system to enable discrimination of the uplink and the downlink on the basis of the scrambled section. For example, it is possible to prepare ten different scrambled sections so as to enable unique discrimination of the ten component carriers in the uplink and the downlink.

According to the second embodiment, the determination of the component carrier by use of scrambling is made for each of the control signal for the PDSCH and the control signal for the PUSCH. However, the above method for determining the component carrier by use of scrambling may be executed for only one of the control signal for the PDSCH and the control signal for the PUSCH. For example, it is possible to execute the method for determining the component carrier by use of scrambling for only the control signal for the PDSCH, and attach a number explicitly identifying the component carrier to the control signal for the PUSCH. Alternatively, it is possible to execute the method for determining the component carrier by use of scrambling for only the control signal for the PUSCH, and attach a number explicitly identifying the component carrier to the control signal for the PDSCH.

According to the second embodiment, the mobile stations can be informed of all the component carriers to which control signals are to be applied, through the operations using scrambling and descrambling. However, it is possible to waive the operations using scrambling and descrambling of control signals to be applied to a specific component carrier (for example, in the case where a PDSCH signal and a PUSCH signal are transmitted through an identical component carrier, or in the case where a number identifying a component carrier through which PDSCH transmission is performed is identical to a number identifying a component carrier through which PDSCH transmission is performed).

The PDCCH, PDSCH, and PUSCH in the above explanations on the second embodiment can be respectively referred to as more general expressions "downlink control channel", "downlink shared channel", and "uplink shared channel". In other words, applications of the wireless communication method explained as the second embodiment are not limited to the technical field taken as an example in the above explanations. For example, the wireless communication method explained as the second embodiment can be applied to wireless communication systems (such as fixed communication systems) other than the mobile communication systems or wireless LAN systems. Similarly, the systems and the methods explained below for the third to eighth embodiments are not limited to the technical fields taken as examples in the explanations on the respective embodiments.

3. Third Embodiment

The third embodiment is explained in detail below. The following explanations on the third embodiment are focused on the differences from the second embodiment, and explanations on arrangements and operations similar to the second embodiment are not indicated below. According to the second embodiment, a component carrier accommodating a channel to which a control signal is to be applied is determined on the basis of the scrambled section. On the other hand, the third embodiment is characterized in that the leading (starting) wireless resource for a channel to which a control signal is to be applied is determined on the basis of the scrambled section.

The mobile communication system according to the third embodiment can be realized by a configuration similar to FIG. 2. In addition, the allocation of the component carriers and the structure of the wireless frame used in the wireless communication according to the third embodiment are similar to the allocation and the structure according to the second embodiment illustrated in FIGS. 3 to 5. In the wireless frame, the border between the PDSCH and the PDCCH in the DL subframe is variable.

Figure 15:
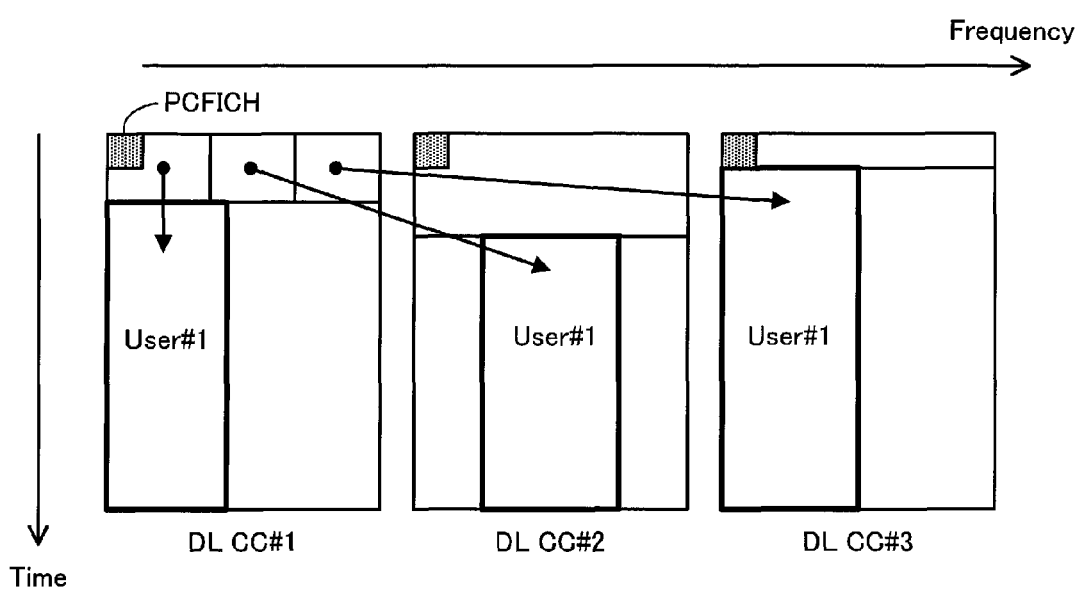
FIG. 15 illustrates an example of allocation of PDSCHs according to a third embodiment.

FIG. 15 illustrates an example of allocation for the PDSCHs according to the third embodiment. In each DL subframe, the leading several symbols are allocated as the region for the PDCCH, and the remaining symbols are allocated as the region for the PDSCH. The number of the symbols in the region for the PDCCH is different according to the DL subframe.

In the following explanations on the third embodiment, it is assumed that the number of the symbols allocated for each PDCCH is variable within the range of one to three. In the example of FIG. 15, two symbols are allocated to the region for the PDCCH in the DL subframe in the component carrier CC#1, so that the region for the PDSCH begins from the third symbol in the DL subframe in the component carrier CC#1. Three symbols are allocated to the region for the PDCCH in the DL subframe in the component carrier CC#2, so that the region for the PDSCH begins from the fourth symbol in the DL subframe in the component carrier CC#2. One symbol is allocated to the region for the PDCCH in the DL subframe in the component carrier CC#3, so that the region for the PDSCH begins from the second symbol in the DL subframe in the component carrier CC#3.

A PCFICH (physical control format indicator channel) is set in the region for the PDCCH in each DL subframe. The number of the symbols allocated for the PDCCH in each DL subframe is transmitted through the PCFICH. Specifically, the number "2" is transmitted through the PCFICH in the DL subframe in the component carrier CC#1 illustrated in FIG. 15, the number "3" is transmitted through the PCFICH in the DL subframe in the component carrier CC#2 illustrated in FIG. 15, and the number "1" is transmitted through the PCFICH in the DL subframe in the component carrier CC#3 illustrated in FIG. 15.

The apparatus which receives a wireless frame can determine, by reference to the PCFICH, the positions of the symbols transmitting a PDSCH signal. However, in the case where only the PCFICH is used, the apparatus cannot correctly extract the PDSCH signal when the apparatus fails in recognition of the PCFICH. Therefore, according to the third embodiment, a provision is made so as to enable correct reception of the PDSCH signal even when the apparatus fails in recognition of the PCFICH.

The wireless base station in the third embodiment can be realized by a construction similar to the wireless base station 100 according to the second embodiment illustrated in FIGS. 6 and 7 except that the control operations of the scrambling-position control unit 163 are differentiated from the second embodiment for realizing the characteristic of determining the leading wireless resource allocated for a channel on the basis of the scrambled section. The mobile station in the third embodiment can be realized by a construction similar to the mobile station 200 according to the second embodiment illustrated in FIGS. 8 and 9 except that the operations of the descrambling-position control unit 242 and the error checking unit 245 are differentiated from the second embodiment for realizing the characteristic of determining the leading wireless resource allocated for a channel on the basis of the scrambled section. Hereinbelow, the control operations according to the third embodiment are explained by using reference numbers similar to the second embodiment.

Figure 16:
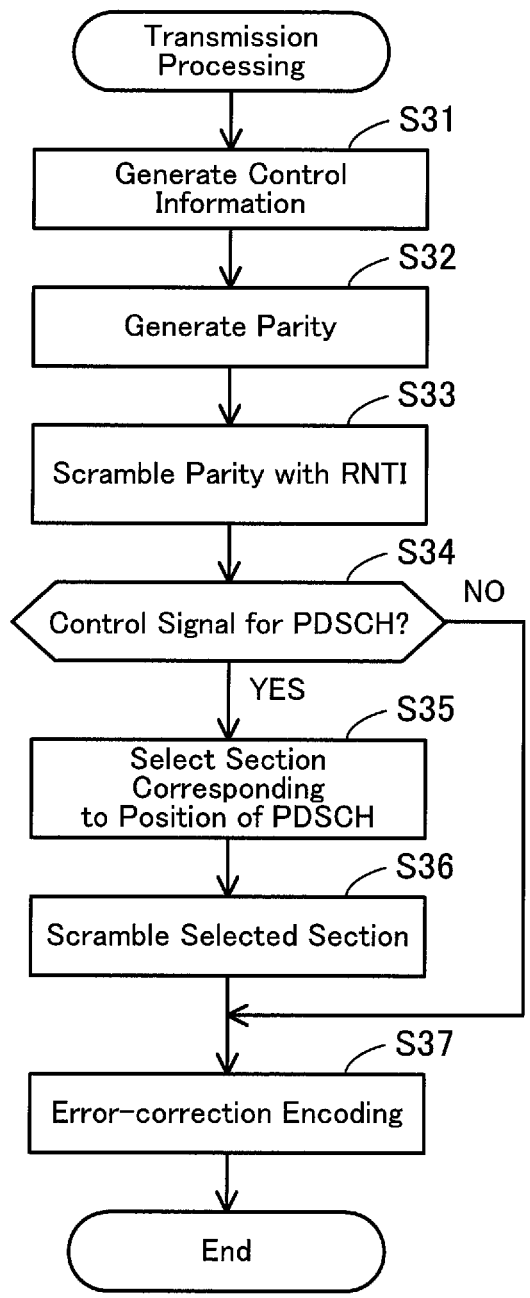
FIG. 16 is a flow diagram indicating transmission processing in the third embodiment.

FIG. 16 is a flow diagram indicating transmission processing in the third embodiment. The processing of FIG. 16 is continuously performed in the wireless base station 100 according to the third embodiment. The processing of FIG. 16 is explained below step by step.

<Step S31> The control-information generation unit 161 generates control information for the PDSCH or control information for the PUSCH. In order to discriminate the component carrier which accommodates the PDSCH or PUSCH, a number identifying a component carrier may be attached to the control information.

<Step S32> The parity attachment unit 162 generates parity bits on the basis of information bits, where the bit sequence representing the control information generated in step S31 is regarded as the information bits.

<Step S33> The parity attachment unit 162 scrambles the parity bits generated in step S32, by using a scrambling sequence corresponding to the RNTI of the mobile station as a destination.

In the above operations in step S31 to S33, a control signal which contains the information bits representing the control information and the parity bits scrambled according to the RNTI is obtained.

<Step S34> The scrambling-position control unit 163 determines whether or not the control signal is to be applied to the PDSCH. When yes is determined in step S34, i.e., when the control signal is to be applied to the PDSCH, the operation goes to step S35. When no is determined in step S34, i.e., when the control signal is to be applied to the PUSCH, the operation goes to step S37.

<Step S35> The scrambling-position control unit 163 determines a DL subframe accommodating the PDSCH to which the control signal is to be applied, and determines the border between the region for the PDCCH and the region for the PDSCH in the determined DL subframe (i.e., the ordinal position, in the DL subframe, of the leading symbol of the PDSCH or the starting symbol of the PDSCH). Then, the scrambling-position control unit 163 selects a section to be scrambled which is associated with the determined border. Correspondences between a plurality of sections to be scrambled in the control signal and a plurality of positions of the border between the region for the PDCCH and the region for the PDSCH in the determined DL subframe are recorded in advance in the demodulator scrambling-position control unit 163.

<Step S36> The scrambling unit 165 scrambles with a predetermined scrambling sequence the section selected in step S35 in the control signal generated in steps S31 to S33.

<Step S37> The error-correction encoding unit 166 performs error-correction encoding of the control signal which is scrambled in step S36, in accordance with a predetermined encoding method, and outputs the encoded control signal as a PDCCH signal. The wireless transmitter unit 170 converts the PDCCH signal into a wireless signal, and transmits the wireless signal.

As explained above, the correspondences between the plurality of subframe structures and the plurality of different sections to be scrambled are recorded in advance in the wireless base station 100. By reference to the correspondences, the wireless base station 100 scrambles a section in the control signal corresponding to the structure of the subframe in which the PDSCH is set. The control signal for the PUSCH needs not be scrambled, while the control signal for the PDSCH is scrambled in step S36.

Figure 17:
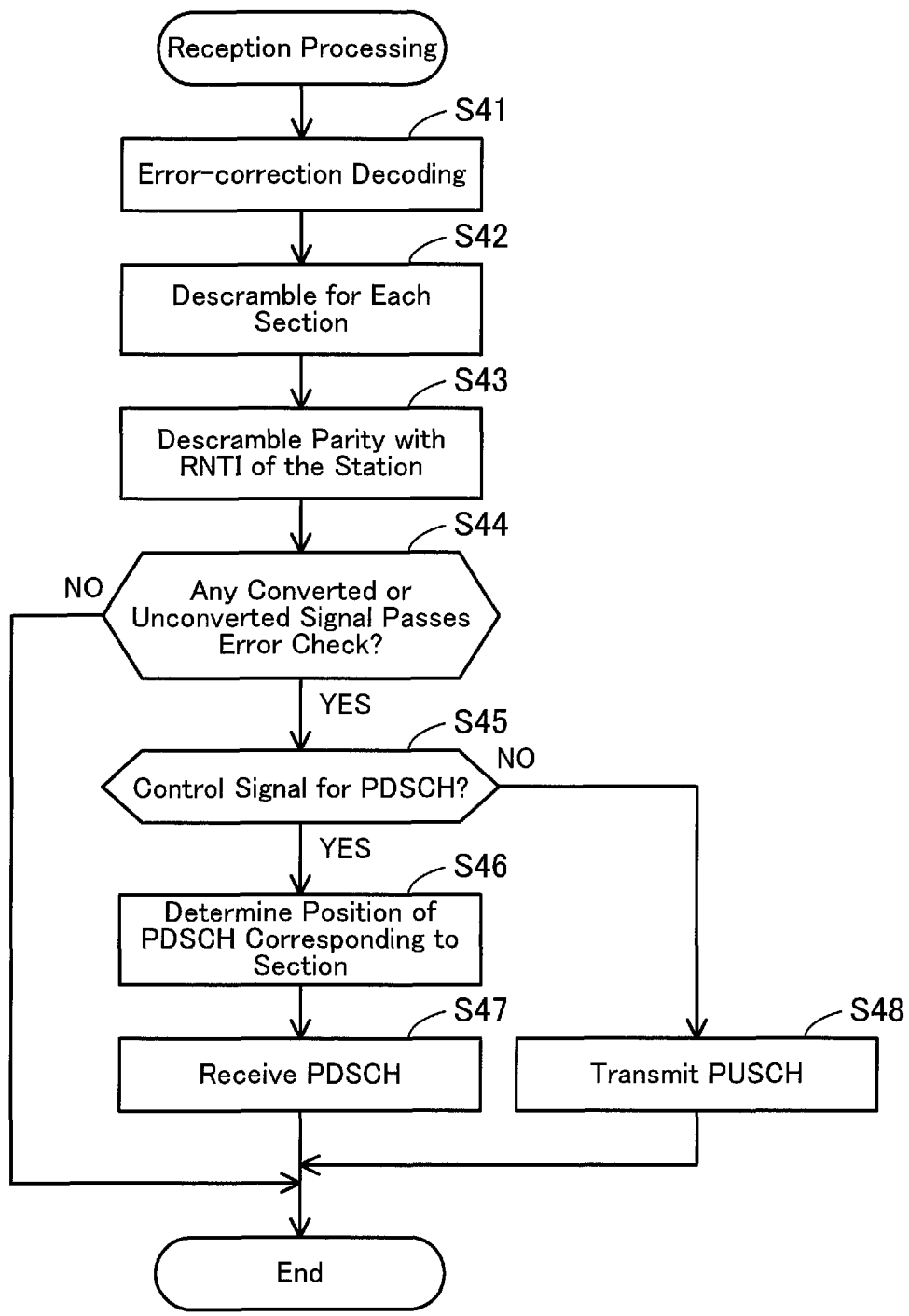
FIG. 17 is a flow diagram indicating reception processing in the third embodiment.

FIG. 17 is a flow diagram indicating reception processing in the third embodiment. The reception processing of FIG. 17 is continuously performed by the mobile station 200 according to the third embodiment. Similar processing is also performed by the mobile station 200a. The processing of FIG. 17 is explained below step by step.

<Step S41> The control-signal extraction unit 230 extracts from a DL subframe one or more candidates for a PDCCH signal addressed to the mobile station 200. The error-correction decoding unit 241 performs error-correction decoding of the one or more candidates for the PDCCH signal, and outputs each of the one or more error-correction decoded candidates for the PDCCH signal as a control signal.

<Step S42> The descrambling-position control unit 242 determines one or more candidates for the border between the region for the PDSCH and the region for the PDCCH in the determined DL subframe. Then, the descrambling-position control unit 242 selects one or more candidates for the section to be descrambled, which are respectively associated with the one or more determined candidates for the border between the region for the PDSCH and the region for the PDCCH. The descrambling unit 244 makes one or more attempts to descramble the control signal with one or more selected candidates for the section to be descrambled. In each of the one or more attempts, a descrambling operation is performed on a different one of the one or more selected candidates for the section to be descrambled, by use of a predetermined scrambling sequence. Correspondences between three sections to be descrambled in the control signal and three positions of the border between the region for the PDCCH and the region for the PDSCH in the determined DL subframe are recorded in advance in the descrambling-position control unit 242.

<Step S43> The error checking unit 245 descrambles the parity bits contained in the control signal, by using the scrambling sequence corresponding to the RNTI of the mobile station 200.

<Step S44> The error checking unit 245 performs error checking of the control signal as the result of each of the one or more attempts made in step S42 and the control signal on which the operation in step S42 is not performed, and determines whether or not either the result of one of the one or more attempts in step S42 or the control signal on which the operation in step S42 is not performed passes the error checking. When yes is determined in step S44, the operation goes to step S45. When no is determined in step S44, the processing of FIG. 17 is completed.

<Step S45> The error checking unit 245 determines whether or not the control information contained in the control signal which passes the error checking in step S44 is to be applied to the PDSCH. When the control signal is to be applied to the PDSCH, the operation goes to step S46. When the control signal is to be applied to the PUSCH, the operation goes to step S48. The control information for the PDSCH is extracted from the descrambled control signal on which the descrambling operation is performed in step S42, and the control information for the PUSCH is extracted from the control signal on which the descrambling operation in step S42 is not performed.

<Step S46> The error checking unit 245 determines the descrambled section in the control signal which passes the error check. Then, the error checking unit 245 determines (the position of) the leading (starting) symbol of the PDSCH on the basis of the determined descrambled section.

<Step S47> The PDSCH extraction unit 250 extracts a PDSCH signal from a reception signal, on the basis of the control information for the PDSCH and (the position of) the leading symbol determined in step S46. The PDSCH decoding unit 260 decodes the extracted PDSCH signal, and extracts user data addressed to the mobile station 200. In addition, the PDSCH extraction unit 250 may confirm (the position of) the leading symbol of the PDSCH by further referring to information which is transmitted through the PCFICH in the region of the PDCCH.

<Step S48> The PUSCH generation unit 270 generates a PUSCH signal on the basis of the control information for the PUSCH. The wireless transmitter unit 280 converts the PUSCH signal into a wireless signal, and transmits the wireless signal.

As explained above, the correspondences between the plurality of subframe structures and the plurality of different descrambled sections are recorded in advance in the mobile station 200. The mobile station 200 makes one or more attempts to descramble the control signal with the one or more candidates for the scrambled sections in the received control signal, and estimates the scrambled section on the basis of the result of error checking. Then, (the position of) the leading symbol of the PDSCH can be determined on the basis of the scrambled section which is estimated as above.

The structures of the DL subframes can be associated with sections to be scrambled, in various manners. For example, a section of the type illustrated for the component carrier CC#1 in FIGS. 12 to 14 may be associated with the case where one symbol is allocated for the PDCCH, a section of the type illustrated for the component carrier CC#2 in FIGS. 12 to 14 may be associated with the case where two symbols are allocated for the PDCCH, and a section of the type illustrated for the component carrier CC#3 in FIGS. 12 to 14 may be associated with the case where three symbols are allocated for the PDCCH.

In the mobile communication system according to the third embodiment, the mobile stations 200 and 200a can be efficiently informed by the wireless base station 100 of (the position of) the leading symbol of the PDSCH to which the control signal is to be applied. Therefore, even in the case where the positions of the symbols of the PDSCH in the DL subframe are variable, it is possible to reduce the risk of failure in extraction of the PDSCH signal by the mobile stations 200 and 200a.

4. Fourth Embodiment

The fourth embodiment is explained in detail below. The following explanations on the fourth embodiment are focused on the differences from the second and third embodiments, and explanations on arrangements and operations similar to the second and third embodiments are not indicated below. The fourth embodiment is characterized in that both of a component carrier accommodating a channel to which a control signal is to be applied and the position of the leading wireless resource for the channel are determined on the basis of the scrambled section.

The wireless base station according to the fourth embodiment can be realized by a construction similar to the wireless base station 100 according to the second embodiment illustrated in FIGS. 6 and 7 except that the control operations of the scrambling-position control unit 163 are differentiated from the second embodiment for realizing the above characteristic of the fourth embodiment. The mobile station in the fourth embodiment can be realized by a construction similar to the mobile station 200 according to the second embodiment illustrated in FIGS. 8 and 9 except that the operations of the descrambling-position control unit 242 and the error checking unit 245 are differentiated from the second embodiment for realizing the above characteristic of the fourth embodiment. Hereinbelow, the control operations according to the fourth embodiment are explained by using reference numbers similar to the second embodiment.

Figure 18:
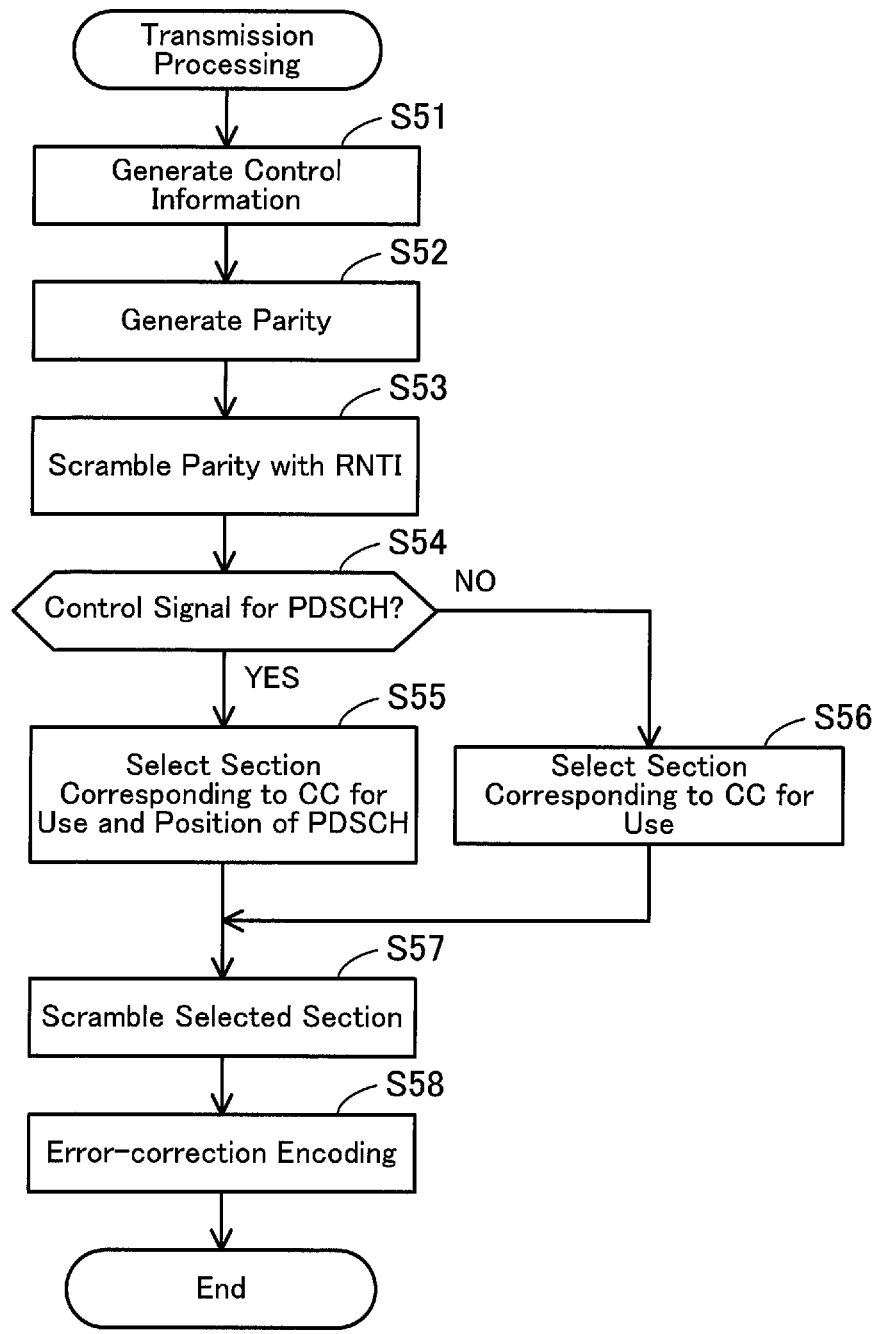
FIG. 18 is a flow diagram indicating transmission processing in a fourth embodiment.

FIG. 18 is a flow diagram indicating transmission processing in the fourth embodiment. The processing of FIG. 18 is continuously performed in the wireless base station 100 according to the fourth embodiment. The processing of FIG. 18 is explained below step by step.

<Step S51> The control-information generation unit 161 generates control information for the PDSCH or control information for the PUSCH.

<Step S52> The parity attachment unit 162 generates parity bits on the basis of information bits, where the bit sequence representing the control information generated in step S51 is regarded as the information bits.

<Step S53> The parity attachment unit 162 scrambles the parity bits generated in step S52, by using a scrambling sequence corresponding to the RNTI of the mobile station as a destination.

In the above operations in step S51 to S53, a control signal which contains the information bits representing the control information and the parity bits scrambled according to the RNTI is obtained.

<Step S54> The scrambling-position control unit 163 determines whether or not the control signal is to be applied to the PDSCH. When yes is determined in step S54, i.e., when the control signal is to be applied to the PDSCH, the operation goes to step S55. When no is determined in step S54, i.e., when the control signal is to be applied to the PUSCH, the operation goes to step S56.

<Step S55> The scrambling-position control unit 163 determines a component carrier accommodating the PDSCH to which the control signal is to be applied, determines a DL subframe accommodating the PDSCH to which the control signal is to be applied, and determines the border between the region for the PDCCH and the region for the PDSCH in the determined DL subframe. Then, the scrambling-position control unit 163 selects a section to be scrambled which is associated with the determined component carrier and the determined border. Correspondences between a plurality of sections to be scrambled in the control signal and a plurality of combinations of a plurality of component carriers and a plurality of positions of the border between the region for the PDCCH and the region for the PDSCH in the determined DL subframe are recorded in advance in the demodulator scrambling-position control unit 163.

<Step S56> The scrambling-position control unit 163 determines a component carrier accommodating the PUSCH to which the control signal is to be applied, and selects a section to be scrambled which is associated with the determined component carrier. Correspondences between component carriers and sections to be scrambled in the control signal are also recorded in advance in the demodulator scrambling-position control unit 163.

<Step S57> The scrambling unit 165 scrambles the section selected in step S55 or S56, in the control signal generated in step S51 to S53, with a predetermined scrambling sequence.

<Step S58> The error-correction encoding unit 166 performs error-correction encoding of the control signal which is scrambled in step S57, and outputs the encoded control signal as a PDCCH signal. The wireless transmitter unit 170 converts the PDCCH signal into a wireless signal, and transmits the wireless signal.

As explained above, the wireless base station 100 scrambles a section of each control signal to be applied to the PDSCH, in correspondence with the component carrier and the DL subframe structure which accommodate the PDSCH. In addition, the wireless base station 100 scrambles a section of each control signal to be applied to the PUSCH, in correspondence with the component carrier which accommodates the PUSCH.

Figure 19:
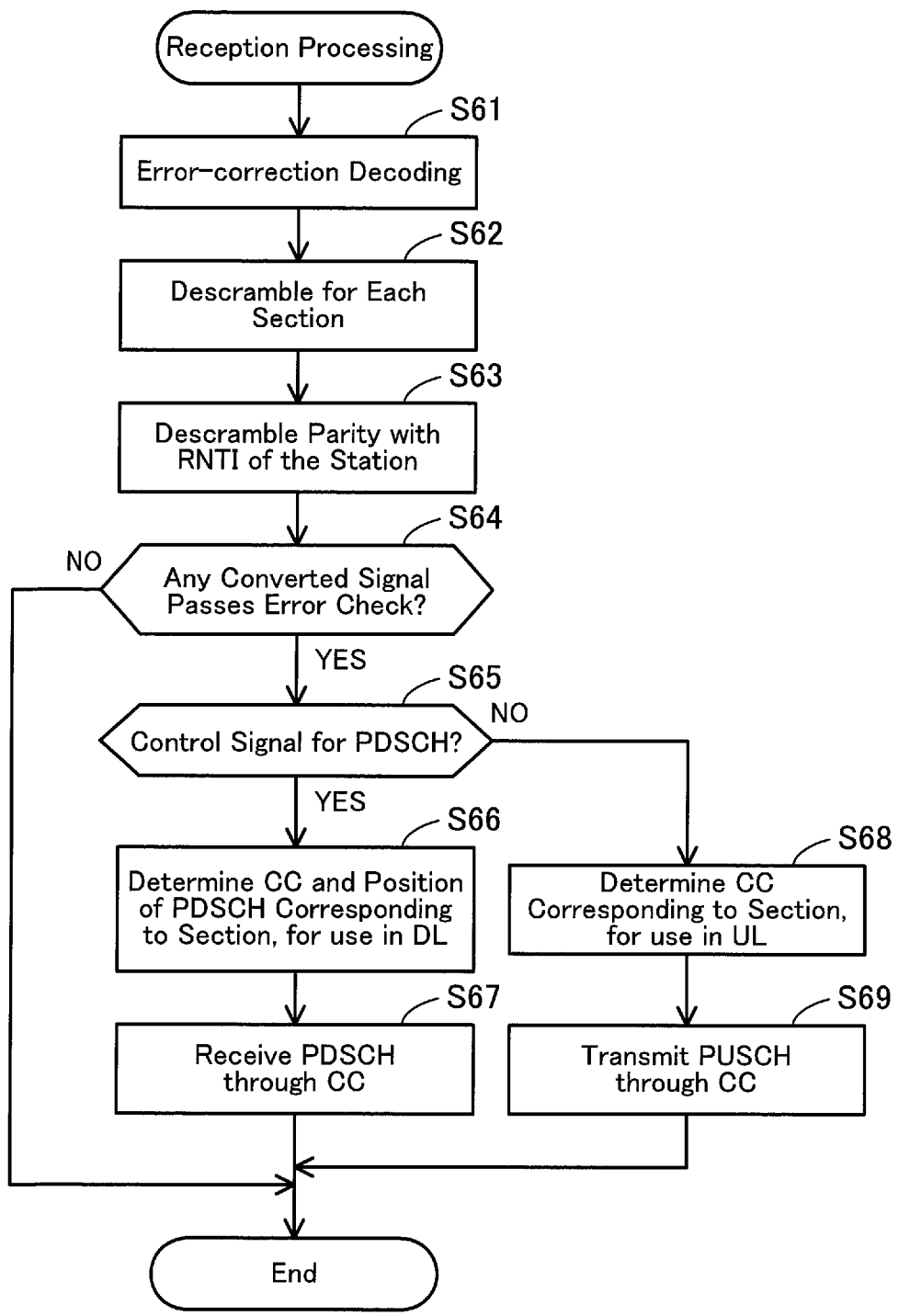
FIG. 19 is a flow diagram indicating reception processing in the fourth embodiment.

FIG. 19 is a flow diagram indicating reception processing in the fourth embodiment. The reception processing of FIG. 19 is continuously performed by the mobile station 200 according to the fourth embodiment. Similar processing is also performed by the mobile station 200a. The processing of FIG. 19 is explained below step by step.

<Step S61> The control-signal extraction unit 230 extracts one or more candidates for a PDCCH signal addressed to the mobile station 200. The error-correction decoding unit 241 performs error-correction decoding of the one or more candidates for the PDCCH signal, and outputs each of the one or more error-correction decoded candidates for the PDCCH signal as a control signal.

<Step S62> The descrambling-position control unit 242 selects one or more candidates for the section to be descrambled. The descrambling unit 244 makes one or more attempts to descramble the control signal with the one or more candidates for the section to be descrambled. In each of the one or more attempts, a descrambling operation is performed on a different one of the one or more candidates for the section to be descrambled in the control signal.

<Step S63> The error checking unit 245 descrambles the parity bits contained in the control signal, by using the scrambling sequence corresponding to the RNTI of the mobile station 200.

<Step S64> The error checking unit 245 performs error checking of the control signal as the result of each of the one or more attempts made in step S62 with the parity bits descrambled in step S63. Then, the error checking unit 245 determines whether or not the result of one of the one or more attempts made in step S62 passes the error check. When yes is determined in step S64, the operation goes to step S65. When no is determined in step S64, the processing of FIG. 19 is completed.

<Step S65> The error checking unit 245 determines whether or not the control information contained in the control signal which passes the error check is to be applied to the PDSCH, where the bit sequence of the information bits in the control signal is regarded as the control information. In the case where the control information contained in the control signal which passes the error check is control information for the PDSCH, the operation goes to step S66. In the case where the control information contained in the control signal which passes the error check is control information for the PUSCH, the operation goes to step S68.

<Step S66> The error checking unit 245 determines the descrambled section in the control signal which passes the error check. Then, the error checking unit 245 determines the component carrier and (the position of) the leading symbol of the PDSCH on the basis of the descrambled section. Correspondences between a plurality of scrambled sections in the control signal and a plurality of combinations of a plurality of component carriers and a plurality of positions of the border between the region for the PDCCH and the region for the PDSCH in the determined DL subframe are recorded in advance in the descrambling-position control unit 242.

<Step S67> The PDSCH extraction unit 250 extracts a PDSCH signal from a reception signal received through the component carrier determined in step S66, on the basis of the control information for the PDSCH and the determined (position of the) leading symbol of the PDSCH. The PDSCH decoding unit 260 decodes the extracted PDSCH signal, and extracts user data addressed to the mobile station 200.

<Step S68> The error checking unit 245 determines the descrambled section in the control signal which passes the error check. Then, the error checking unit 245 determines the component carrier on the basis of the descrambled section. Correspondences between component carriers and descrambled sections in the control signal are also recorded in advance in the descrambling-position control unit 242.

<Step S69> The PUSCH generation unit 270 generates a PUSCH signal which is to be transmitted through the component carrier determined in step S68, on the basis of the control information for the PUSCH. The wireless transmitter unit 280 converts the PUSCH signal into a wireless signal, and transmits the wireless signal.

As explained above, the mobile station 200 makes one or more attempts to descramble the control signal with one or more candidates for the scrambled section (i.e., the section to be descrambled) in the received control signal, and estimates the scrambled section on the basis of the result of error checking. In the case where the control signal is to be applied to the PDSCH, the component carrier to which the control signal is to be applied and (the position of) the leading symbol of the PDSCH can be determined on the basis of the scrambled section which is estimated as above. In the case where the control signal is to be applied to the PUSCH, the component carrier to which the control signal is to be applied can be determined on the basis of the scrambled section which is estimated as above.

As mentioned before, the correspondences between the plurality of scrambled sections in the control signal and the plurality of combinations of the plurality of component carriers and the plurality of positions of the border between the region for the PDCCH and the region for the PDSCH in the determined DL subframe are recorded in advance, so that both of the component carrier and (the position of) the border between the region for the PDCCH and the region for the PDSCH in the determined DL subframe can be recognized on the basis of the scrambled section. For example, fifteen sections to be scrambled are set for discriminating the fifteen combinations of five component carriers and three positions of the leading symbol.

Figure 20:
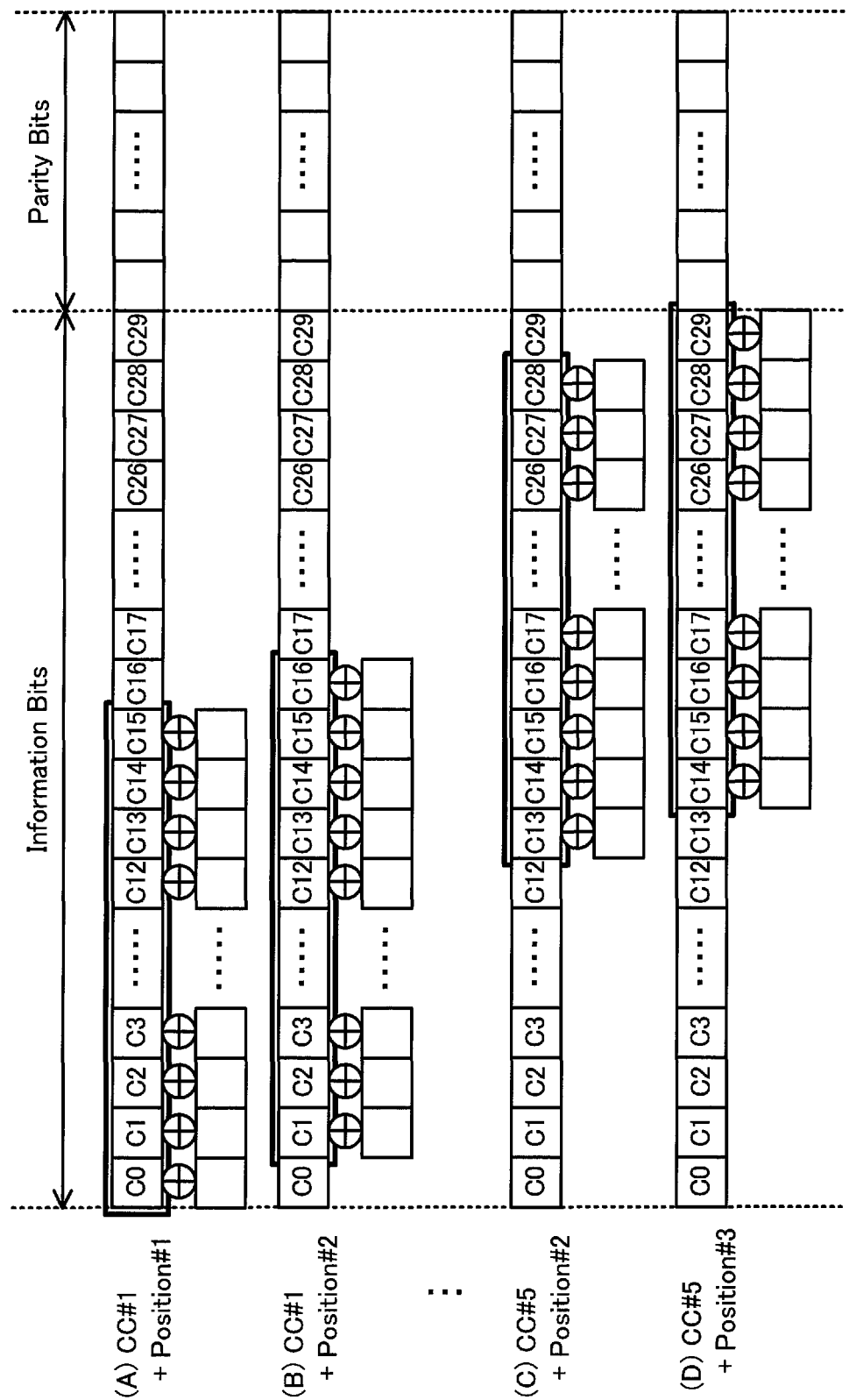
FIG. 20 illustrates an example of a set of sections to be scrambled in control signals in the fourth embodiment.

FIG. 20 illustrates an example of a set of sections to be scrambled in control signals in the fourth embodiment. As in the examples illustrated in FIGS. 12 to 14, it is assumed that the control signal after the parity-bit addition contains 30 information bits and 16 parity bits, and 16 bits in the 30 information bits are scrambled. In the example of FIG. 20, the fifteen sections to be scrambled are provided in correspondence with the fifteen combinations of the five component carriers CC#1 to CC#5 and the three positions #1 to #3 of the leading symbol, where each of the fifteen sections to be scrambled are shifted from the next one of the fifteen sections by one bit.

Specifically, the section of the leading 16 bits C0 to C15 is scrambled in order to indicate the combination of the component carrier CC#1 and the position #1 of the leading symbol of the PDSCH, the section of the 16 bits C1 to C16 is scrambled in order to indicate the combination of the component carrier CC#1 and the position #2 of the leading symbol, . . . the section of the leading 16 bits C13 to C28 is scrambled in order to indicate the combination of the component carrier CC#5 and the position #2 of the leading symbol, and the section of the 16 bits C14 to C29 is scrambled in order to indicate the combination of the component carrier CC#5 and the position #3 of the leading symbol.

In the mobile communication system according to the fourth embodiment, the mobile stations 200 and 200a can be efficiently informed by the wireless base station 100 of both of the component carrier and (the position of) the leading symbol of the PDSCH to which the control signal is to be applied.

5. Fifth Embodiment

The fifth embodiment is explained in detail below. The following explanations on the fifth embodiment are focused on the differences from the second embodiment, and explanations on arrangements and operations similar to the second embodiment are not indicated below. According to the second embodiment, the component carrier is discriminated on the basis of the scrambled section. On the other hand, the fifth embodiment is characterized in that the component carrier is discriminated on the basis of the cyclic shift value of the scrambling sequence in use.

The wireless base station according to the fifth embodiment can be realized by a construction similar to the wireless base station 100 according to the second embodiment illustrated in FIGS. 6 and 7 except that the PDCCH generation unit 160 in the second embodiment is replaced with a PDCCH generation unit 160a, which is explained below. In addition, the mobile station in the fifth embodiment can be realized by a construction similar to the mobile station 200 according to the second embodiment illustrated in FIG. 8 except that the control-signal decoding unit 240 in the second embodiment is replaced with a control-signal decoding unit 240a, which is explained below.

Figure 21:
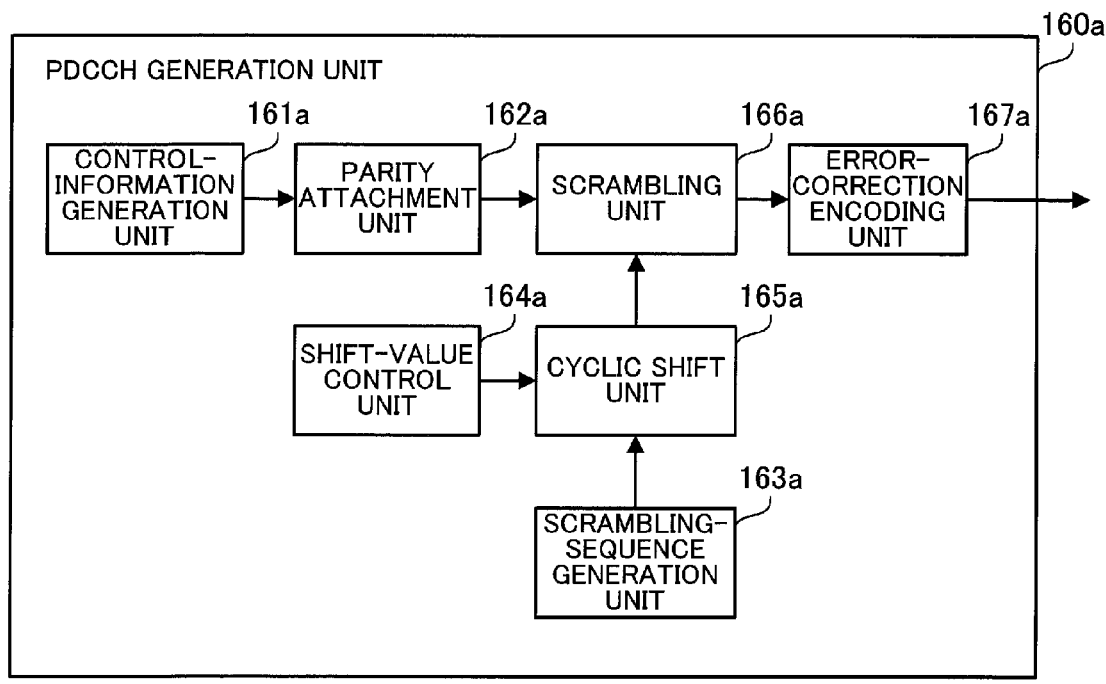
FIG. 21 illustrates details of a PDCCH generation unit in a fifth embodiment.

FIG. 21 illustrates details of the PDCCH generation unit 160a in the fifth embodiment. The PDCCH generation unit 160a includes a control-information generation unit 161a, a parity attachment unit 162a, a scrambling-sequence generation unit 163a, a shift-value control unit 164a, a cyclic shift unit 165a, a scrambling unit 166a, and an error-correction encoding unit 167a.

The control-information generation unit 161a generates control information for the PDSCH and the PUSCH, and outputs a bit sequence indicating the above control information to the parity attachment unit 162a.

The parity attachment unit 162a generates parity bits for error checking, on the basis of the bit sequence (sequence of information bits) acquired from the control-information generation unit 161a. Then, the parity attachment unit 162a generates a control signal by attaching the parity bits to the information bits, and outputs the control signal to the scrambling unit 166a. At this time, the parity attachment unit 162a scrambles the parity bits by using a scrambling sequence corresponding to an RNTI of the mobile station as the destination of the control signal.

The scrambling-sequence generation unit 163a generates a scrambling sequence, and outputs the generated scrambling sequence to the cyclic shift unit 165a. Various bit sequences such as a fixed bit sequence, a random bit sequence, or a pseudorandom bit sequence may be generated by the scrambling-sequence generation unit 163a. However, it is preferable to use a scrambling sequence which does not become identical to the initial bit sequence during a cycle of the cyclic shift.

The shift-value control unit 164a controls a shift value in the cyclic shift to be performed on the scrambling sequence. In the shift-value control unit 164a, correspondences between five component carriers CC#1 to CC#5 and five different shift values are recorded in advance. The five shift values may include "0", which means no cyclic shift. The shift-value control unit 164a informs the cyclic shift unit 165a of the shift value corresponding to the component carrier to which the control signal is to be applied.

For example, the shift-value control unit 164a informs the cyclic shift unit 165a of the shift value corresponding to the component carrier CC#1 in the case where the control signal is to be applied to the PUSCH in the component carrier CC#1, and of the shift value corresponding to the component carrier CC#2 in the case where the control signal is to be applied to the PDSCH in the component carrier CC#2.

The cyclic shift unit 165a performs a cyclic shift of the scrambling sequence acquired from the scrambling-sequence generation unit 163a, by the shift value of which the cyclic shift unit 165a is informed by the shift-value control unit 164a. The shift direction may be arbitrarily determined in advance. The cyclic shift unit 165a outputs to the scrambling unit 166a the cyclically-shifted scrambling sequence.

The scrambling unit 166a scrambles the control signal acquired from the parity attachment unit 162a, by using the (cyclically-shifted) scrambling sequence acquired from the cyclic shift unit 165a. Then, the scrambling unit 166a outputs the scrambled control signal to the error-correction encoding unit 167a. The scrambling performed by the scrambling unit 166a is different from the scrambling performed by the parity attachment unit 162a.

The error-correction encoding unit 167a performs error-correction encoding of the scrambled control signal acquired from the scrambling unit 166a so as to generate a PDCCH signal, and outputs the generated PDCCH signal to the wireless transmitter unit 170.

Figure 22:
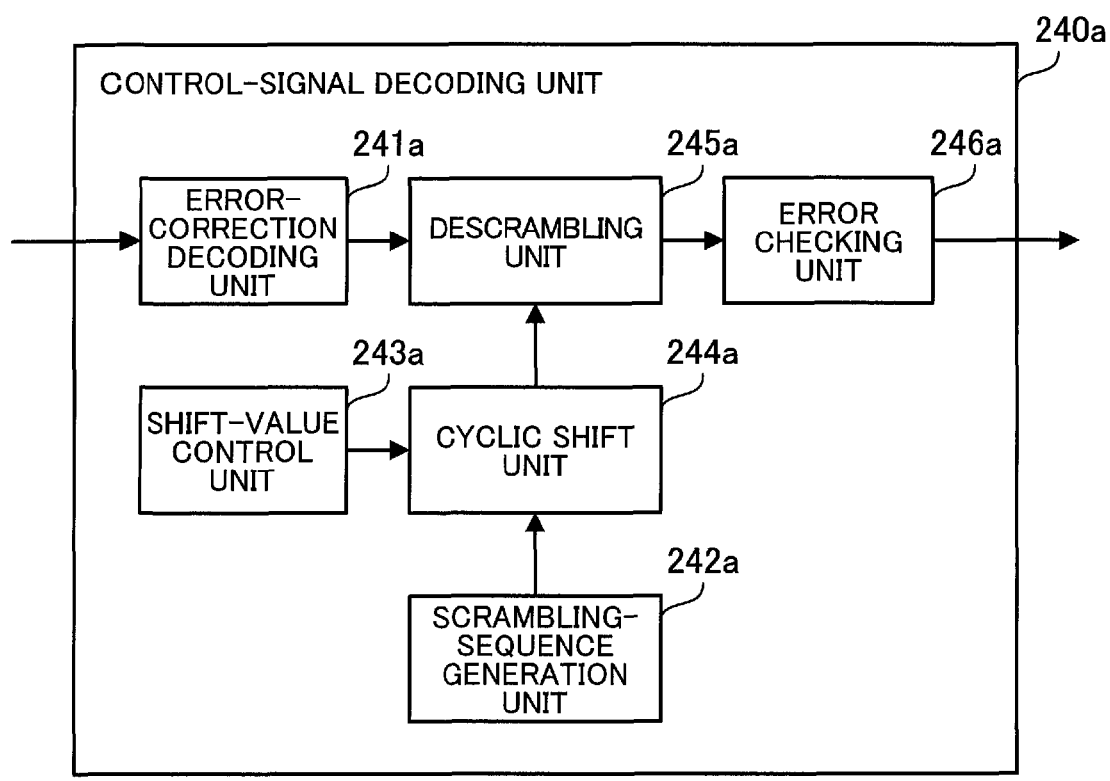
FIG. 22 illustrates details of a control-signal decoding unit in the fifth embodiment.

FIG. 22 illustrates details of the control-signal decoding unit 240a in the fifth embodiment. The control-signal decoding unit 240a includes an error-correction decoding unit 241a, a scrambling-sequence generation unit 242a, a shift-value control unit 243a, a cyclic shift unit 244a, a descrambling unit 245a, and an error checking unit 246a.

The error-correction decoding unit 241a performs error-correction decoding of each PDCCH-signal candidate acquired from the control-signal extraction unit 230. As mentioned before, a predetermined encoding method is used in the encoding in the PDCCH. Then, the error-correction decoding unit 241a outputs the decoded control signal to the descrambling unit 245a.

The scrambling-sequence generation unit 242a generates a scrambling sequence identical to the scrambling sequence generated by the scrambling-sequence generation unit 163a in the wireless base station 100, and outputs the generated scrambling sequence to the cyclic shift unit 244a.

The shift-value control unit 243a controls the shift value in a cyclic shift performed by the cyclic shift unit 244a on the scrambling sequence generated by the scrambling-sequence generation unit 242a. In the shift-value control unit 243a, the correspondences between the five component carriers CC#1 to CC#5 and the five different shift values are recorded in advance. The correspondences recorded in the shift-value control unit 243a are identical to the correspondences recorded in the shift-value control unit 164a in the wireless base station 100. The shift-value control unit 243a informs the cyclic shift unit 244a of one or more candidates for the shift value corresponding to one or more candidates for the component carrier in which the PDSCH or the PUSCH may be possibly set.

The cyclic shift unit 244a performs a cyclic shift of the scrambling sequence acquired from the scrambling-sequence generation unit 242a, by the shift value of which the cyclic shift unit 244a is informed by the shift-value control unit 243a. The shift direction in the cyclic shift performed by the cyclic shift unit 244a is identical to the shift direction in the cyclic shift performed by the cyclic shift unit 165a in the wireless base station 100.

The descrambling unit 245a makes one or more attempts to descramble the control signal acquired from the error-correction decoding unit 241a, with the one or more candidates for the shift value corresponding to one or more candidates for the component carrier. In each of the one or more attempts, a descrambling operation is performed on the control signal by using a different one of the one or more scrambling sequences corresponding to the one or more candidates for the shift value and being acquired from the cyclic shift unit 244a. The descrambling operation performed by the descrambling unit 245a becomes the inversion of the scrambling performed by the scrambling unit 165a in the wireless base station 100 when the descrambling operation is performed by the descrambling unit 245a by using the same scrambling sequence as the scrambling sequence generated by the cyclic shift unit 165a. Then, the descrambling unit 245a outputs the control signal as the result of each of the one or more attempts to the error checking unit 246a.

The error checking unit 246a performs error checking of the control signal as the result of each of the one or more attempts, which is acquired from the descrambling unit 245a. In order to perform the error checking, the error checking unit 246a descrambles the parity bits contained in the control signal, by using the scrambling sequence corresponding to the RNTI of the mobile station 200. Then, the error checking unit 246a determines whether or not the information bits in the control signal as the result of each of the one or more attempts contains an error, on the basis of the information bits contained in the control signal and the descrambled parity bits.

In the case where the shift-value control unit 243a designates a plurality of different candidates for the shift value, the cyclic shift unit 244a outputs a plurality of scrambling sequences respectively corresponding to different shift values. Then, the descrambling unit 245a makes a plurality of attempts to descramble the control signal with the plurality of scrambling sequences acquired from the cyclic shift unit 244a. In each of the attempts, a descrambling operation is performed on the control signal by using a different one of the plurality of scrambling sequences. Then, the error checking unit 246a performs the error checking of the result of each of the plurality of attempts. When one of the plurality of attempts using one of the plurality of scrambling sequences passes the error check, the error checking unit 246a determines the shift value corresponding to the one of the plurality of scrambling sequences, and determines the component carrier corresponding to the determined shift value.

The descrambling unit 245a may make the plurality of attempts by use of the plurality of scrambling sequences in parallel, and the error checking unit 246a may perform the error checking of the results of the plurality of attempts in parallel. Alternatively, the descrambling unit 245a may make one or more of the plurality of attempts by using one or more of the plurality of scrambling sequences in succession, and the error checking may be performed after each attempt, until one of the plurality of attempts passes the error check.

Figure 23:
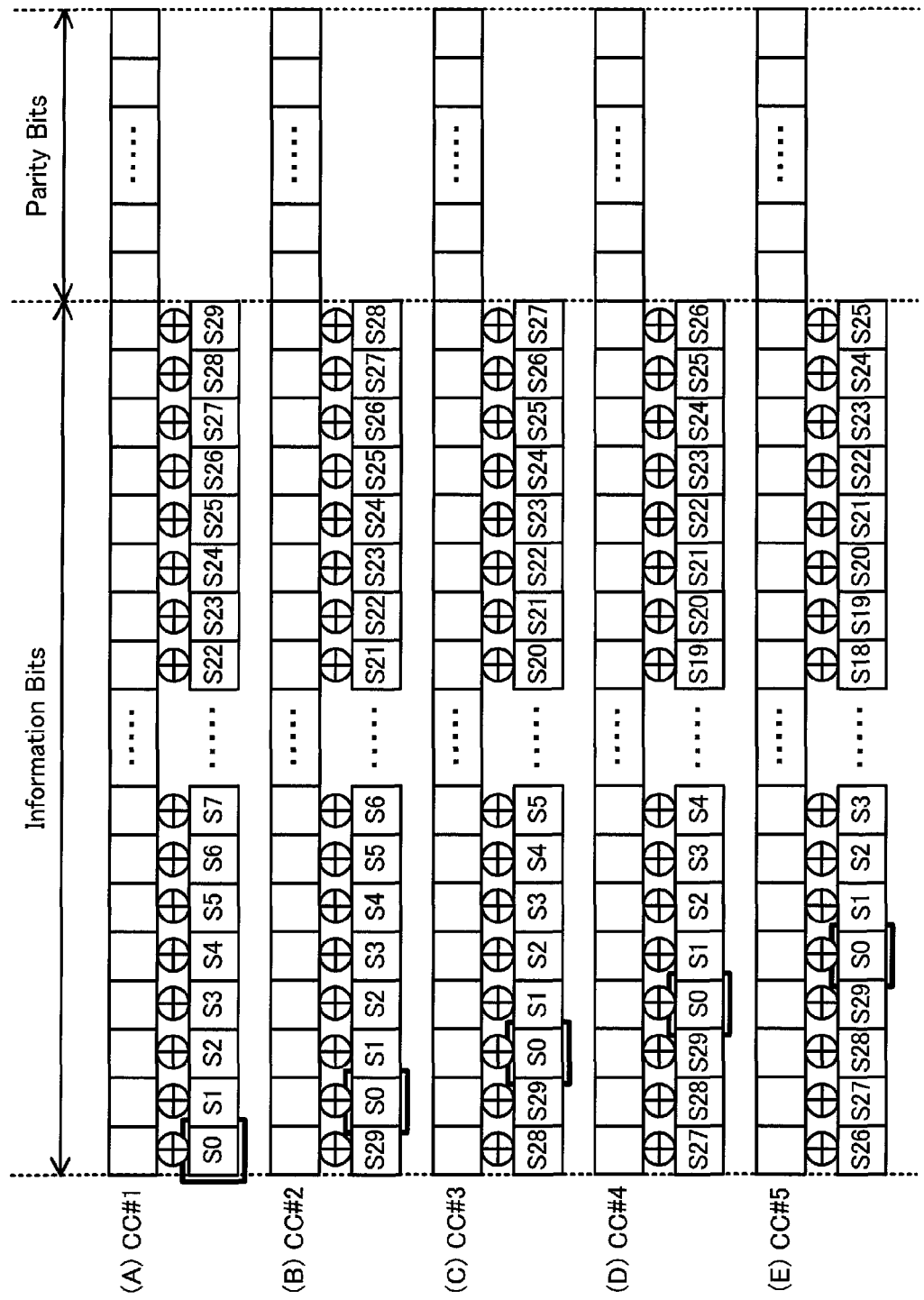
FIG. 23 illustrates an example of a set of scrambling sequences and sections to be scrambled in control signals in the fifth embodiment.

FIG. 23 illustrates an example of a set of scrambling sequences and sections to be scrambled in control signals in the fifth embodiment. In the example of FIG. 23, it is assumed that the control signal after the parity-bit addition contains 30 information bits and 16 parity bits, and all the 30 information bits are scrambled. In the example of FIG. 23, the 30-bit scrambling sequences respectively corresponding to the component carriers each capable of accommodating a channel (PDSCH or PUSCH) to which the control signal is to be applied are differentiated from each other in such a manner that each of the scrambling sequences are shifted rearward from the preceding one of the scrambling sequences by one bit.

Specifically, the original scrambling sequence S0, S1, . . . , S29, which is not cyclically shifted, is used in the case where the control signal is to be applied to the component carrier CC#1, and the scrambling sequence S29, S0, S1, . . . , S28, which are one bit shifted rearward (rightward in FIG. 23) from the original scrambling sequence, is used in the case where the control signal is to be applied to the component carrier CC#2. Further, the scrambling sequence S28, S29, S0, . . . , S27, which are two bits shifted rearward from the original scrambling sequence, is used in the case where the control signal is to be applied to the component carrier CC#3, the scrambling sequence S27, S28, S29, S0, . . . , S26, which are three bits shifted rearward from the original scrambling sequence, is used in the case where the control signal is to be applied to the component carrier CC#4, and the scrambling sequence S26, S27, S28, S29, S0, . . . , S25, which are four bits shifted rearward from the original scrambling sequence, is used in the case where the control signal is to be applied to the component carrier CC#5.

Alternatively, the minimum unit of the cyclic shift may be two or more bits, instead of one bit. In this case, it is preferable to satisfy the condition that the minimum unit of the cyclic shift multiplied by the number of the component carriers minus one is smaller than the length of the scrambling sequence.

Further, the scrambling may be performed over a span extending across the border between the information bits and the parity bits. Alternatively, the scrambling may be performed on only a section of (part of) the information bits. In the latter case, the method of discriminating the component carriers on the basis of the scrambling sequences according to the fifth embodiment may be combined with the method of discriminating the component carriers on the basis of the scrambled sections according to the second embodiment. In this case, the wireless base station 100 can transmit a greater amount of information to the mobile stations 200 and 200a. For example, the combination of the methods according to the second and fifth embodiments enables discrimination of a greater number of component carriers, and facilitates transmission of both of the information on the component carrier and the information on the position of the leading symbol of the PDSCH.

Figure 24:
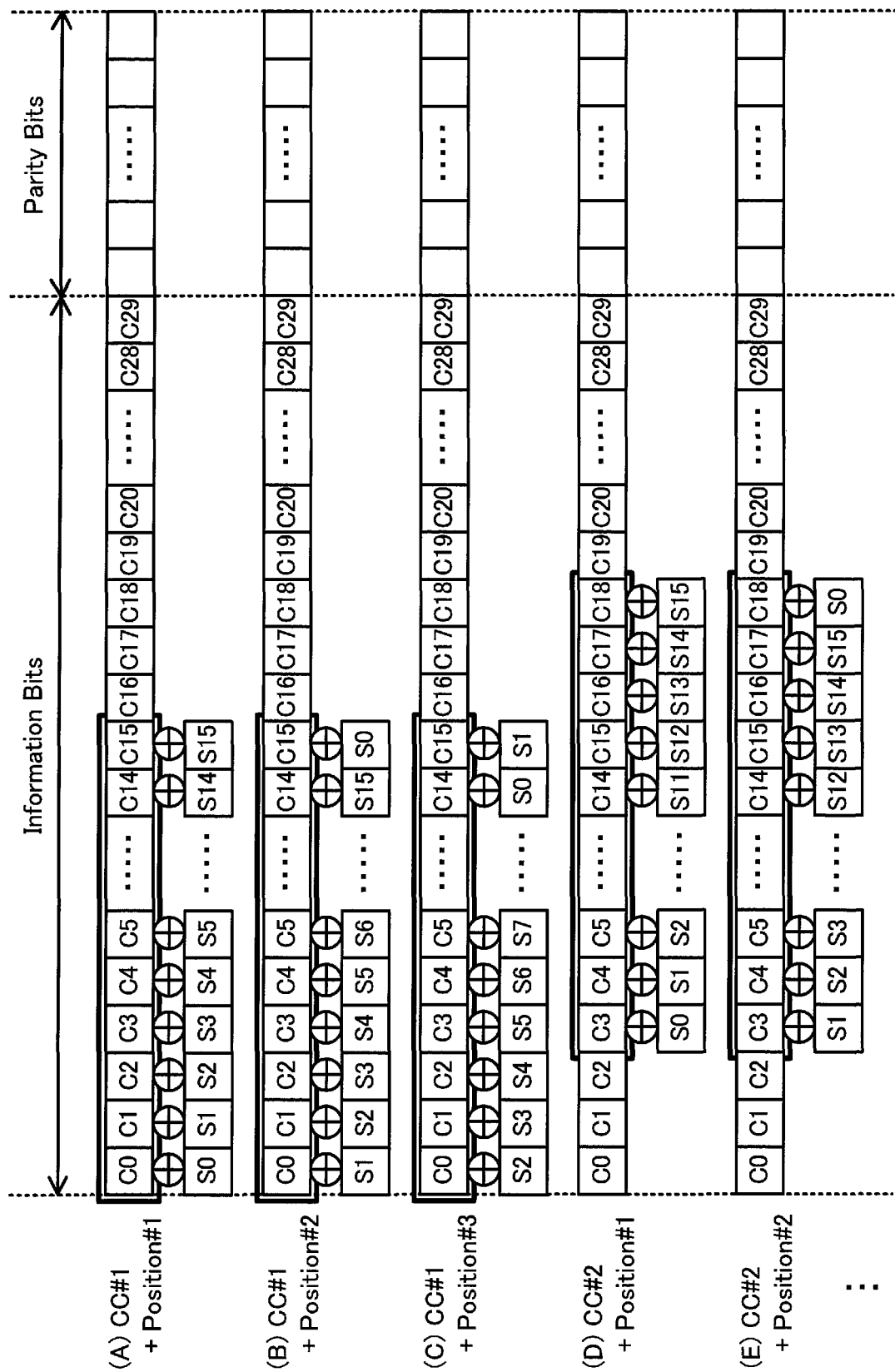
FIG. 24 illustrates a set of scrambling sequences and sections to be scrambled in control signals in a variation of the fifth embodiment.

FIG. 24 illustrates a set of scrambling sequences and sections to be scrambled in control signals in a variation of the fifth embodiment. As in the examples of FIGS. 12 to 14, 16 bits in the information bits are scrambled. In the example of FIG. 24, five component carriers CC#1 to CC#5 are discriminated on the basis of the scrambled section, and three positions #1 to #3 of the leading symbol of the PDSCH are discriminated on the basis of the shift value in the scrambling sequence.

Specifically, in order to indicate the combination of the component carrier CC#1 and the position #1 of the leading symbol, the section of the leading 16 bits C0 to C15 is scrambled with the scrambling sequence which is not cyclically shifted. In order to indicate the combination of the component carrier CC#1 and the position #2 of the leading symbol, the section of the leading 16 bits C0 to C15 is scrambled with the scrambling sequence which is cyclically shifted by one bit. In order to indicate the combination of the component carrier CC#1 and the position #3 of the leading symbol, the section of the leading 16 bits C0 to C15 is scrambled with the scrambling sequence which is cyclically shifted by two bits. In order to indicate the combination of the component carrier CC#2 and the position #1 of the leading symbol, the section of the 16 bits C1 to C16, which are three bits shifted from the leading 16 bits C0 to C15, is scrambled with the scrambling sequence which is not cyclically shifted. In order to indicate the combination of the component carrier CC#2 and the position #2 of the leading symbol, the section of the 16 bits C1 to C16 is scrambled with the scrambling sequence which is cyclically shifted by one bit. Similarly, information on the remaining combinations of the component carriers and the positions of the leading symbol can be transmitted by the combinations of the scrambled section and the shift value. That is, information on the fifteen combinations of the component carriers and the positions of the leading symbol can be transmitted by the fifteen combinations of the scrambled sections and the shift values.

The mobile communication system according to the fifth embodiment as explained above has advantages similar to the second embodiment. In addition, according to the fifth embodiment, the scrambled section can be easily lengthened, so that the possibility of misdetection by the mobile stations 200 and 200a can be suppressed. Further, the method according to the fifth embodiment can be used for discrimination of the position of the leading symbol of the PDSCH as in the third embodiment.

6. Sixth Embodiment

The sixth embodiment is explained in detail below. The following explanations on the sixth embodiment are focused on the differences from the second embodiment, and explanations on arrangements and operations similar to the second embodiment are not indicated below. The sixth embodiment is characterized in that the component carrier is discriminated on the basis of the generated scrambling sequence.

The wireless base station according to the sixth embodiment can be realized by a construction similar to the wireless base station 100 according to the second embodiment illustrated in FIG. 6 except that the PDCCH generation unit 160 in the second embodiment is replaced with a PDCCH generation unit 160b, which is explained below. In addition, the mobile station in the sixth embodiment can be realized by a construction similar to the mobile station 200 according to the second embodiment illustrated in FIG. 8 except that the control-signal decoding unit 240 in the second embodiment is replaced with a control-signal decoding unit 240b, which is explained below.

Figure 25:
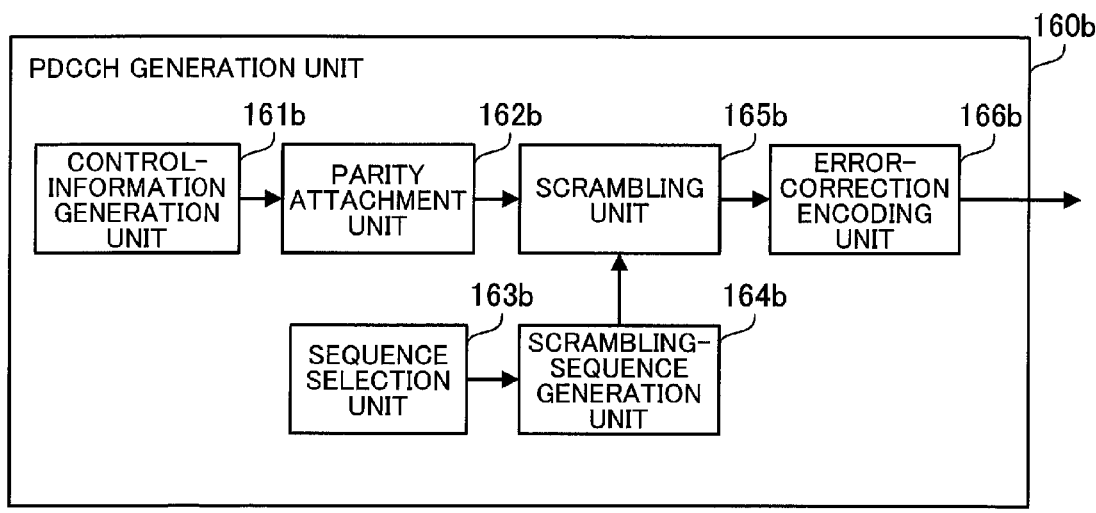
FIG. 25 illustrates details of a PDCCH generation unit in a sixth embodiment.

FIG. 25 illustrates details of the PDCCH generation unit in the sixth embodiment. The PDCCH generation unit 160b includes a control-information generation unit 161b, a parity attachment unit 162b, a sequence selection unit 163b, a scrambling-sequence generation unit 164b, a scrambling unit 165b, and an error-correction encoding unit 166b.

The control-information generation unit 161b generates control information for the PDSCH and the PUSCH, and outputs a bit sequence indicating the above control information to the parity attachment unit 162b.

The parity attachment unit 162b generates parity bits for error checking, on the basis of the bit sequence (sequence of information bits) acquired from the control-information generation unit 161b. Then, the parity attachment unit 162b generates a control signal by attaching the parity bits to the information bits, and outputs the control signal to the scrambling unit 165b. At this time, the parity attachment unit 162b scrambles the parity bits by using a scrambling sequence corresponding to an RNTI of the mobile station as the destination of each control signal.

The sequence selection unit 163b controls switching of the scrambling sequence. Correspondences between a predetermined plurality (e.g., five) of component carriers CC#1 to CC#5 and a predetermined plurality (e.g., five) of scrambling sequences are recorded in advance. The sequence selection unit 163b selects one of the scrambling sequences corresponding to a component carrier to which the control signal is to be applied, and informs the scrambling-sequence generation unit 164b of the selected scrambling sequence.

For example, in the case where the control signal is to be applied to the PUSCH accommodated by the component carrier CC#1, the sequence selection unit 163b outputs to the scrambling-sequence generation unit 164b information which makes the scrambling-sequence generation unit 164b generate a scrambling sequence corresponding to the component carrier CC#1. In the case where the control signal is to be applied to the PDSCH accommodated by the component carrier CC#2, the sequence selection unit 163b outputs to the scrambling-sequence generation unit 164b information which makes the scrambling-sequence generation unit 164b generate a scrambling sequence corresponding to the component carrier CC#2.

The scrambling-sequence generation unit 164b generates the scrambling sequence selected by the sequence selection unit 163b, and outputs the generated scrambling sequence to the scrambling unit 165b.

The following bit sequences are examples of the scrambling sequence.

(a) A bit sequence representing a number identifying a component carrier to which the control signal is to be applied, or one or more repetitions of the above bit sequence having a length corresponding to the scrambled section (b) A pseudorandom bit sequence generated from an initial value, where the initial value is a function of a number identifying a component carrier to which the control signal is to be applied (c) A bit sequence representing the difference between a number identifying a component carrier to which the control signal is to be applied and a number identifying a component carrier with which the control signal is transmitted, or one or more repetitions of the above bit sequence having a length corresponding to the scrambled section (d) A pseudorandom bit sequence generated from an initial value, where the initial value is the difference between a number identifying a component carrier to which the control signal is to be applied and a number identifying a component carrier with which the control signal is transmitted The scrambling unit 165b scrambles the control signal acquired from the parity attachment unit 162b, by using the scrambling sequence acquired from the scrambling-sequence generation unit 164b. Then, the scrambling unit 165b outputs the scrambled control signal to the error-correction encoding unit 166b. The scrambling performed by the scrambling unit 165b is different from the scrambling performed by the parity attachment unit 162b.

The error-correction encoding unit 166b performs error-correction encoding of the scrambled control signal acquired from the scrambling unit 165b so as to generate a PDCCH signal, and outputs the generated PDCCH signal to the wireless transmitter unit 170.

Figure 26:
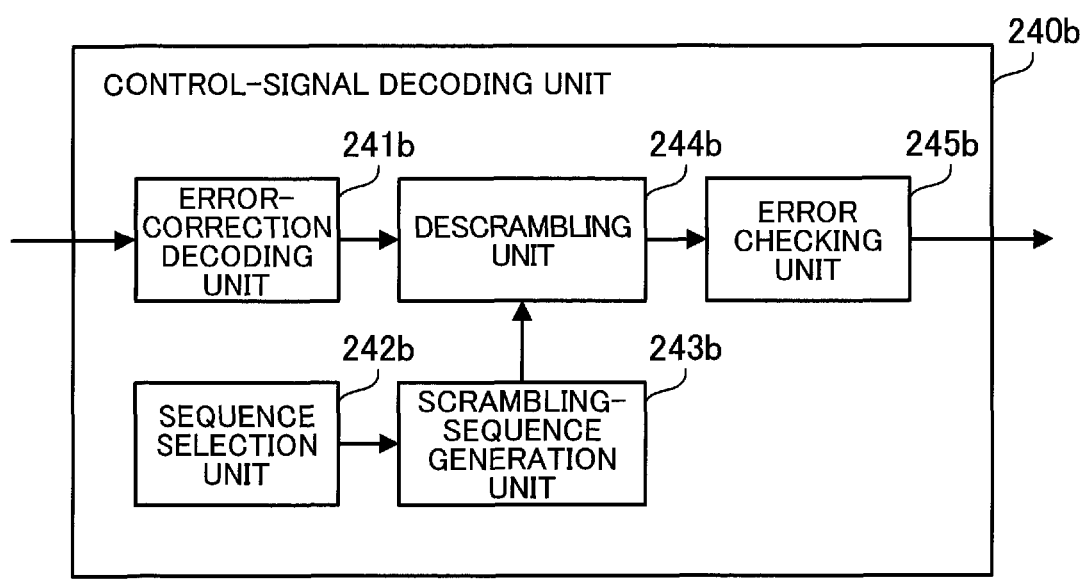
FIG. 26 illustrates details of a control-signal decoding unit in the sixth embodiment.

FIG. 26 illustrates details of the control-signal decoding unit in the sixth embodiment. The control-signal decoding unit 240b includes an error-correction decoding unit 241b, a sequence selection unit 242b, a scrambling-sequence generation unit 243b, a descrambling unit 244b, and an error checking unit 245b.

The error-correction decoding unit 241b performs error-correction decoding of each PDCCH-signal candidate acquired from the control-signal extraction unit 230. Then, the error-correction decoding unit 241b outputs the decoded control signal to the descrambling unit 244b.

The sequence selection unit 242b controls switching of the scrambling sequence. The correspondences between the predetermined plurality (e.g., five) of component carriers CC#1 to CC#5 and the predetermined plurality (e.g., five) of scrambling sequences are recorded in advance in the sequence selection unit 242b. The correspondences recorded in the sequence selection unit 242b are identical to the correspondences recorded in the sequence selection unit 163b in the wireless base station 100. The sequence selection unit 163b selects one or more of the scrambling sequences corresponding to one or more candidates for the component carrier which may possibly accommodate the PDSCH or the PUSCH, as one or more scrambling-sequence candidates, and informs the scrambling-sequence generation unit 243b of the one or more selected scrambling-sequence candidates.

The scrambling-sequence generation unit 243b generates the one or more scrambling sequences selected by the sequence selection unit 242b as the scrambling-sequence candidates, and outputs the one or more generated scrambling sequences to the descrambling unit 244b. The scrambling sequences which can be generated by the scrambling-sequence generation unit 243b are identical to the scrambling sequences which can be generated by the scrambling-sequence generation unit 164b.

The descrambling unit 244b makes one or more attempts to descramble the control signal acquired from the error-correction decoding unit 241b, with the one or more scrambling sequences. In each of the one or more attempts, a descrambling operation is performed on the control signal by using a different one of the one or more scrambling sequences. The descrambling operation performed by the descrambling unit 244b becomes the inversion of the operation performed by the scrambling unit 165b in the wireless base station 100 when the descrambling operation is performed by the descrambling unit 244b by use of the same scrambling sequence as the scrambling sequence used in the scrambling performed by the scrambling unit 165b. Then, the descrambling unit 244b outputs the control signal as the result of each of the one or more attempts to the error checking unit 245b.

The error checking unit 245b performs error checking of the control signal as the result of each of the one or more attempts signal acquired from the descrambling unit 244b. In order to perform the error checking, the error checking unit 245b descrambles the parity bits contained in the control signal as the result of each of the one or more attempts, by using the scrambling sequence corresponding to the RNTI of the mobile station 200. Then, the error checking unit 245b determines whether or not the information bits in the control signal contains an error, on the basis of the information bits contained in the control signal and the descrambled parity bits.

In the case where the sequence selection unit 242b designates a plurality of different scrambling sequences as the one or more scrambling-sequence candidates, the scrambling-sequence generation unit 243b outputs the plurality of scrambling sequences. Then, the descrambling unit 244b makes a plurality of attempts to descramble the control signal by using the plurality of scrambling sequences acquired from the scrambling-sequence generation unit 243b, and the error checking unit 245b performs the error checking of the control signal as the result of each of the plurality of attempts. When the result of one of the plurality of attempts passes the error check, the error checking unit 245b determines the component carrier corresponding to the one of the plurality of scrambling sequences.

The descrambling unit 244b may make the plurality of attempts by use of the plurality of scrambling sequences in parallel, and the error checking unit 245b may perform the error checking of the results of the plurality of attempts in parallel. Alternatively, the descrambling unit 244b may make one or more of the plurality of attempts by using one or more of the plurality of scrambling sequences in succession, and the error checking may be performed after each attempt, until one of the plurality of attempts passes the error check.

Figure 27:
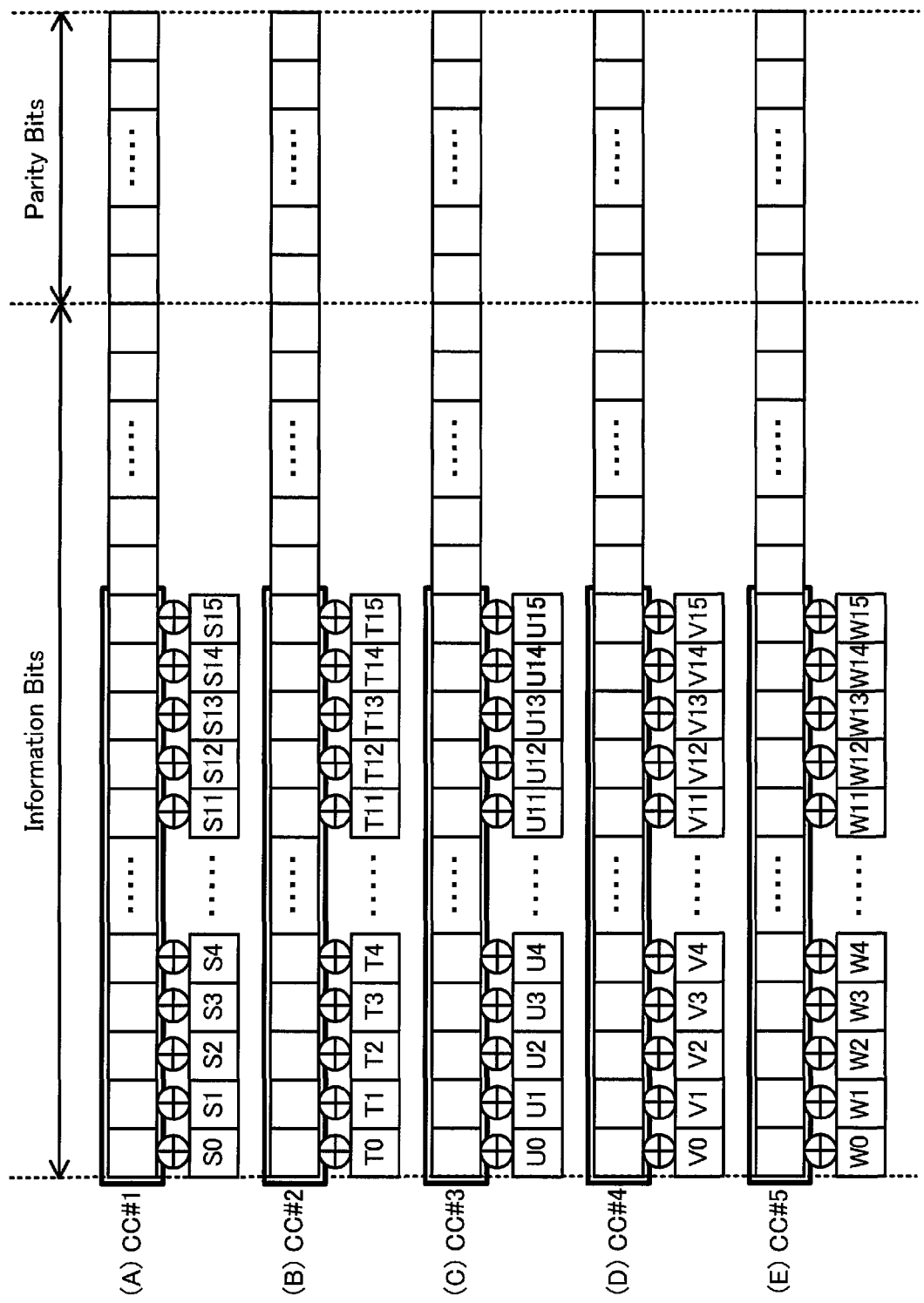
FIG. 27 illustrates a first example of a set of scrambling sequences and sections to be scrambled in control signals in the sixth embodiment.

FIG. 27 illustrates a first example of a set of scrambling sequences and sections to be scrambled in control signals in the sixth embodiment. In the example of FIG. 27, it is assumed that the leading 16 bits in the 30 information bits are scrambled. Therefore, five 16-bit scrambling sequences are prepared in correspondence with five component carriers CC#1 to CC#5. Since only a part of the sequence of the information bits is scrambled, the circuit size of the wireless base station 100 can be suppressed.

Specifically, the leading 16 bits are scrambled by using a first sequence S0 to S15 in the case where the control signal is to be applied to the component carrier CC#1, by using a second sequence T0 to T15 in the case where the control signal is to be applied to the component carrier CC#2, by using a third sequence U0 to U15 in the case where the control signal is to be applied to the component carrier CC#3, by using a fourth sequence V0 to V15 in the case where the control signal is to be applied to the component carrier CC#4, and by using a third sequence W0 to W15 in the case where the control signal is to be applied to the component carrier CC#5.

The scrambled sections may be varied as follows.

(1) The scrambled section need not be the section of the leading bits, and may be an arbitrary section of the information bits.

(2) The lengths of the scrambled sections need not be 16 bits, and the lengths of the scrambled sections corresponding to the component carriers #1 to #5 need not be identical.

(3) The scrambled sections may extend across the border between the information bits and the parity bits.

(4) Each section to be scrambled needs not be continuous.

Figure 28:
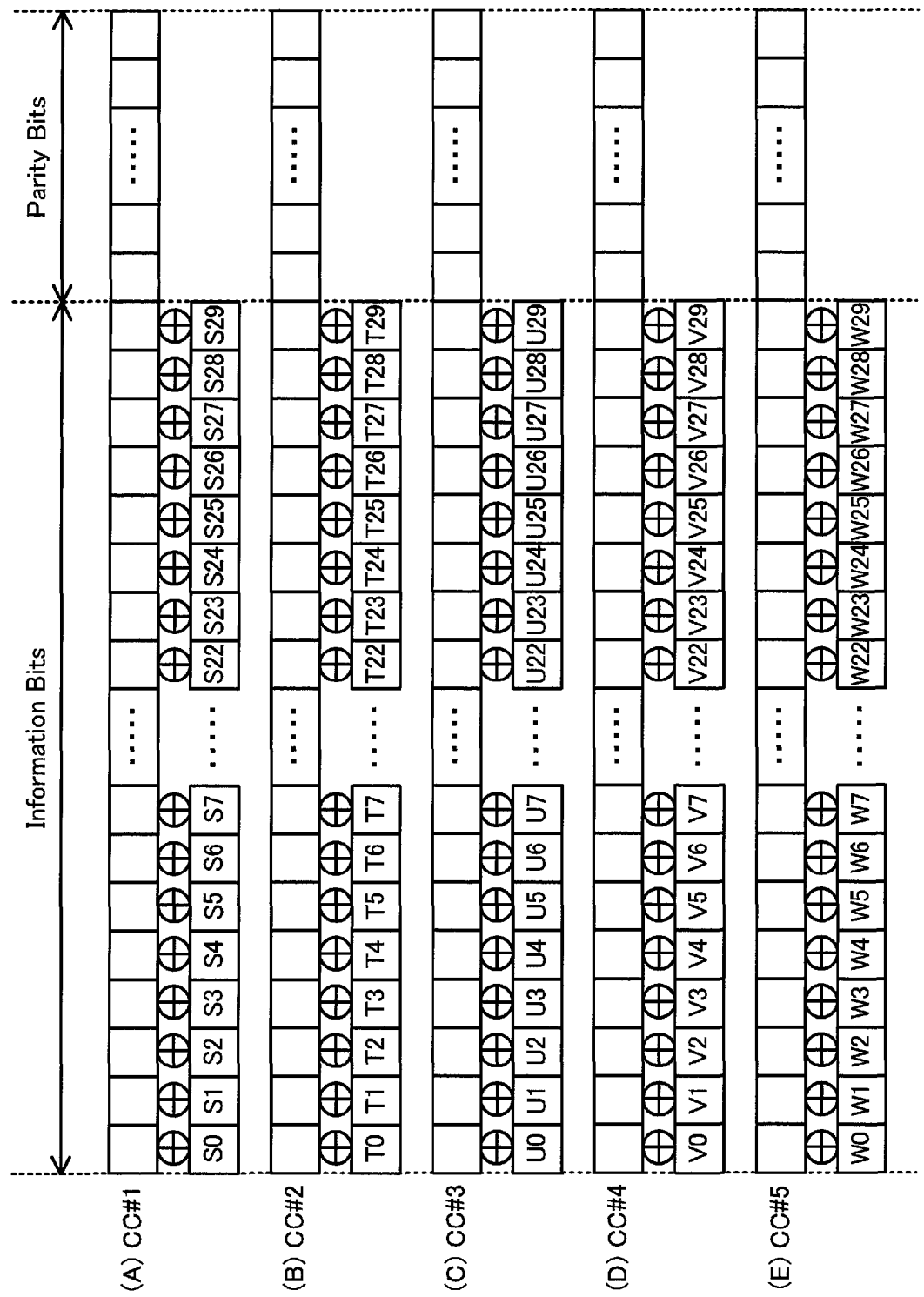
FIG. 28 illustrates a second example of a set of scrambling sequences and sections to be scrambled in control signals in the sixth embodiment.

FIG. 28 illustrates a second example of a set of scrambling sequences and sections to be scrambled in the sixth embodiment. In the example of FIG. 28, it is assumed that all the 30 information bits are scrambled. Therefore, five 30-bit scrambling sequences are prepared in correspondence with five component carriers CC#1 to CC#5. Since the scrambled sections are lengthened, the possibility of misdetection by the mobile stations 200 and 200a can be reduced.

Specifically, all the 30 information bits are scrambled by using a first sequence S0 to S29 in the case where the control signal is to be applied to the component carrier CC#1, by using a second sequence T0 to T29 in the case where the control signal is to be applied to the component carrier CC#2, by using a third sequence U0 to U29 in the case where the control signal is to be applied to the component carrier CC#3, by using a fourth sequence V0 to V29 in the case where the control signal is to be applied to the component carrier CC#4, and by using a third sequence W0 to W29 in the case where the control signal is to be applied to the component carrier CC#5.

In the case where the number identifying a component carrier through which the control signal is transmitted is identical to a number identifying a component carrier accommodating the PDSCH or the PUSCH, it is possible to use a bit sequence of all zeros, instead of the scrambling sequence corresponding to the component carrier accommodating the PDSCH or the PUSCH, i.e., it is possible to waive the scrambling.

In the case where the part of the information bits are scrambled as in the example of FIG. 27, the method according to the sixth embodiment can be combined with the method according to the second embodiment (i.e., the method of discriminating the component carrier on the basis of scrambled section). In this case, the wireless base station 100 can transmit a greater amount of information to the mobile stations 200 and 200a. For example, the combination of the methods according to the second and sixth embodiments facilitates transmission of both of the information on the component carrier and the information on the position of the leading symbol of the PDSCH.

Figure 29:
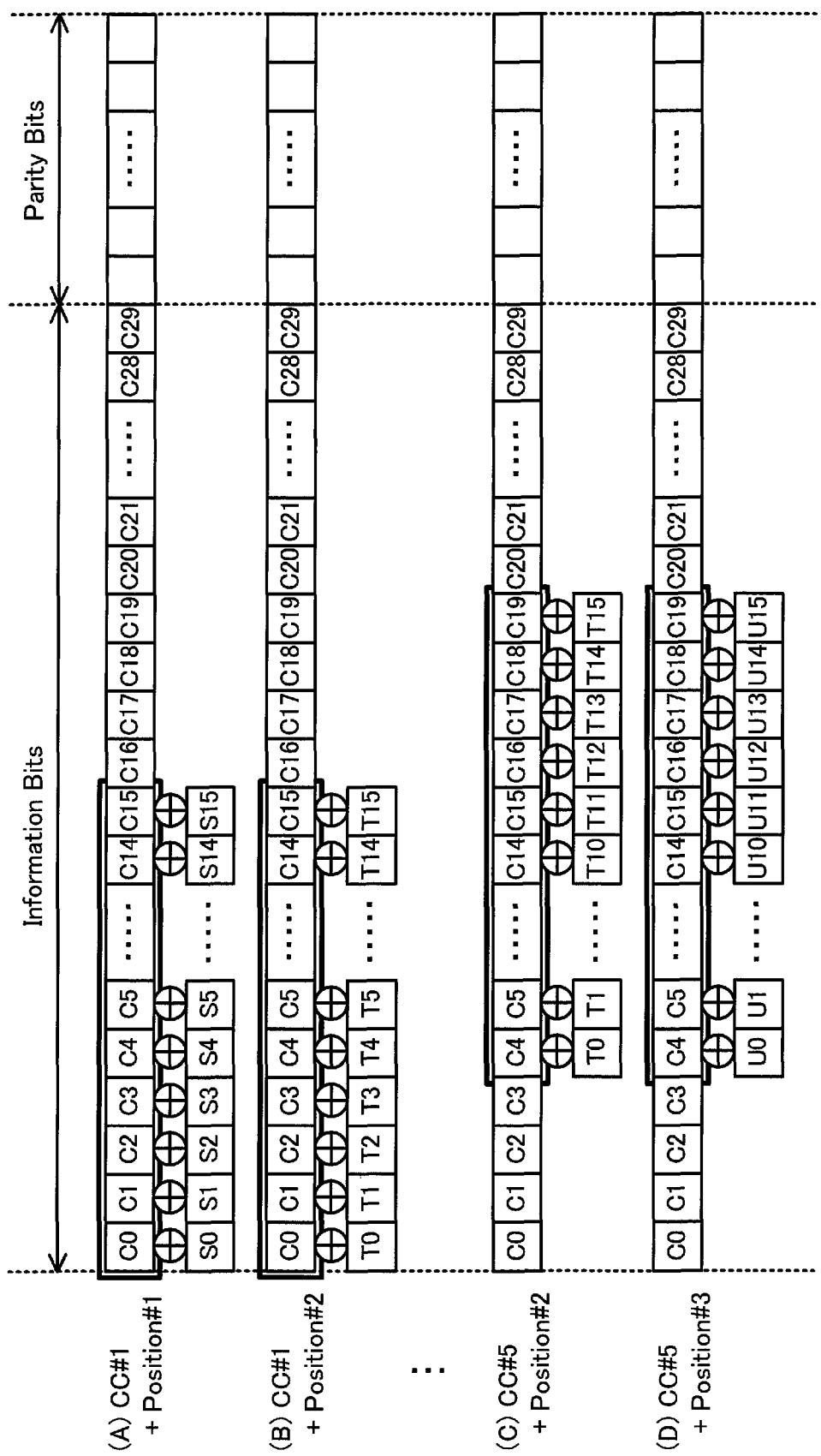
FIG. 29 illustrates a set of scrambling sequences and sections to be scrambled in a variation of the sixth embodiment.

FIG. 29 illustrates a set of scrambling sequences and sections to be scrambled in a variation of the sixth embodiment. In the example of FIG. 29, five component carriers CC#1 to CC#5 are discriminated on the basis of the five different scrambled sections, and the three positions #1 to #3 of the leading symbol of the PDSCH are discriminated on the basis of the three different scrambling sequences. Thus, the fifteen scrambling manners in total are prepared.

Specifically, in order to indicate the combination of the component carrier CC#1 and the position #1 of the leading symbol, the section of the leading 16 bits C0 to C15 is scrambled with a first scrambling sequence S0 to S15. In order to indicate the combination of the component carrier CC#1 and the position #2 of the leading symbol, the section of the leading 16 bits C0 to C15 is scrambled with a second scrambling sequence T0 to T15 . . . In order to indicate the combination of the component carrier CC#5 and the position #2 of the leading symbol, the section of the leading 16 bits C4 to C19, which are four bits shifted rearward from the leading 16 bits C0 to C15, is scrambled with the second scrambling sequence T0 to T15. In order to indicate the combination of the component carrier CC#5 and the position #3 of the leading symbol, the section of the 16 bits C4 to C19 is scrambled with a third scrambling sequence U0 to U15.

The mobile communication system according to the sixth embodiment as explained above has advantages similar to the second embodiment. In addition, the method according to the sixth embodiment can be used for discrimination of the position of the leading symbol of the PDSCH as in the third embodiment.

7. Seventh Embodiment

The seventh embodiment is explained in detail below. The following explanations on the seventh embodiment are focused on the differences from the second embodiment, and explanations on arrangements and operations similar to the second embodiment are not indicated below. The seventh embodiment is characterized in that the component carrier is discriminated on the basis of the cyclic shift value in the control signal per se.

The wireless base station according to the seventh embodiment can be realized by a construction similar to the wireless base station 100 according to the second embodiment illustrated in FIG. 6 except that the PDCCH generation unit 160 in the second embodiment is replaced with a PDCCH generation unit 160c, which is explained below. In addition, the mobile station in the seventh embodiment can be realized by a construction similar to the mobile station 200 according to the second embodiment illustrated in FIG. 8 except that the control-signal decoding unit 240 in the second embodiment is replaced with a control-signal decoding unit 240c, which is explained below.

Figure 30:
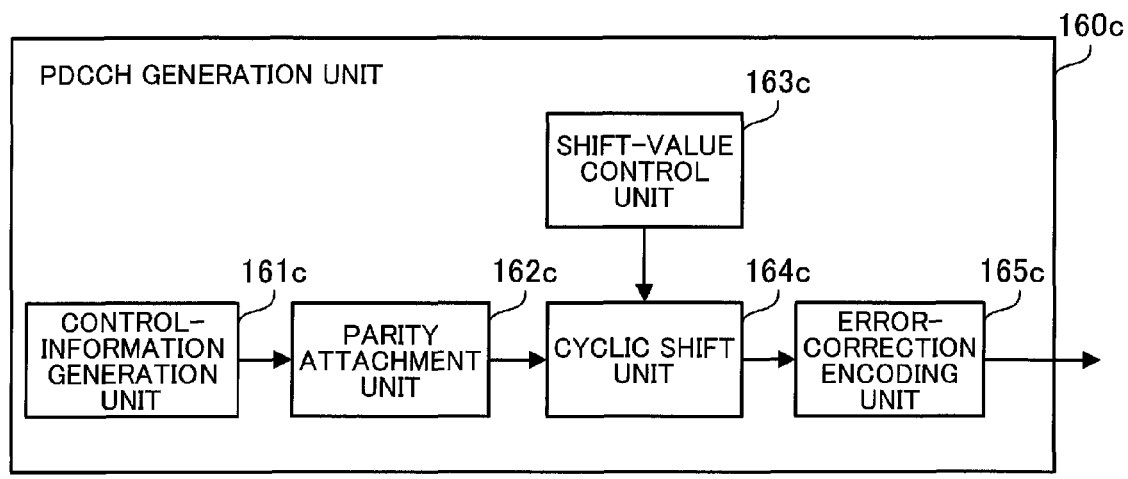
FIG. 30 illustrates details of a PDCCH generation unit in a seventh embodiment.

FIG. 30 illustrates details of the PDCCH generation unit in the seventh embodiment. The PDCCH generation unit 160c includes a control-information generation unit 161c, a parity attachment unit 162c, a shift-value control unit 163c, a cyclic shift unit 164c, and an error-correction encoding unit 165c.

The control-information generation unit 161c generates control information for the PDSCH and the PUSCH, and outputs a bit sequence indicating the above control information to the parity attachment unit 162c.

The parity attachment unit 162c generates parity bits for error checking, on the basis of the bit sequence (sequence of information bits) acquired from the control-information generation unit 161c. Then, the parity attachment unit 162c generates a control signal by attaching the parity bits to the information bits, and outputs the control signal to the cyclic shift unit 164c. At this time, the parity attachment unit 162c scrambles the parity bits by using a scrambling sequence corresponding to an RNTI of the mobile station as the destination of the control signal.

The shift-value control unit 163c controls a shift value in the cyclic shift of the control signal. In the shift-value control unit 163c, correspondences between five component carriers CC#1 to CC#5 and five different shift values are recorded in advance. The five shift values may include "0", which means no cyclic shift. The shift-value control unit 163c informs the cyclic shift unit 164c of the shift value corresponding to the component carrier to which the control signal is to be applied.

For example, the shift value may be set in correspondence with the component carrier to which the control signal is to be applied as follows.

(a) A number identifying the component carrier to which the control signal is to be applied minus one (b) A number identifying the component carrier to which the control signal is to be applied (c) The product of a number identifying the component carrier to which the control signal is to be applied minus one and an integer N (where N≥2)

(d) The product of a number identifying the component carrier to which the control signal is to be applied and an integer N (where N≥2)

(e) The difference between a number identifying the component carrier to which the control signal is to be applied and a number identifying the component carrier with which the control signal is transmitted (f) The product of an integer N (where N≥2) and the difference between a number identifying the component carrier to which the control signal is to be applied and a number identifying the component carrier with which the control signal is transmitted The cyclic shift unit 164c performs a cyclic shift of a part of the control signal in a section of the control signal by a shift value of which the cyclic shift unit 164c is informed by the shift-value control unit 163c, where the control signal is acquired from the parity attachment unit 162c. The shift direction may be arbitrarily determined in advance. Then, the cyclic shift unit 164c outputs to the error-correction encoding unit 165c the cyclically-shifted control signal.

The error-correction encoding unit 165c performs error-correction encoding of the cyclically-shifted control signal acquired from the cyclic shift unit 164c so as to generate a PDCCH signal, and outputs the generated PDCCH signal to the wireless transmitter unit 170.

Figure 31:
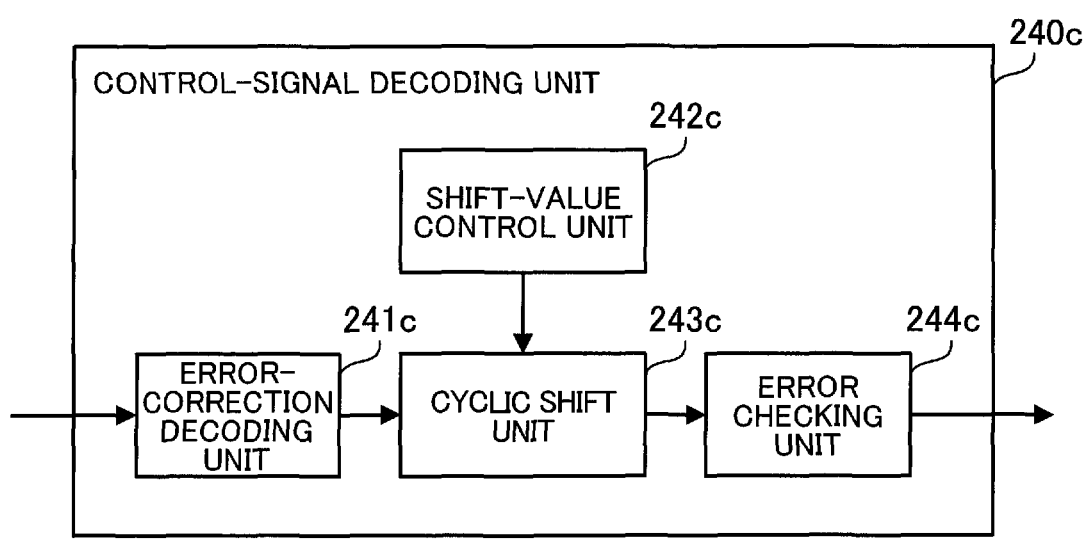
FIG. 31 illustrates details of a control-signal decoding unit in the seventh embodiment.

FIG. 31 illustrates details of the control-signal decoding unit in the seventh embodiment. The control-signal decoding unit 240c includes an error-correction decoding unit 241c, a shift-value control unit 242c, a cyclic shift unit 243c, and an error checking unit 244c.

The error-correction decoding unit 241c performs error-correction decoding of each PDCCH-signal candidate acquired from the control-signal extraction unit 230. Then, the error-correction decoding unit 241c outputs the decoded control signal to the cyclic shift unit 243c.

The shift-value control unit 242c controls the shift value in a cyclic shift performed on the control signal. In the shift-value control unit 242c, the correspondences between the five component carriers CC#1 to CC#5 and the five different shift values are recorded in advance. The correspondences recorded in the shift-value control unit 242c are identical to the correspondences recorded in the shift-value control unit 163c in the wireless base station 100. The shift-value control unit 242c informs the cyclic shift unit 243c of one or more candidates for the shift values corresponding to one or more candidates for the component carrier in which the PDSCH or the PUSCH may be possibly set.

The cyclic shift unit 243c makes one or more attempts to restore the control signal to the bit sequence before the cyclic shift by the cyclic shift unit 164c in the wireless base station 100, by using the one or more candidates for the shift value corresponding to one or more candidates for the component carrier, of which the cyclic shift unit 243c is informed by the shift-value control unit 242c. In each of the one or more attempts, a cyclic shift of the part of the control signal in the section of the control signal by a different one of the one or more candidates for the shift value is performed, where the control signal is acquired from the error-correction decoding unit 241c. The cyclic shift performed by the cyclic shift unit 243c becomes the inversion of the operation performed by the cyclic shift unit 164c when the cyclic shift unit 243c performs a cyclic shift of the part of the control signal in the section of the control signal by the same shift value as in the cyclic shift performed by the cyclic shift unit 164c in the opposite shift direction. That is, the shift direction in the cyclic shift performed by the cyclic shift unit 243c is opposite to the shift direction in the cyclic shift performed by the cyclic shift unit 164c.

The error checking unit 244c performs error checking of the control signal acquired from the cyclic shift unit 243c as the result of each of the one or more attempts. In order to perform the error checking, the error checking unit 244c descrambles the parity bits contained in the control signal, by using the scrambling sequence corresponding to the RNTI of the mobile station 200. Then, the error checking unit 244c determines whether or not the information bits in the control signal as the result of each of the one or more attempts contains an error, on the basis of the information bits contained in the control signal and the descrambled parity bits.

In the case where the shift-value control unit 242c designates a plurality of different candidates for the shift value, the cyclic shift unit 243c makes a plurality of attempts to restore the control signal to the bit sequence before the cyclic shift by the cyclic shift unit 164c, by using the plurality of candidates for the shift value, of which the cyclic shift unit 243c is informed by the shift-value control unit 242c. In each of the one or more attempts, a cyclic shift of the part of the control signal in the section of the control signal by a different one of the plurality of candidates for the shift value is performed. Then, the error checking unit 244c performs the error checking of the control signal as the result of each of the plurality of attempts. When the result of one of the plurality of attempts passes the error check, the error checking unit 244c determines the shift value corresponding to the one of the candidates for the shift value, and determines the component carrier corresponding to the determined shift value.

The cyclic shift unit 243c may make the plurality of attempts by use of the plurality of different candidates for the shift value in parallel, and the error checking unit 244c may perform the error checking of the results of the plurality of attempts in parallel. Alternatively, the cyclic shift unit 243c may make one or more of the plurality of attempts by using one or more of the plurality of different candidates for the shift value in succession, and the error checking may be performed after each attempt, until one of the plurality of attempts passes the error check.

Figure 32:
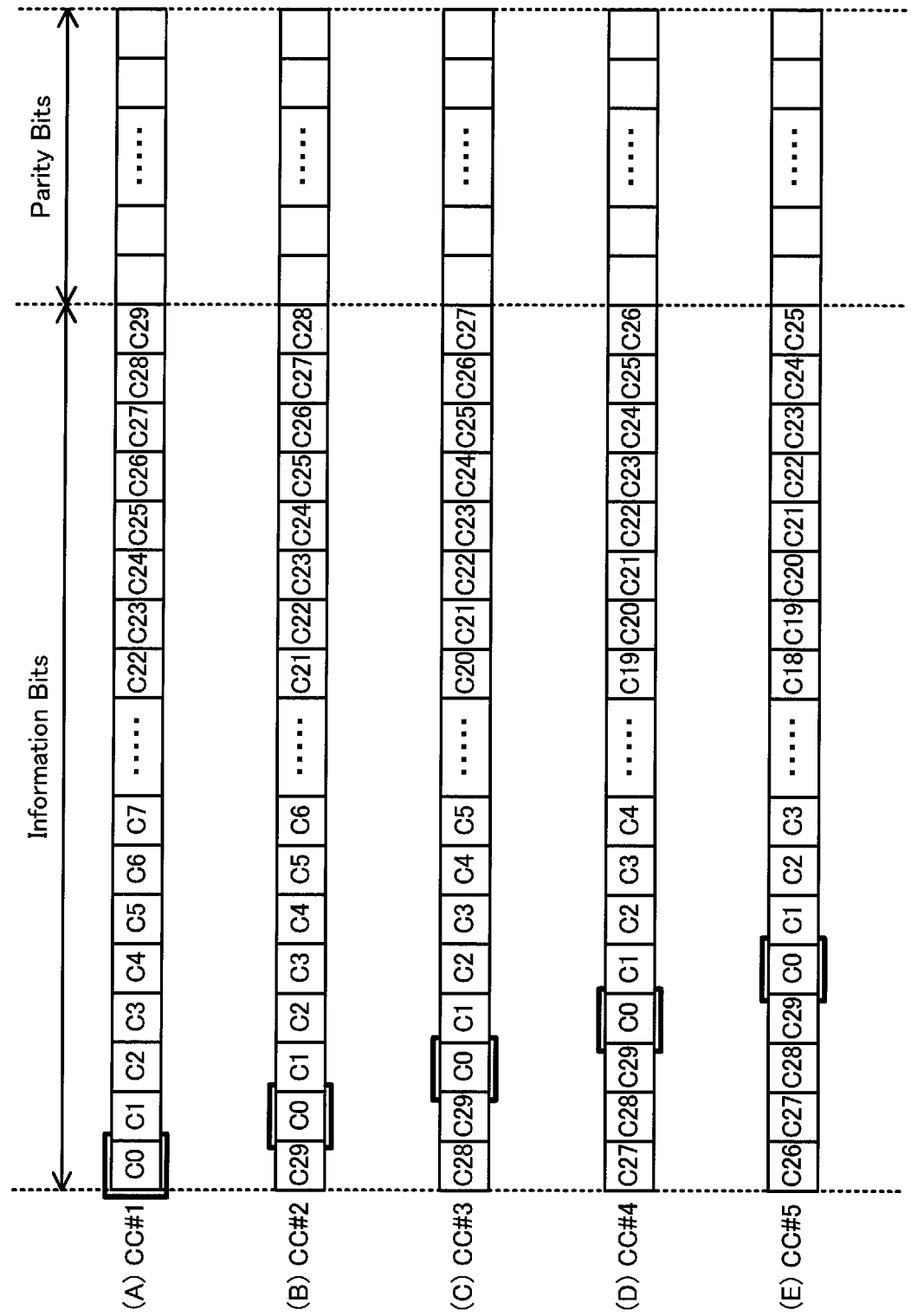
FIG. 32 illustrates a first example of a set of cyclically shifted control signals in the seventh embodiment.

FIG. 32 illustrates a first example of a set of cyclically shifted control signals in the seventh embodiment. In the example of FIG. 32, it is assumed that all the 30 information bits are scrambled, and the shift value corresponding to the component carrier to which the control signal is to be applied is a number identifying the component carrier to which the control signal is to be applied minus one as mentioned before as the example (a) of the shift value. The parity bits are generated from the information bits before the cyclic shift.

Specifically, the information bits are not cyclically shifted in the case where the control signal is to be applied to the component carrier CC#1, are cyclically shifted rearward (rightward in FIG. 32) by one bit in the case where the control signal is to be applied to the component carrier CC#2, are cyclically shifted rearward by two bits in the case where the control signal is to be applied to the component carrier CC#3, are cyclically shifted rearward by three bits in the case where the control signal is to be applied to the component carrier CC#4, and are cyclically shifted rearward by four bits in the case where the control signal is to be applied to the component carrier CC#5.

Figure 33:
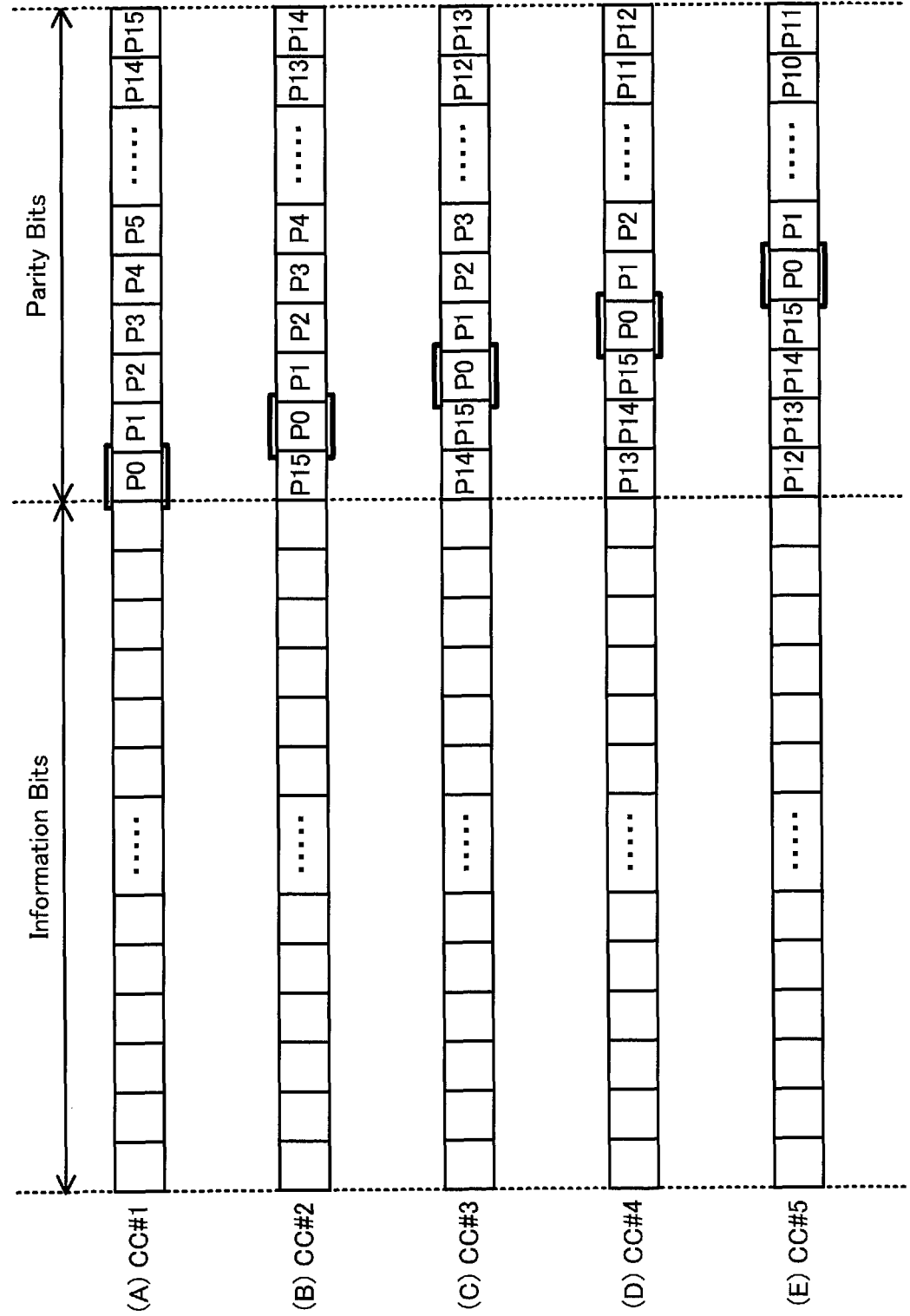
FIG. 33 illustrates a second example of a set of cyclically shifted control signals in the seventh embodiment.

FIG. 33 illustrates a second example of a set of cyclically shifted control signals in the seventh embodiment. In the example of FIG. 33, it is assumed that all the 16 parity bits are scrambled, and the shift value corresponding to the component carrier to which the control signal is to be applied is a number identifying the component carrier to which the control signal is to be applied minus one as mentioned before as the example (a) of the shift value. The parity bits before the cyclic shift are parity bits generated from the information bits.

Specifically, the parity bits are not cyclically shifted in the case where the control signal is to be applied to the component carrier CC#1, are cyclically shifted rearward (rightward in FIG. 33) by one bit in the case where the control signal is to be applied to the component carrier CC#2, are cyclically shifted rearward by two bits in the case where the control signal is to be applied to the component carrier CC#3, are cyclically shifted rearward by three bits in the case where the control signal is to be applied to the component carrier CC#4, and are cyclically shifted rearward by four bits in the case where the control signal is to be applied to the component carrier CC#5.

The section in which the bits are cyclically shifted need not be all the information bits or all the parity bits, and may be a section of part of the information bits or the parity bits, or a section extending across the border of the information bits and the parity bits.

The mobile communication system according to the seventh embodiment as explained above has advantages similar to the second embodiment. In addition, the seventh embodiment enables discrimination of the component carrier without the scrambling. In addition, the seventh embodiment reduces the processing loads imposed on the wireless base station 100 and the mobile stations 200 and 200a and the circuit size of the wireless base station 100 and the mobile stations 200 and 200a. Further, the method according to the seventh embodiment can be used for discrimination of the position of the leading symbol of the PDSCH as in the third embodiment.

8. Eighth Embodiment

The eighth embodiment is explained in detail below. The following explanations on the eighth embodiment are focused on the differences from the second embodiment, and explanations on arrangements and operations similar to the second embodiment are not indicated below. In the second to seventh embodiments, the parity bits are attached to the end of the sequence of the information bits. On the other hand, the eighth embodiment is characterized in that the position in which the parity bits are inserted is variable and the component carrier is discriminated on the basis of the insertion position of the parity bits.

The wireless base station according to the eighth embodiment can be realized by a construction similar to the wireless base station 100 according to the second embodiment illustrated in FIG. 6 except that the PDCCH generation unit 160 in the second embodiment is replaced with a PDCCH generation unit 160d, which is explained below. In addition, the mobile station in the eighth embodiment can be realized by a construction similar to the mobile station 200 according to the second embodiment illustrated in FIG. 8 except that the control-signal decoding unit 240 in the second embodiment is replaced with a control-signal decoding unit 240d, which is explained below.

Figure 34:
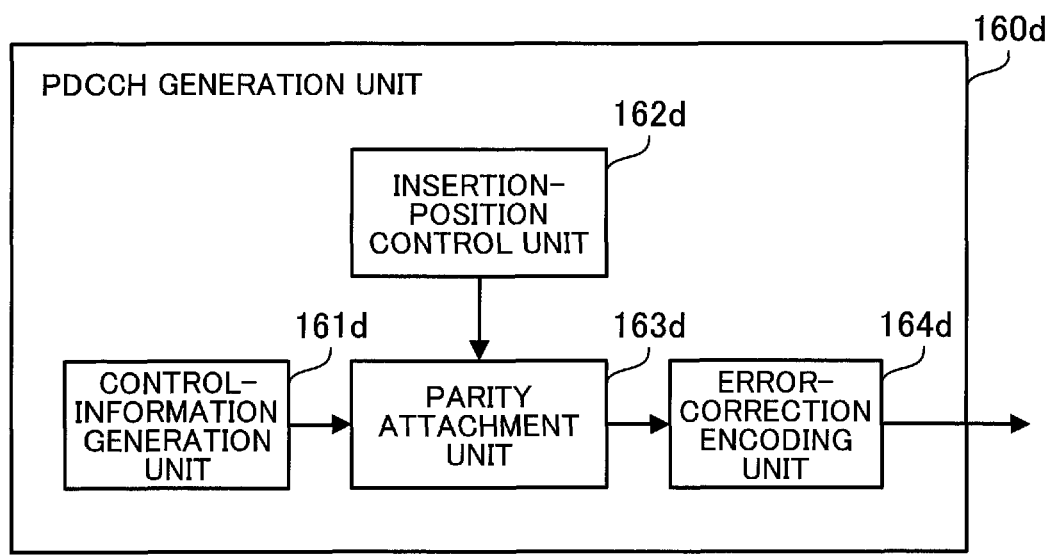
FIG. 34 illustrates details of a PDCCH generation unit in an eighth embodiment.

FIG. 34 illustrates details of the PDCCH generation unit in the eighth embodiment. The PDCCH generation unit 160d includes a control-information generation unit 161d, an insertion-position control unit 162d, a parity attachment unit 163d, and an error-correction encoding unit 164d.

The control-information generation unit 161d generates control information for the PDSCH and the PUSCH, and outputs a bit sequence indicating the above control information to the parity attachment unit 163d.

The insertion-position control unit 162d controls the insertion position of the parity bits with respect to the information bits. Correspondences between five component carriers CC#1 to CC#5 and five different insertion positions of the parity bits are recorded in advance in the insertion-position control unit 162d. The insertion-position control unit 162d informs the parity attachment unit 163d of the insertion position corresponding to the component carrier to which the control signal is to be applied.

For example, the insertion position may be set in correspondence with the component carrier to which the control signal is to be applied as follows.

(a) The position shifted forward from the end of the information bits by the number of bits corresponding to a number identifying the component carrier to which the control signal is to be applied (b) The position shifted rearward from the leading information bit by the number of bits corresponding to a number identifying the component carrier to which the control signal is to be applied The parity attachment unit 163d generates the parity bits for error checking, on the basis of the sequence of the information bits acquired from the control-information generation unit 161d. Then, the parity attachment unit 163d generates a control signal by inserting the parity bits into the insertion position of which the parity attachment unit 163d is informed by the insertion-position control unit 162d, and outputs the control signal to the error-correction encoding unit 164d. At this time, the parity attachment unit 163d scrambles the parity bits by using a scrambling sequence corresponding to an RNTI of the mobile station as the destination of the control signal. The scrambling of the parity bits may be performed either before or after the insertion of the parity bits.

The error-correction encoding unit 164d performs error-correction encoding of the control signal acquired from the parity attachment unit 163d so as to generate a PDCCH signal, and outputs the generated PDCCH signal to the wireless transmitter unit 170.

Figure 35:
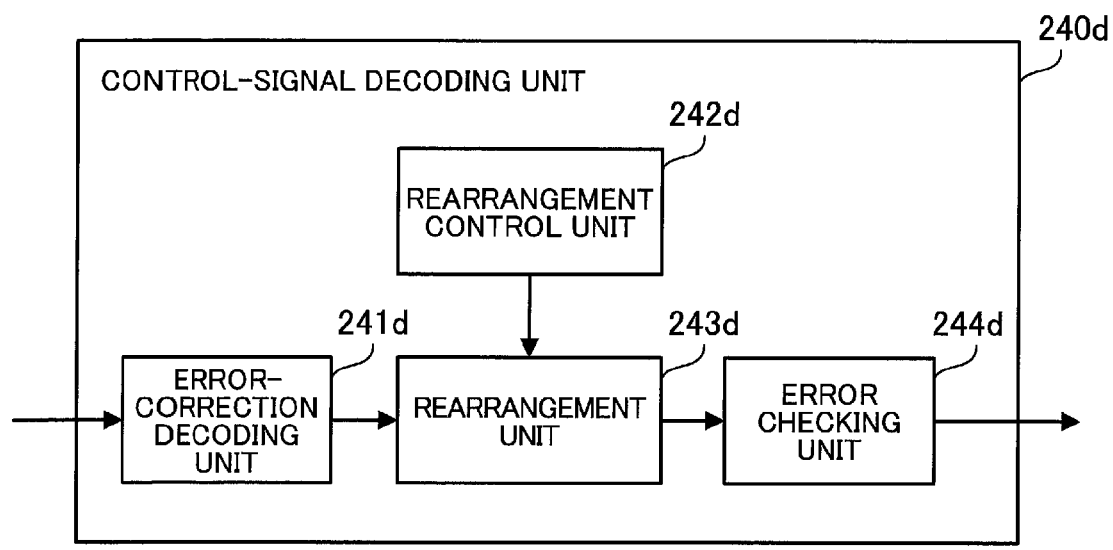
FIG. 35 illustrates details of a control-signal decoding unit in the eighth embodiment.

FIG. 35 illustrates details of the control-signal decoding unit in the eighth embodiment. The control-signal decoding unit 240d includes an error-correction decoding unit 241d, a rearrangement control unit 242d, a rearrangement unit 243d, and an error checking unit 244d.

The error-correction decoding unit 241d performs error-correction decoding of each PDCCH-signal candidate acquired from the control-signal extraction unit 230. Then, the error-correction decoding unit 241d outputs the decoded control signal to the rearrangement unit 243d.

The rearrangement control unit 242d controls the manner of rearrangement of the bit order in the control signal. Correspondences between the five component carriers CC#1 to CC#5 and five different sections in which the parity bits are to be inserted are recorded in advance in the rearrangement control unit 242d. The correspondences recorded in the rearrangement control unit 242d matches the manners of insertion which are managed by the insertion-position control unit 162d in the wireless base station 100. The rearrangement control unit 242d informs the rearrangement unit 243d of one or more candidates for the section in which the parity bits may be possibly set.

The rearrangement unit 243d rearranges makes one or more attempts to move the parity bit to the end of the control signal, on the basis of the one or more candidates for the section (in which the parity bits may be possibly set), of which the rearrangement unit 243d is informed by the rearrangement control unit 242d. In each of the one or more attempts, the rearrangement unit 243d cuts out part of the control signal in a different one of the one or more candidates for the section, and moves the part of the control signal to the end of the control signal. Then, the rearrangement unit 243d outputs the rearranged control signal to the error checking unit 244d.

The error checking unit 244d performs error checking of the rearranged control signal acquired from the rearrangement unit 243d as the result of each of the one or more attempts. In order to perform the error checking, the error checking unit 244d descrambles a first predetermined number of bits at the end of the rearranged control signal (i.e., the part of the control signal which is moved to the end of the control signal by the rearrangement unit 243d and may be possibly the parity bits), by using the scrambling sequence corresponding to the RNTI of the mobile station 200. Then, the error checking unit 244d performs error checking of the control signal on the basis of a second predetermined number of leading bits in the rearranged control signal (which may be possibly the information bits) and the first predetermined number of bits descrambled above.

In the case where the rearrangement control unit 242d designates a plurality of different candidates for the section (in which the parity bits may be possibly set), the rearrangement unit 243d makes a plurality of attempts to move the parity bit to the end of the control signal on the basis of the plurality of candidates for the section. The error checking unit 244d performs the error checking of the rearranged control signal as the result of each of the plurality of attempts. When one of the rearranged control signals as the result of one of the plurality of attempts passes the error check, the error checking unit 244d determines the section used in the attempt, and determines the component carrier corresponding to the determined section.

The rearrangement unit 243d may make the plurality of attempts by use of the plurality of different candidates for the shift value in parallel, and the error checking unit 244d may perform the error checking of the results of the plurality of attempts in parallel. Alternatively, the rearrangement unit 243d may make one or more of the plurality of attempts by using one or more of the plurality of different candidates for the shift value in succession, and the error checking may be performed after each attempt, until one of the plurality of attempts passes the error check.

FIG. 36 illustrates an example of a set of insertion positions of parity bits in control signals in the eighth embodiment. In the example of FIG. 36, 16 parity bits are inserted into a control signal containing 30 information bits. The insertion position corresponding to the component carrier to which the control signal is to be applied is the position shifted forward from the end of the information bits by the number of bits corresponding to a number identifying the component carrier to which the control signal is to be applied, as mentioned before as the example (a) of the insertion position.

Specifically, the parity bits are inserted after the end of the information bits in the case where the control signal is to be applied to the component carrier CC#1, the parity bits are inserted between the third and fourth bits from the end of the information bits in the case where the control signal is to be applied to the component carrier CC#2, the parity bits are inserted between the sixth and seventh bits from the end of the information bits in the case where the control signal is to be applied to the component carrier CC#3, the parity bits are inserted between the ninth and tenth bits from the end of the information bits in the case where the control signal is to be applied to the component carrier CC#4, and the parity bits are inserted between the twelfth and thirteenth bits from the end of the information bits in the case where the control signal is to be applied to the component carrier CC#5.

Although the insertion position of the parity bits in the control signal corresponding to the component carrier having each identification number is shifted by three bits from the insertion position of the parity bits in the control signal corresponding to the component carrier having the preceding identification number in the above example, the insertion position corresponding to the component carrier having each identification number need not be shifted by an equal number of bits from the insertion position corresponding to the component carrier having the preceding identification number. Further, although the 16 parity bits are inserted in the control signal without dividing the 16 parity bits in the above example, alternatively, it is possible to divide the 16 parity bits into multiple blocks, and insert the multiple blocks into different positions.

Furthermore, the method according to the eighth embodiment can be combined with the method according to the seventh embodiment (i.e., the method of discriminating the component carriers on the basis of the shift value in the cyclic shift). In this case, the wireless base station 100 can transmit a greater amount of information to the mobile stations 200 and 200a. For example, the method according to the eighth embodiment facilitates discrimination of the position of the leading symbol of the PDSCH as in the fourth embodiment.

FIG. 37 illustrates a set of insertion positions of cyclically shifted parity bits in control signals in a variation of the eighth embodiment. In the example of FIG. 37, five component carriers CC#1 to CC#5 are discriminated on the basis of five different sections for insertion of the parity bits, and three positions #1 to #3 of the leading symbol of the PDSCH are discriminated on the basis of three different shift values in the cyclic shift of the parity bits. Thus, the fifteen combinations of the sections for insertion of the parity bits and the shift values in the cyclic shift of the parity bits are prepared for discriminating the component carriers and the positions of the leading symbol of the PDSCH.

Specifically, in order to indicate the combination of the component carrier CC#1 and the position #1 of the leading symbol, the parity bits are attached to the end of the information bits and the parity bits are not cyclically shifted. In order to indicate the combination of the component carrier CC#1 and the position #2 of the leading symbol, the parity bits are attached to the end of the information bits and the parity bits are cyclically shifted rearward (rightward in FIG. 37) by one bit . . . . In order to indicate the combination of the component carrier CC#5 and the position #2 of the leading symbol, the parity bits are inserted between the twelfth and thirteenth bits from the end of the information bits and the parity bits are cyclically shifted rearward (rightward in FIG. 37) by one bit. In order to indicate the combination of the component carrier CC#5 and the position #3 of the leading symbol, the parity bits are inserted between the twelfth and thirteenth bits from the end of the information bits and the parity bits are cyclically shifted rearward (rightward in FIG. 37) by two bits.

The mobile communication system according to the eighth embodiment as explained above has advantages similar to the second embodiment. In addition, as the seventh embodiment, the eighth embodiment enables discrimination of the component carrier without the scrambling. Further, the eighth embodiment reduces the processing loads imposed on the wireless base station 100 and the mobile stations 200 and 200a and the circuit size of the wireless base station 100 and the mobile stations 200 and 200a. Furthermore, the method according to the eighth embodiment can be used for discrimination of the position of the leading symbol of the PDSCH as in the third embodiment.

According to the wireless communication apparatuses and the wireless communication methods disclosed in this specification, an opposite wireless communication apparatus can be efficiently informed of a wireless resource which is to be used in processing performed by the opposite wireless communication apparatus and is selected from a plurality of wireless resources.

9. Additional Matters

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions and alterations could be made hereto without departing from the spirit and scope of the invention.

What is claimed is:

1. A wireless communication apparatus configured to transmit through a first wireless resource a signal for use in processing to be performed by another wireless communication apparatus by use of one of a plurality of second wireless resources, the wireless communication apparatus comprising:
a signal generation unit configured to generate a first signal for use in the processing to be performed by said another wireless communication apparatus, a second signal for use in error checking of the first signal, and a third signal formed from a bit sequence containing the first signal and the second signal by scrambling a section in the bit sequence; and
a transmission unit configured to transmit the third signal through the first wireless resource;
wherein the signal generation unit is configured to select one of a plurality of different sections in the bit sequence corresponding to the one of the plurality of second wireless resources used in the processing to be performed by said another wireless communication apparatus, and is further configured to scramble the selected one of the plurality of different sections in the bit sequence for generating the third signal, where the plurality of different sections in the bit sequence respectively correspond to the plurality of second wireless resources.

2. The wireless communication apparatus according to claim 1, wherein the plurality of second wireless resources respectively belong to different frequency bands.

3. The wireless communication apparatus according to claim 1, wherein the plurality of second wireless resources include a wireless resource at a leading position of a channel used in the processing to be performed by said another wireless communication apparatus and using the first signal.

4. The wireless communication apparatus according to claim 1, wherein the signal generation unit is further configured to perform error-correction encoding of the third signal after the scrambling of the section, and the transmission unit is further configured to transmit the third signal after the error-correction encoding.

5. The wireless communication apparatus according to claim 1, wherein the signal generation unit is further configured such that part of the bit sequence scrambled by the signal generation unit excludes the second signal.

6. The wireless communication apparatus according to claim 1, wherein the signal generation unit is further configured such that the second signal is scrambled by the signal generation unit by use of a scrambling sequence determined in correspondence with said another wireless communication apparatus, which is a destination of the third signal.

7. The wireless communication apparatus according to claim 1, wherein the plurality of second wireless resources are configured for use in data transmission, and wherein the transmission unit is further configured to transmit data to said another wireless communication apparatus through one of the plurality of second wireless resources corresponding to the section scrambled by the signal generation unit.

8. The wireless communication apparatus according to claim 1, wherein the plurality of second wireless resources are configured for use in data reception, and wherein the wireless communication apparatus further comprises a reception unit configured to receive data from said another wireless communication apparatus through one of the plurality of second wireless resources corresponding to the section scrambled by the signal generation unit.

9. A wireless communication apparatus configured to transmit through a first wireless resource a signal for use in processing to be performed by another wireless communication apparatus by use of one of a plurality of second wireless resources, the wireless communication apparatus comprising:
 a signal generation unit configured to generate a first signal for use in the processing to be performed by said another wireless communication apparatus, a second signal for use in error checking of the first signal, and a third signal formed from a bit sequence containing the first signal and the second signal by scrambling at least part of the bit sequence corresponding to the first signal by using one of a plurality of different scrambling sequences which corresponds to the one of the plurality of second wireless resources to be used in the processing to be performed by said another wireless communication apparatus, where the plurality of different scrambling sequences respectively correspond to the plurality of second wireless resources; and
 a transmission unit configured to transmit the third signal to said another wireless communication apparatus through the first wireless resource.

10. The wireless communication apparatus according to claim 9, wherein the plurality of different scrambling sequences each comprise a predetermined scrambling sequence cyclically shifted by respectively different numbers of bits.

11. The wireless communication apparatus according to claim 9, wherein the signal generation unit is further configured to further scramble the second signal by use of another scrambling sequence determined in correspondence with said another wireless communication apparatus, which is a destination of the third signal.

12. A wireless communication apparatus configured to transmit through a first wireless resource a signal for use in processing to be performed by another wireless communication apparatus by use of one of a plurality of second wireless resources, the wireless communication apparatus comprising:
 a signal generation unit configured to generate a first signal for use in the processing to be performed by said another wireless communication apparatus, a second signal for use in error checking of the first signal, and a third signal formed from a bit sequence containing the first signal and the second signal by changing bit order in at least part of the bit sequence; and
 a transmission unit configured to transmit the third signal through the first wireless resource;
 wherein the signal generation unit is further configured such that the bit order in the at least part of the bit sequence is changed in one of a plurality of different manners of bit-order change which corresponds to the one of the plurality of second wireless resources used in the processing to be performed by said another wireless communication apparatus, where the plurality of different manners of bit-order change respectively correspond to the plurality of second wireless resources.

13. The wireless communication apparatus according to claim 12, wherein bits in the at least part of the bit sequence are cyclically shifted by respectively different numbers in the plurality of different manners of bit-order change, and the signal generation unit is further configured such that bit order in at least one of the first signal and the second signal is changed by a cyclic shift by a number of bits corresponding to the one of the plurality of second wireless resources used in the processing to be performed by said another wireless communication apparatus.

14. The wireless communication apparatus according to claim 12, wherein the second signal is in respectively different positions in the bit sequence in the plurality of different manners of bit-order change, and the second signal is in one of the respectively different positions which corresponds to the one of the plurality of second wireless resources used in the processing to be performed by said another wireless communication apparatus.

15. A wireless communication method executed between a first wireless communication apparatus and a second wireless communication apparatus by using a first wireless resource and a plurality of second wireless resources, the wireless communication method comprising:
 generating, by the first wireless communication apparatus, a first signal for use in processing to be performed by use of one of the plurality of second wireless resources and a second signal for use in error checking of the first signal;
 generating, by the first wireless communication apparatus, a third signal from a bit sequence containing the first signal and the second signal by scrambling one of a plurality of different sections in the bit sequence corresponding to the one of the plurality of second wireless resources, where the plurality of different sections in the bit sequence respectively correspond to the plurality of second wireless resources;
 transmitting the third signal from the first wireless communication apparatus to the second wireless communication apparatus through the first wireless resource;
 making, by the second wireless communication apparatus, one or more attempts to descramble the third signal in each of which a descrambling operation is performed on a different one of a plurality of different sections in the third signal respectively corresponding to the plurality of second wireless resources;
 performing, by the second wireless communication apparatus, error checking of the third signal after each of the one or more attempts is made;
 detecting, by the second wireless communication apparatus, the one of the plurality of second wireless resources to be used in the processing, as one of the plurality of second wireless resources corresponding to one of the plurality of different sections which gives a satisfactory result, with respect to a predetermined criterion, of the error checking of the third signal after one of the one or more attempts is made; and
 performing, by the second wireless communication apparatus, the processing by using the first signal and the detected one of the plurality of second wireless resources.

16. A wireless communication method executed between a first wireless communication apparatus and a second wireless communication apparatus by using a first wireless resource and a plurality of second wireless resources, the wireless communication method comprising:
 generating, by the first wireless communication apparatus, a first signal for use in processing to be performed by use of one of the plurality of second wireless resources and a second signal for use in error checking of the first signal;
 generating, by the first wireless communication apparatus, a third signal from a bit sequence containing the first signal and the second signal by scrambling at least part of the bit sequence corresponding to the first signal by using one of a plurality of different scrambling sequences corresponding to the one of the plurality of second wireless resources which is to be used in the processing, where the plurality of different scrambling sequences respectively correspond to the plurality of second wireless resources;

transmitting the third signal from the first wireless communication apparatus to the second wireless communication apparatus through the first wireless resource;

making, by the second wireless communication apparatus, one or more attempts to descramble the third signal in each of which a descrambling operation is performed on the third signal by using a different one of the plurality of different scrambling sequences;

performing, by the second wireless communication apparatus, error checking of the third signal after each of the one or more attempts is made;

detecting, by the second wireless communication apparatus, the one of the plurality of second wireless resources to be used in the processing, as one of the plurality of second wireless resources corresponding to one of the plurality of different scrambling sequences which gives a satisfactory result, with respect to a predetermined criterion, of the error checking of the third signal after one of the one or more attempts is made; and performing, by the second wireless communication apparatus, the processing by using the first signal and the detected one of the plurality of second wireless resources.

17. A wireless communication method executed between a first wireless communication apparatus and a second wireless communication apparatus by using a first wireless resource and a plurality of second wireless resources, the wireless communication method comprising:

generating, by the first wireless communication apparatus, a first signal for use in processing to be performed by use of one of the plurality of second wireless resources and a second signal for use in error checking of the first signal;

generating, by the first wireless communication apparatus, a third signal from a bit sequence containing the first signal and the second signal by changing bit order in at least part of the bit sequence in one of a plurality of first manners of bit-order change corresponding to the one of the plurality of second wireless resources which is to be used in the processing, where the plurality of first manners of bit-order change respectively correspond to the plurality of second wireless resources;

transmitting the third signal from the first wireless communication apparatus to the second wireless communication apparatus through the first wireless resource;

making, by the second wireless communication apparatus, one or more attempts to change bit order in the third signal in each of which an operation for changing the bit order in the third signal is performed in a different one of a plurality of second manners of bit-order change respectively corresponding to the plurality of first manners of bit-order change;

performing, by the second wireless communication apparatus, error checking of the third signal after each of the one or more attempts is made;

detecting, by the second wireless communication apparatus, the one of the plurality of second wireless resources to be used in the processing, as one of the plurality of second wireless resources corresponding to one of the plurality of second manners of bit-order change which gives a satisfactory result, with respect to a predetermined criterion, of the error checking of the third signal after one of the one or more attempts is made; and performing, by the second wireless communication apparatus, the processing by using the first signal and the detected one of the plurality of second wireless resources.

* * * * *